United States Patent [19]

Guilfoyle et al.

[11] Patent Number: 5,297,068
[45] Date of Patent: Mar. 22, 1994

[54] GLOBAL INTERCONNECT ARCHITECTURE FOR OPTICAL COMPUTER

[75] Inventors: Peter S. Guilfoyle, Zephyr Cove, Nev.; Frederick F. Zeise, Milpitas, Calif.; Valentin N. Morozov, Boulder, Colo.

[73] Assignee: Opticomp Corporation, Lake Tahoe, Nev.

[21] Appl. No.: 842,896

[22] Filed: Feb. 27, 1992

Related U.S. Application Data

[63] Continuation-in-part of Ser. No. 639,284, Jan. 10, 1991, Pat. No. 5,164,913, which is a continuation of Ser. No. 266,907, Nov. 3, 1988, abandoned, which is a continuation-in-part of Ser. No. 31,431, Mar. 27, 1987, Pat. No. 4,864,524.

[51] Int. Cl.$^5$ .............................................. G06E 1/04
[52] U.S. Cl. ..................... 364/713; 359/107
[58] Field of Search ................ 364/713; 359/107, 108

[56] References Cited

U.S. PATENT DOCUMENTS

| | | | |
|---|---|---|---|
| 3,270,187 | 8/1966 | Fomenko | 235/152 |
| 3,680,080 | 7/1972 | Maure | 340/347 |
| 3,903,400 | 9/1975 | Nisenson | 235/152 |
| 3,996,455 | 12/1976 | Schaefer | 364/713 |
| 4,042,814 | 8/1977 | Taylor | 364/713 |
| 4,667,300 | 5/1987 | Guilfoyle | 364/713 |
| 4,729,111 | 3/1988 | Arrathoon et al. | 364/713 |
| 4,764,889 | 8/1988 | Hinton et al. | 364/807 |
| 4,764,890 | 8/1988 | Hinton | 364/807 |
| 4,764,891 | 8/1988 | Grinberg et al. | 364/807 |
| 4,824,192 | 4/1989 | Roberts | 350/3.73 |
| 4,864,524 | 9/1989 | Guilfoyle et al. | 364/713 |
| 4,926,367 | 5/1990 | Arrathoon | 364/713 |
| 4,963,869 | 10/1990 | Falk | 364/713 |
| 5,056,039 | 10/1991 | Caulfield | 364/513 |
| 5,095,380 | 3/1992 | Kawai | 359/107 |

OTHER PUBLICATIONS

T. Kurokawa, S. Matsuo & C. Amano, "Banishing the Electron," *IEEE LTS.* vol. 3, No. 1, Feb. 1992, 7 pages in length.

R. Arrathoon & M. H. Hassoun, "Design and Performance of a Dynamically-Programmable High-Precision Threshold Gate," *Digital Optical Computing,* SPIE vol. 752, 1987.

T. Wang, B. Zhang, J. Arshad & R. Arrathoon, "Complex Optoelectronic Combinatorial Logic Systems: A Fiber Based Distributed Array Image Processor," *Digital Optical Computing II,* SPIE vol. 1215, 1990, pp. 78–92.

Chapter 9, by R. Arrathoon, "Fiber-Optic Programmable Logic Arrays, " *Optical Computing (Digital and Symbolic),* Copyright 1989 by Marcel Dekker, Inc., pp. 247–277.

R. Arrathoon, "Historical Perspectives: Optical Crossbars and Optical Computing," *Digital Optical Computing,* SPIE vol. 752, 1987, pp. 2–11.

R. Arrathoon & S. Kozaitis, "Design and Performance of a 10 MIP Optoelectronic, Central Processing Unit," *Digital Optical Computing,* SPIE vol. 752, 1987, pp. 34–39.

(List continued on next page.)

*Primary Examiner*—David H. Malzahn
*Attorney, Agent, or Firm*—Limbach & Limbach

[57] ABSTRACT

An architecture for an optical computing apparatus which utilizes global free space smart optical interconnects and is based on a digital logic family derived from augmenting semiconductor technology with optical logic. The apparatus comprises input means, control means, and detector means, where the detector means includes means for detecting an optical input signal, electronically amplifying and selectively negating the detected signal, and providing an optical output signal. The architecture is capable of providing outputs which are Boolean logical AND/OR operations on designated combinations of binary input bits, and in another embodiment is capable of forming the combinatorial functionals and summations into which an arbitrary user instruction may be decomposed by means of Shannon's theorem and DeMorgan's laws.

41 Claims, 32 Drawing Sheets

OTHER PUBLICATIONS

R. Arrathoon, E. R. Schroeder & F. Westervelt, "Integrated optical Combinatorial Logic Using Electro-Optic Bragg Gratings," *Integrated Optical Circuit Engineering II*, SPIE vol. 578, 1985, pp. 207-212.

Article, M. H. Hassoun & R Arrathoon, "Pattern Recognition and Logic with Optical Gates," Department of Electrical and Computer Engineering, Wayne State University, pp. WB5-1-WB5-4.

R. Arrathoon, "Logic Based Spatial Light Modulators," *Optical Computing and Nonlinear Materials*, SPIE vol. 881, 1988, pp. 230-244.

J. Arshad & R. Arrathoon, "Optoelectronic Programmable Hardward: A Fiber Optic Based Johnson Counter," *Digital Optical Computing II*, SPIE vol. 1215, 1990, pp. 297-304.

T. Wang & R. Arrathoon, "On the Limits of Optical and Electrical Fan-Out vs Power and Fan-Out vs Bandwidth," *Hybrid Image and Signal Processing II*, SPIE vol. 1297, 1990, pp. 133-149.

PROCESSING: INVERSION, OR ON THE PHOTODIODE MATRIX

VERTICAL CAVITY

HORIZONTAL CAVITY

45° DEFLECTING MIRROR

HORIZONTAL CAVITY

GRATING COUPLING

TURN UP CAVITY

EXAMPLE OF THE FORMATION OF MQW LASER WITH MESFET STRUCTURES.

1. GROOVE ETCHING
GROWTH OF CONTACT LAYER

2. GROWTH OF MQW STRUCTURE

3. GROWTH OF FET N- LAYER

4. RIDGE FORMATION
CONTACT FORMATION

RESULTANT OUTPUT
FOR LOOK AHEAD CARRY
FOR 64 BIT ADDITION FROM
PARTIAL SUMS AND PARTIAL
CARRIES.

47,905 INTERCONNECTS
@ 10% EFFICIENCY

EXAMPLE OF OPTICAL DATA ROUTING

OPTICAL LAYOUT FOR 3X3 DIRECT MULTIPLICATION IMPLEMENTING GLOBAL FREE SPACE INTERCONNECTS

GLOBAL INTERCONNECT ARCHITECTURE FOR OPTICAL COMPUTER

This invention was made with Government support under Contract N00014-89-C-0225 awarded by the Department of the Navy. The Government has certain rights in the invention.

This is a continuation-in-part of copending U.S. patent application Ser. No. 639,284, filed Jan. 10, 1991, now U.S. Pat. No. 5,164,913, which was a continuation of U.S. patent application Ser. No. 266,907, filed Nov. 3, 1988, now abandoned, which was a continuation-in-part of U.S. patent application Ser. No. 031,431, filed Mar. 27, 1987, now U.S. Pat. No. 4,864,524, issued Sep. 5, 1989.

TECHNICAL FIELD

The present invention is generally directed to optical computing and more specifically to an architecture for an optical computer which incorporates four-dimensional global instead of two-dimensional parallel optical gate interconnects, and in one embodiment, is based on a digital logic family derived from augmenting GaAs semiconductor technology with optical logic.

BACKGROUND OF THE INVENTION

The present invention is an architecture for computers which utilizes selective global interconnects between its logic gates and is based on a new class of digital logic. The use of selective global interconnects permits the efficient routing of signals between the logic gates and enables the computer to perform multiple, complex calculations simultaneously. This allows the efficient calculation of an entire set of user instructions, and increases the range of problems and disciplines to which the architecture can be applied.

The new class of digital logic combines semiconductor based logic families (such as those based on GaAs) with digital optic logic in order to obtain the benefits of both types of logic, while overcoming limitations of purely semiconductor based logics. This assists in making the computing architecture commercially viable because it provides a computation capacity/cost ratio which is economically competitive with presently available architectures.

Computing architectures based solely on electronic or semiconductor technologies are well known and have been in use for some time. Optical computer architectures have also received a great deal of attention and are perceived as promising designs for computers. One of the inventors of the present application (Guilfoyle) has previously described in U.S. Pat. No. 4,864,524, entitled "Combinatorial Logic-Based Optical Computing Method and Apparatus", issued Sep. 5, 1989, a computing architecture which utilizes electronic and optical components. The architecture utilizes parallel gate interconnects between two sets of input data gates, and discusses the use of a more general, global interconnect structure.

The replacement of the second set of input data gates by a set of program control data gates was taught by Guilfoyle in copending U.S. patent application Ser. No. 639,284, entitled "General Purpose Optical Computer", filed Jan. 10, 1991. This results in a computer which can implement a greater variety of switching functions or user instructions, and hence is more powerful and versatile. It also provides the capability for a programmable architecture which can be used to implement multiple user instructions in successive passes through the device.

The gate interconnect structure of the computing architecture is a significant issue because it impacts the physical size, calculation capacity, and speed of a computer. Current architectures for optical computers primarily utilize parallel interconnects between their optical logic gates. This simplifies the design and implementation of the apparatus, but results in one of less efficiency, and one which may require pre-conditioning or duplicative processing of inputs in order to generate the full array of potential user instructions.

A selective global interconnect architecture for the optical gates of a computing apparatus in accordance with the present invention is capable of generating an arbitrary instruction set more efficiently because more, if not all, combinations of terms of which the instructions are composed can be produced simultaneously. This increases the computational speed of the computer, reduces the number of calculation specific gate structures required, and favorably impacts the commercial viability of a computer based on the architecture. This is because the computation rate/cost ratio strongly influences the desirability of a particular computer or architecture.

The combination of semiconductor based and digital optical logics provides a commercially viable design and overcomes some of the limitations inherent in semiconductor based architectures. In order to make these benefits clearer, some of the present limitations of GaAs semiconductor technology when used as the basis for a computing architecture will be discussed.

In "An Introduction for GaAs Microprocessor Architecture", in *Reduced Instruction Set Computers,* William Stallings, editor, IEEE Computer Society Press, 1990, Dr. Walter Helbig of RCA's Advanced Technology Laboratories addresses GaAs semiconductor technology. Dr. Helbig introduces an example implementing the ADD algorithm on the co-processor area of the chip. The article discusses some of the inherent problems in the use of GaAs technology as the basis for a computing architecture. It has been discovered that digital optical logic, when used to complement GaAs, eliminates many of these problems, and can be used to leverage the performance of the GaAs based logic family.

As Dr. Helbig notes, "In the GaAs environment, simple adder designs such as ripple-carry and carry-select are better. The carry-lookahead design is plagued with very large gate fan-ins and fan-outs. Low Fan-in and fan-out of GaAs gates, although not believed to be a permanent characteristic, nevertheless currently introduce constraints not found in silicon. Gate fan-out can generally be increased by using larger transistors, as is done in silicon. However, low gate fan-in is a serious problem, particularly for NAND gates. This is because an increase in the number of inputs to a NAND gates reduces the noise margin, and noise margins are very small in GaAs devices to begin with."

"Because of the limited fan-in of GaAs gates, the ripple-carry approach may be faster for a GaAs VLSI implementation. Even if not the fastest, the ripple-carry approach may still be preferred because of its low layout area requirements. As mentioned earlier, GaAs gates are now often characterized with low fan-in and fan-out capabilities. Therefore, additional gates must be used to implement a carry lookahead adder. Because carry-lookahead is an irregular adder design, it has a large area requirement."

The Fan-In and Fan-Out limitations of GaAs technology restricts the number of input and output channels per logic gate, and hence increases the number of gates required for implementing complex instructions. This impacts the physical size and power consumption requirements of the architecture.

The noise margin problem referred to by Dr. Helbig is a drawback to using GaAs technology because it impacts the signal-to-noise ratio (SNR) and the bit error rate achievable by the architecture (and hence the computational reliability and reproducibility, and the capability of the architecture to discriminate between logic states).

The gate interconnect structure of a GaAs based architecture determines to some extent the type and complexity of algorithms which can be used to implement instruction sets, and as noted can result in inefficiencies and increased layout area requirements. This is a drawback to using GaAs based architectures because it increases the computation time, complexity, and physical size of the architecture, impacting performance and development costs.

In contrast, a digital optical logic family can capitalize on the inherent benefits of optical computing which include high Fan-In and Fan-Out capability, low power consumption, high noise margin, high algorithmic efficiency using "smart" interconnects, and free space leverage of GIBP (gate interconnect bandwidth product).

Other secondary advantages of optical logic include (but are not limited to) zero capacitive loading of signals at a detector, zero cross-talk between signals, zero signal dispersion, and minimal clock skew (a few picoseconds or less in an imaging system). The use of optical logic in conjunction with semiconductor based logic can thus address some of the limitations of the latter while achieving the benefits of the former.

SUMMARY OF THE INVENTION

The above mentioned limitations of semiconductor based computing architectures and the lack of efficiency of optical computing architectures utilizing parallel gate interconnects are addressed by the present invention of an apparatus utilizing a global logic gate interconnect structure. The present invention is an apparatus for acting upon input data wherein the input data has a plurality of binary bits and the output of the apparatus can be Boolean logical OR or logical AND terms depending upon the calculation of AND/OR from the utilization or not of DeMorgan's theorem.

The apparatus includes input means comprising a plurality of elements, wherein each element is responsive to a corresponding one of the binary bits of the input data, wherein each element provides an optical signal representative of the corresponding binary bit, and wherein each element projects the optical signal along a first plurality of signal paths.

Control means are positioned in the first plurality of optical paths. The control means is preferably planar and include a plurality of elements, each of which is positioned in a corresponding one of the first plurality of optical paths, receives the optical signal projected there along, and broadcasts the received optical signal along a set of selected signal paths. The signal paths in the sets of selected signal paths collectively form sets of coincident signal paths. Each set of coincident signal paths is coincident at an associated detect location, and the signal paths contained in a particular set of coincident signal paths are selected so that the optical signals which the set routes to the associated detect location represent the bits in a particular one of the user designated combinations of binary bits.

Binary detector means are provided which are preferably planar and include a plurality of elements. Each of the elements is associated with a detect location and is responsive to the optical signals routed to that detect location. Each element includes means for detecting the presence or absence of optical signals routed to the associated detect location by detecting only the presence or absence of an optical signal, means for performing a logical negation, if desired, of the detected presence or absence of an optical signal result, and means for producing an output representative of the result of the logical negation or non-negation.

The performance of the above apparatus can be improved by implementing the detector means as a combination optical/semiconductor stage. More specifically, this can be realized by use of optical photodetectors coupled to a semiconductor based amplification and inversion stage, whose output is coupled to an optical emitting stage for the final output. When compared to current GaAs based logic families, it is anticipated that the previously discussed Fan-In and Fan-Out limitation can be improved by a factor of 100:1 or more.

As an additional indication of the benefits of combining the two logic families, the optical energy consumption per bit event (625 photons minimum) can be as low as 0.15 femtoJoules (fJ) for optical logic families, as compared to 300 fJ for GaAs (and much higher for pin drivers ($\sim 20$ pJ)). The requirement to use larger power transistors to increase Fan-In and Fan-Out in semiconductor based designs may be eliminated by using optical interconnect channels for Fan-Ins and Fan-Outs. Because large Fan-Ins also allow "smart" interconnects coupled with selective broadcasting of selected data to selected points, even further leverage can be realized.

The semiconductor noise margin limitation can be overcome because digital optical logic has its "zero state" at the KT noise limit. This means that the "off" state (indicative of the absence of light) can be detected with the same degree of certainty with a far lower energy requirement. In contrast, GaAs based logic and other semiconductor logics have a "fat zero" level. This "fat zero" means that energy is required to drive the "zero" state. Consequently, in GaAs the "fat zero" increases the energy required to achieve the same detection certainty or error rates when compared to the KT limited optical condition. Therefore, optical logic can exhibit wide noise margins at far lower energy levels. At 5000 photons per event, a bit error rate of greater than one part in $10^{20}$ can be achieved.

Integrating GaAs with optical logic supplies GaAs with far greater Fan-In capabilities, thus enabling a "smart" interconnect architecture to be realized. For example, using "smart" interconnect architecture, an efficient full look-ahead carry algorithm may be implemented in a single instruction clock. In this way GaAs VLSI based architectures would no longer be forced to use the inefficient ripple-carry algorithm to implement ADDition. Furthermore, available chip layout area is also increased as the ADD operation is now performed in free space. Algorithmic efficiency is thus optimized, improving the performance of devices based on the architecture.

Global free space "smart" optical interconnects reduce the chip area requirement for direct interconnects when compared to the requirements for GaAs based architectures. Computations may be organized and effectively performed in free space, thus reducing chip area, power consumption, and increasing algorithmic efficiency. GIBP (gate interconnect bandwidth products) may be increased, given the same chip area, by 1 to 3 orders of magnitude over that obtainable in GaAs based architectures.

The computer architecture described in the subject application uses optical and electronic means to form the functional and summation terms into which an arbitrary instruction set (or switching function) can be decomposed by application of Shannon's expansion theorem and DeMorgan's law. Global instead of parallel interconnects are used to propagate input data to selected elements of a detection, amplification, negation and emission stage. The output of the elements of that stage are logical AND operations of the input data incident upon the particular elements. Global instead of parallel interconnects are then used to propagate selected ones of the logical AND operation results from a control plane to binary detectors which perform optical OR operations. The result is an optical computer capable of implementing an arbitrary instruction set and one which realizes the combined benefits of optical and semiconductor technology.

The detection, amplification, negation, and emission means utilized in the preferred embodiment of the disclosed global interconnect computing architecture combines the attributes of both electronic and optical logic families. While there are presently reported devices which perform some of the operations used in the detection, amplification, and negation, and emission means, none of them performs the combination of all such operations. These devices, and their shortcomings are discussed further in connection with the preferred embodiment section of this application.

It is therefore an object of the present invention to provide an apparatus which utilizes four-dimensional global interconnect technology and is capable of producing at its output Boolean logical AND or OR terms.

It is a further object of the present invention to provide a computing architecture based on a new digital optical logic family which realizes the benefits of optical logic and overcomes some of the limitations of semiconductor based logic families.

It is a still further object of the present invention to provide a computing architecture which utilizes the global logic gate interconnect capabilities of optical logic to achieve enhanced performance over semiconductor based architectures.

These and other objectives, features and advantages of the present invention will be more readily understood upon consideration of the following detailed description of the invention and accompanying drawings.

DETAILED DESCRIPTION OF THE PREFERRED EMBODIMENT

The present invention is the result of the development and refinement of prior designs for the architecture of an optical computer. The use of selective global gate interconnects with an opto-electronic based logic family produces an apparatus which is capable of generating user specified instruction sets in an efficient and performance competitive manner. Before describing the preferred embodiment of the present invention, its theoretical basis and some of its constituent concepts will be discussed.

Opto-Electronic Boolean AND-OR Operations

In U.S. Pat. No. 4,864,524, the inventors describe an apparatus composed of optical and electronic means which is capable of performing logical AND-OR-INVERT operations on binary input data as a means of comparing two words in a text searching application.

Figure 1:
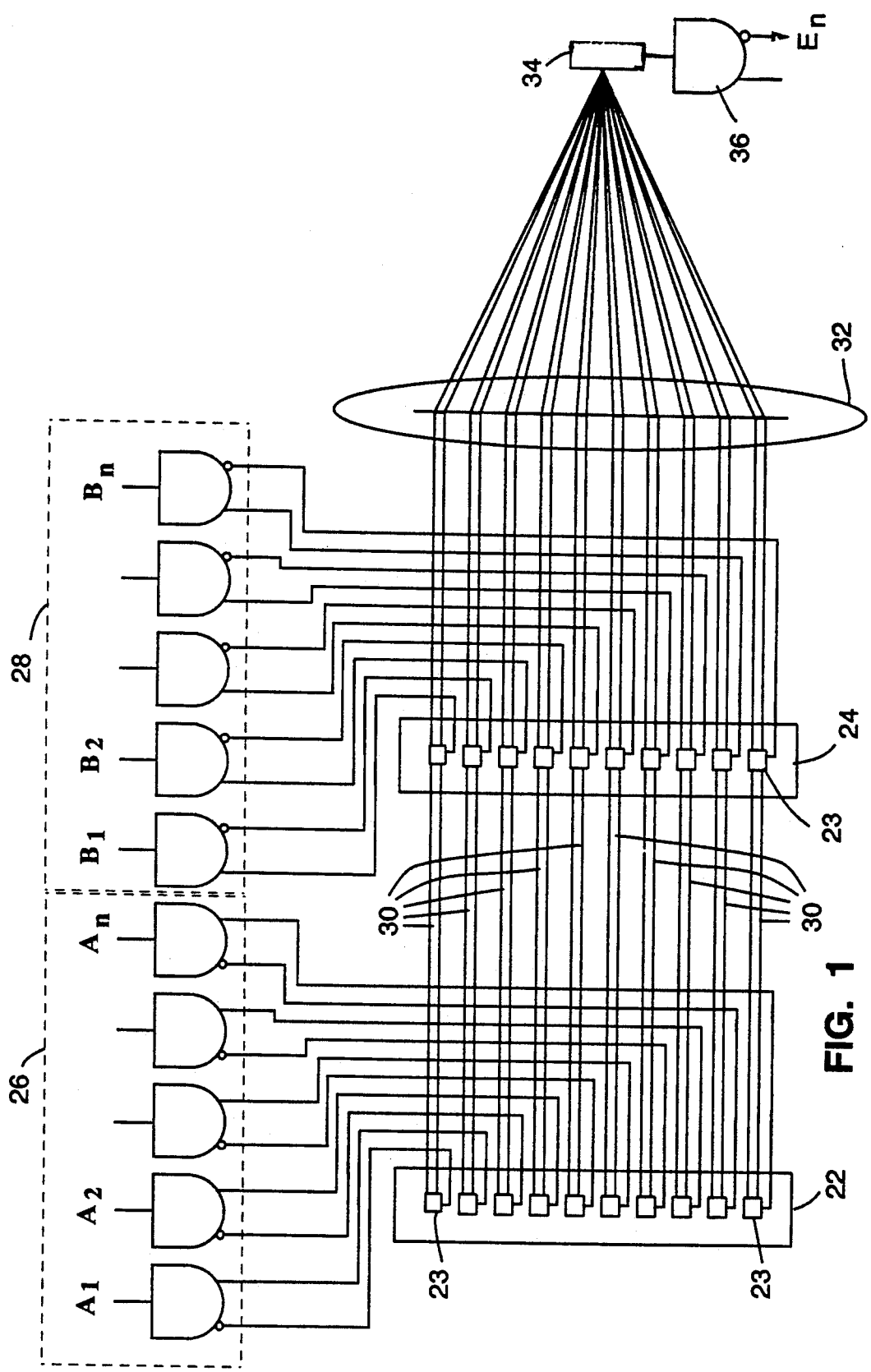
FIG. 1 is a simplified diagram of an optical architecture which utilizes two sets of data input gates.

FIG. 1 shows this word comparison apparatus which is composed of first and second acousto-optic cells 22 and 24, respectively, each of which receive binary bits from conditioning circuits 26 for word A (represented by $A_1, A_2, \ldots, A_n$), and from conditioning circuits 28 for word B (represented by $B_1, B_2, \ldots, B_n$). Light propagates along parallel optical paths 30 and is modulated by the bits propagating through the first and second acousto-optic cells 22 and 24. Lens 32 focuses the modulated light onto the detector 34 and amplifier/inverter 36 inverts the output state of detector 34.

The acousto-optic cells 22 and 24 each have a plurality of electrodes 23. Each electrode 23 receives a bit of data which modulates the transmissiveness of a portion of the acousto-optic cell beneath the electrode as a function of the logic state of the bit. The acousto-optic cells 22 and 24 are positioned with respect to one another so that each electrode 23 in cell 22 controls a portion of the cell which modulates light propagating along an optical path that passes through the portion of acousto-optic cell 24 that is controlled by a counterpart electrode 23.

After modulation by the second acousto-optic cell 24, the light propagates by parallel paths to the lens 32. The lens 32 focuses all of its inputs onto detector 34 which functions as an OR gate. By application of DeMorgan's law, the output of the inverter 36 is the logical AND of the bits of word A and word B, and their complements (which are generated by preprocessing logic in the conditioning circuits 26 and 28).

Several aspects of the apparatus of FIG. 1 are noteworthy when compared to the present invention. Firstly, the inputs to the acousto-optic cells 22 and 24 are both input data representing the words to be compared. This differs from the present invention and the computing apparatus of U.S. patent application Ser. No. 639,284, where the second set of input data is replaced by a set of control bits, and all input data is applied to acousto-optic cell 110. See FIG. 2.

Secondly, the optical gate interconnects 30 of the apparatus of FIG. 1 are parallel rather than selectively global, and only a single detector is used. Finally, the detection and amplification/inversion operations are performed by two separate devices, the detector 34 and the inverter 36. This is in contrast to the present invention which utilizes a single integrated device (termed a DANE device) to perform the operations of detection, amplification, negation, and emission. It is the use of selective global interconnects and the DANE device which provides the present invention with its broad capabilities and commercial viability.

Combinatorial Functionals/Summations

In order to fully motivate the approach on which the present invention is based, a brief presentation of the theoretical basis for generating an arbitrary digital function or instruction will be presented. This discussion closely follows that described in detail in U.S. Pat. No. 4,864,524, entitled "Combinatorial Logic-Based Optical Computing Method And Apparatus", issued Sep. 5, 1989, in which one of the inventors of the present invention is a named inventor, and U.S. patent application Ser. No. 639,284, filed Jan. 10, 1991, both of which are assigned to the assignee of the subject application and both of which are hereby incorporated in their entirety by reference.

Shannon's expansion theorem (described in Z. Kohavi, *Switching and Finite Automata Theory*, Second Edition, McGraw Hill, ISBN 0-07-035310-7, New York, 1978, pg. 53. and C. E. Shannon, "A Symbolic Analysis of Relay and Switching Circuits", AIEE Transactions, Vol. 57 1938 pp 714–723) states that any switching function, $y(x_1, x_2, \ldots, x_n)$, i.e., any digital computation or logic function can be expressed as:

$$y(x_1, x_2, \ldots, x_n) = x_1 f(1, x_2, \ldots, x_n) + \bar{x}_1 f(0, x_2, \ldots, x_n) \quad (1)$$

where $x_1, x_2, \ldots, x_n$ represents a current binary input data vector. The above formulation is again expanded by applying Shannon's expansion theorem to obtain:

$$y(x_1, x_2, \ldots, x_n) = x_1 x_2 f(1, 1, x_3, \ldots, x_n) + \quad (2)$$

$$\bar{x}_1 x_2 f(0, 1, x_3, \ldots, x_n) + x_1 \bar{x}_2 f(1, 0, x_3, \ldots, x_n) +$$

$$\bar{x}_1 \bar{x}_2 f(0, 0, x_3, \ldots, x_n)$$

Consequently an arbitrary n-bit switching function can be written as a set of two equations. The first equation set (equation set 3) takes the input data vector represented by bits $x_1$ through $x_n$ and combines the bits in such a way to produce K output combinatorial functions $f_1$ through $f_k$. Note that $f_1$ through $f_k$ represent the logical/Boolean "multiplication" or "AND"ing of any combination of $x_1$ through $x_n$. These inputs, $x_1$ through $x_n$, are represented in "dual rail" format, where, both $x_1$ and its complement (shown with a bar over the input) are available. In the first step, the combinatorial "AND"ing of the arbitrary input dual rail binary data vector is represented by the following equations.

$$f_1 = x_1 x_2 x_3 \ldots x_n f(1, 1, 1, \ldots, 1)$$
$$f_2 = \overline{x_1} x_2 x_3 \ldots x_n f(0, 1, 1, \ldots, 1)$$
$$f_3 = x_1 \overline{x_2} x_3 \ldots x_n f(1, 0, 1, \ldots, 1) \quad (3)$$
$$f_4 = \overline{x_1} \overline{x_2} x_3 \ldots x_n f(0, 0, 1, \ldots, 1)$$
$$\vdots$$
$$f_k = \overline{x_1} \overline{x_2} \overline{x_3} \ldots \overline{x_n} f(0, 0, 0, \ldots, 0)$$

These functions are called "standard product terms" or "minterms".

The second step in Shannon's generalized formulation is to utilize these arbitrary combinatorial functionals to produce arbitrary combinatorial summations as shown in equation 4 below. Inputs to this second step are the outputs from the first step (equation 3), i.e., the combinatorial "AND" products $f_1$ through $f_k$. These are then "OR"ed and Boolean summed as shown:

$$y(x_1, x_2, x_3, \ldots, x_n) = f_1 + f_2 + f_3 + \ldots + f_k \quad (4)$$

where $k = 2^N$ functionals. This equation is commonly referred to as the disjunctive normal canonical form or standard sum of products (S-of-P) form. In order to calculate the terms of Shannon's equations, control logic is used to select the data to be combined to form the combinatorial functionals, and to select the combinatorial functionals to be combined into the combinatorial summations.

Control Logic Architecture

Figure 2:
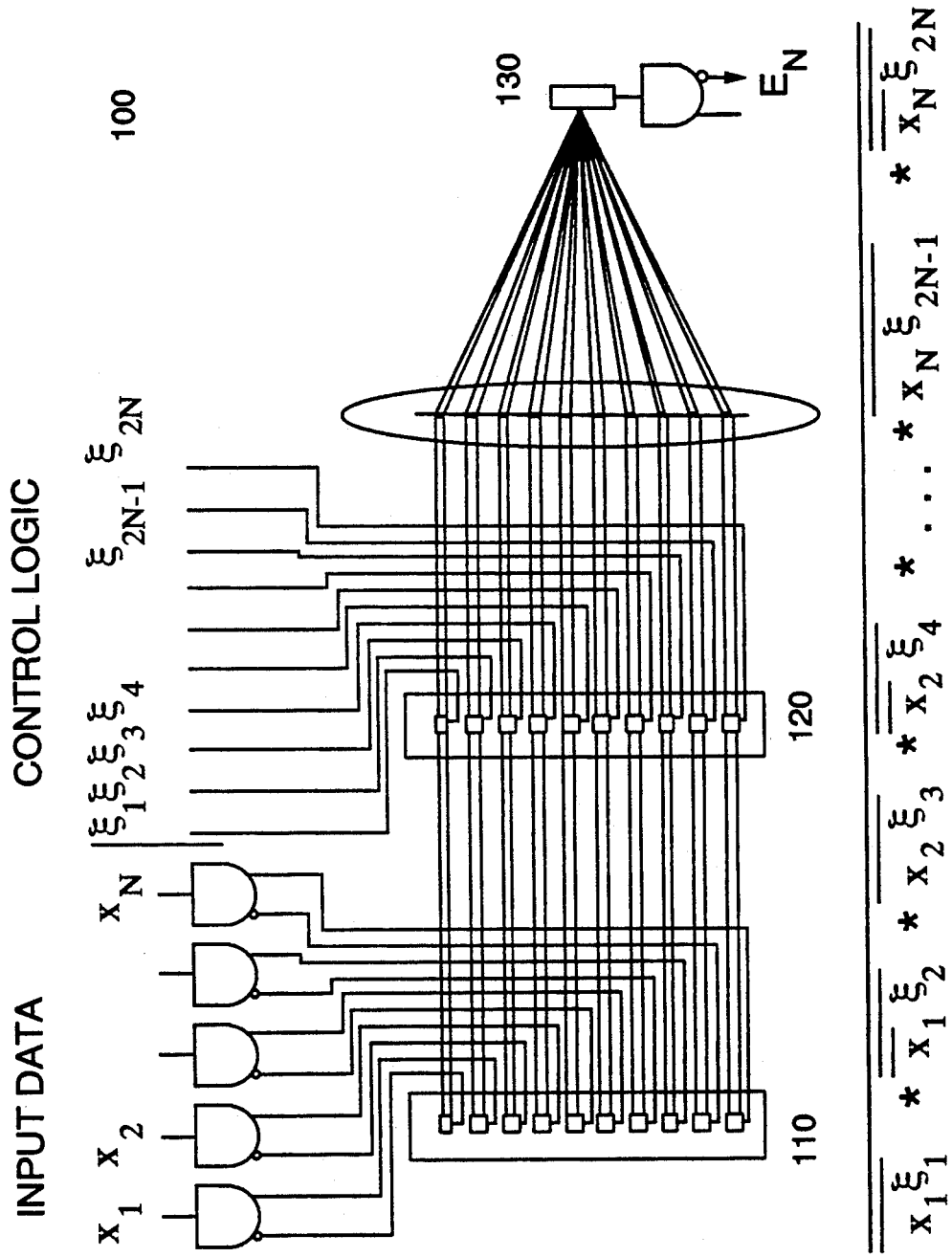
FIG. 2 is a diagram of a simple optical computer which can be used to generate Shannon's equations.

FIG. 2 is a diagram disclosed in the above referenced patent application Ser. No. 639,284, of a simple optical computer architecture 100 which can be used to generate both sets of Shannon's equations. To facilitate the selection of the appropriate terms used to form the equations, control selection logic is used in a dual rail input, instead of using two sets of data inputs ($A_n$ and $B_n$) as in FIG. 1. In this way an arbitrary switching function may be produced at the final output, thus providing a more general architecture than that of FIG. 1.

In FIG. 2, input data is fed from the data bus in dual rail format (the data bits and their complements) to a set of electro-optic transducers 110. Given N input data bits, only 2N transducers are required. At the same time control logic is sent to a second set of transducers 120. The optical system images the first set of transducers 110 onto the second set 120. The resultant products, N two-input "AND" gates, are then "OR"ed on a detector 130. The effect of the control inputs in the N two-input "AND" gates is to select for further transmission the data bit that is incident on electro-optic transducer 120 from the electro-optic transducer 110. Thus, the control bits are able to select either, or neither, of each data bit or its complement for further transmission to detector 130.

The benefit of the design of FIG. 2 is that the detector 130 need only detect the presence or absence of light. Fan-In on the detector can be quite high as the off state is the required information state compared with multi-level threshold and bistable (quantum well type) logic schemes.

The output at the detector 130 is represented in the following equation:

$$E_N = x_1 \xi_1 + \overline{x_1} \xi_2 + x_2 \xi_3 + \overline{x_2} \xi_4 + \ldots + x_N \xi_{2N-1} + \overline{x_N} \xi_{2N} \quad (5)$$

This represents 2N "AND" gates "OR"ed together. It is important at this stage to recognize the impact of DeMorgan's law. The particular law that should be applied here is the "AND" law. This Boolean logic law can be stated:

$$x_1 x_2 x_3 \ldots x_N = \overline{\overline{x_1} + \overline{x_2} + \overline{x_3} + \ldots + \overline{x_N}} \quad (6)$$

The inverted boolean sum of inverted input bits is equivalent to their Boolean product. This allows one to rewrite the output $E_N$ from above as an N-bit Boolean "AND" product:

$$E_N = \overline{\overline{x_1 \xi_1} \cdot \overline{\overline{x_1} \xi_3} \cdot \overline{x_2 \xi_3} \cdot \overline{\overline{x_2} \xi_4} \cdot \ldots \cdot \overline{x_N \xi_{2N-1}} \cdot \overline{\overline{x_N} \xi_{2N}}} \quad (7)$$

Consequently, by applying the appropriate control operator bits it is possible to arbitrarily program free space parallel optical interconnects to produce all $2^N$ minterms of an arbitrary n-bit length input vector. Without DeMorgan's law, a sequential or serial stack of spatial light modulators of stack length N would be required and therefore impractical. The outputs $E_N$ now represent Shannon's combinational output functional $f_1$ through $f_K$, given a sequence of k control vectors of length 2n.

These combinational output functionals can be "OR"ed to produce Shannon's second set of equations by passing the functional back through the optical system 100, supplying the correct control mask for the second set of equations, and using high true inputs and outputs to generate a logical OR function. This now represents what is commonly referred to as a complete arbitrary switching function.

This optical architecture 100 (which utilizes fixed parallel gate interconnects and requires a feedback of the initial outputs into the architecture to generate the user instruction) does not represent a competitive optical interconnect configuration which allows optics to perform within its optimal characteristics. One improvement is to use a parallel implementation of free space interconnects.

Parallel Free Space Interconnect Architecture

The theory of free space parallel optical interconnects has been well documented in such publications as P. Guilfoyle and W. J. Wiley, "Combinatorial logic based digital optical computing architectures", *APPLIED OPTICS*, 1 May 1988, Vol. 27, No. 9., and P. Guilfoyle, "Digital optical computer fundamentals, Implementation, And Ultimate Limits", Proceedings of the SPIE, Vol. 1214–15, and in the critical review series, *Digital Optical Computing*, Volume CR 35, Los Angeles Calif., Jan. 16, 1990. After discussing the use of parallel free space interconnects, this application will demonstrate how parallel architectures can be extended to a global design.

Figure 3:
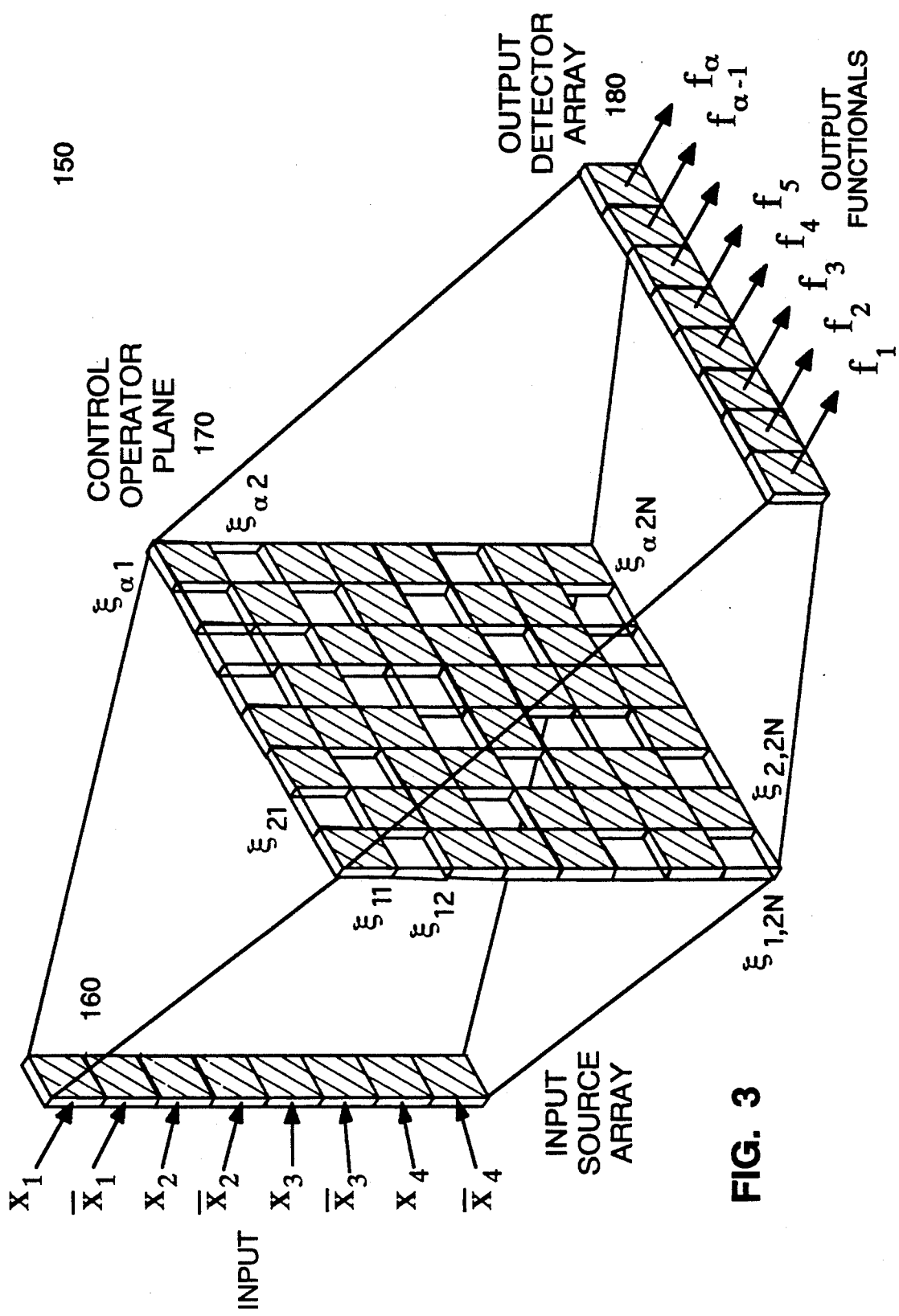
FIG. 3 is a diagram of a free space optical parallel interconnect implementation of the combinatorial functionals from Shannon's first set of equations.

FIG. 3 shows an optical matrix/vector multiplier architecture 150 which fully utilizes the two-dimensional parallelism of optical interconnects. The source data vector is input in dual rail format to the input source array 160. This vertical input vector illuminates in parallel a control operator plane 170 to which is applied a series of 2N-bit control words. In parallel, all minterms or combinatorial functions, $f_1$ through $f_\alpha$ are available simultaneously at the output detector array 180, with $2^N$ different minterms, where any number of them might be available simultaneously. Here alpha, $\alpha$, represents the hardware limit of the matrix, and K is the number of all required functionals.

This architecture 150 provides a Boolean logic matrix/vector multiplier which produces all of the combinatorial output functionals $f_1$ through $f_k$. This is illustrated by the expression:

$$\begin{bmatrix} \xi_{11} & \xi_{12} & \cdots & \xi_{1,2N} \\ \xi_{21} & \xi_{22} & \cdots & \xi_{2,2N} \\ \xi_{31} & \xi_{32} & \cdots & \xi_{3,2N} \\ \cdot & \cdot & & \cdot \\ \cdot & \cdot & & \cdot \\ \cdot & \cdot & & \cdot \\ \xi_{a-1,1} & \xi_{a-1,2} & \cdots & \xi_{a-1,2N} \\ \xi_{a1} & \xi_{a2} & \cdots & \xi_{a,2N} \end{bmatrix} \begin{bmatrix} x_1 \\ \overline{x_1} \\ \cdot \\ \cdot \\ \cdot \\ x_N \\ \overline{x_N} \end{bmatrix} = \begin{bmatrix} \overline{f_1} \\ \overline{f_2} \\ \overline{f_3} \\ \cdot \\ \cdot \\ \cdot \\ \overline{f_{a-1}} \\ \overline{f_a} \end{bmatrix} \quad (8)$$

control matrix     input data vector     output functional vector

The difference between this matrix vector formulation and the one commonly used in mathematics is that the inner product summation terms are actually threshold detections, Boolean summations, or "OR"ings. The only detector precision that is needed is binary, i.e., 1 or 0, which corresponds to detecting the presence or absence of light.

This approach to signal detection is distinguishable from those based on threshold detections, wherein a signal must be greater than some threshold value to be detected. Threshold detection schemes require greater precision and are more concerned with the effects of signal fluctuations and noise, since they discriminate between a signal and a comparison value (the threshold) instead of just detecting the presence or absence of light.

The maximum inner product result from the scheme of FIG. 3 is 1, however, an important effect is that multiple parallel input "AND" gates are provided. All of the output functionals $f_1$ through $f_a$ are produced by the architecture of FIG. 3. Again, $a$ could equal K if desired. Each vertical vector on the optical architecture 150 of FIG. 3 is producing one of the equations shown below:

$$\overline{f_a} = \overline{x_1\xi_{a,1} + \overline{x_1}\xi_{a,2} + x_2\xi_{a,3} + \overline{x_2}\xi_{a,4} + \cdots + x_N\xi_{a,2N-1} + \overline{x_N}\xi_{a,2N}} \quad (9)$$

Note again that the summations shown here are actually "OR" functions and the detector is merely detecting the presence or absence of light. Applying DeMorgan's law as illustrated below, after inversion, the output combinatorial functionals are realized.

$$f_a = \overline{x_1\xi_{a,1}} * \overline{\overline{x_1}\xi_{a,2}} * \overline{x_2\xi_{a,3}} * \overline{\overline{x_2}\xi_{a,4}} * \cdots * \overline{x_N\xi_{a,2N-1}} * \overline{\overline{x_N}\xi_{a,2N}} \quad (10a)$$

$$f_a = \left( \prod_{i=1}^{N} \overline{\overline{x_i}\xi_{a,2i-1}} \right)\left( \prod_{i=1}^{N} \overline{x_i\xi_{a,2i}} \right)$$

The control logic matrix represents a complete instruction on the input data vector $x_1$ through $x_N$ to obtain a full set of functional or minterms. The output is the first set of answers required by Shannon's theorem.

One stage of free space optical parallel interconnects could realize all of $2^N$ standard product terms (or minterms) of N variables. To realize an arbitrary switching function, minterms are fed back to the input, the control operator changed (or downloaded, as the case may be), and the second set of Shannon's equations are then produced at the output, as shown in the following equation.

$$Y = \sum_{a=1}^{K} f_a * \eta_a \quad (10b)$$

These represent the combinatorial summations of Shannon's second set of equations, a two level arbitrary logic switching function. This parallel free space interconnect architecture can be further generalized in accordance with the present invention to a global free space interconnect design.

Global Free Space Interconnect Architecture

Figure 4:
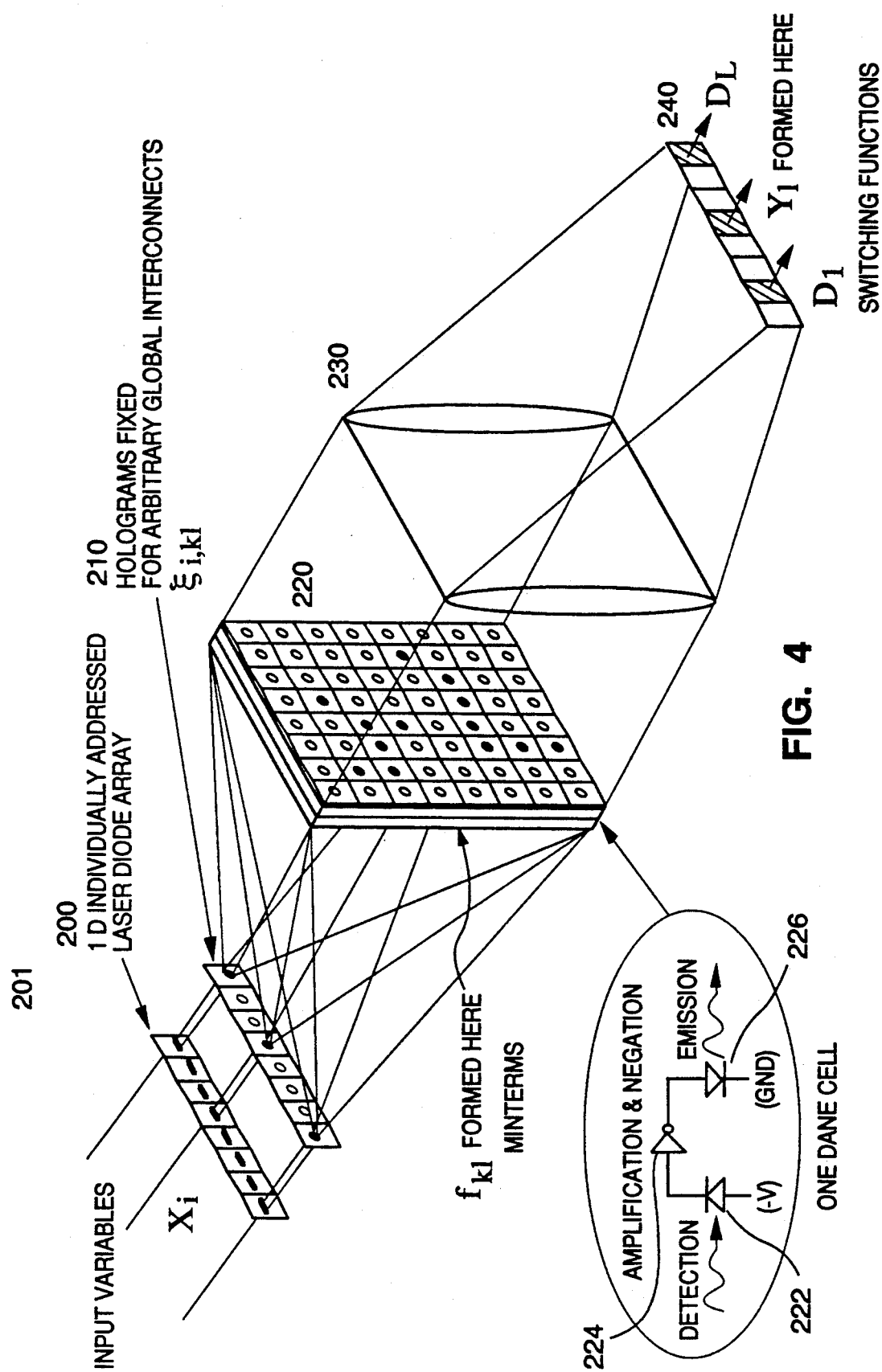
FIG. 4 is a diagram of a two dimensional global interconnect architecture for the generating the combinatorial functionals of FIG. 3, combined with a parallel architecture that forms the combinatorial summations which represent the result of the user specified instruction.

In accordance with the present invention, the approach described in FIG. 3 can be extended to a single pass architecture using global free space interconnects. The logical functions are performed by the optical unit 201 illustrated in FIG. 4. FIG. 4 shows an apparatus which utilizes global interconnects between the input data array and the first stage detector/inverter, combined with a parallel interconnect architecture between the output of the first stage detector and the second stage detector. Note that the apparatus of FIG. 4 uses a control operator array 210 rather than the control operator plane 170 of FIG. 3.

Let $x_i$ in FIG. 4 be a binary signal represented by the light beam intensity from diode laser i in a laser bar 200. When the diode laser (DL) is switched off, $x_i=0$ or is false in high true logical symbolism; when the DL is switched on, $x_i=1$ or is true. Each DL illuminates a corresponding mask/lenslet array or hologram in the row of masks/lenslet arrays or holograms 210, which here serve as the control operator array. Let $\xi_{i,kl}$ be a group by index i of 2D binary images of index kl recorded in the hologram of index i, indices kl denoting the pixel position in the data matrix. All control matrices recorded in the hologram row 210 have, when reconstructed, a pixel size equal to the pixel size of the photodetector cell of the detector matrix 220.

The detector matrix 220 is a two dimensional array and is termed a DANE (detection, amplification, negation (which can be overridden), and emission) array because each element or cell performs those operations. The intensity at the DANE 220 produced by the DL with the number i can be written as:

$$I_{i,kl} = x_i\xi_{i,kl}$$

The total light received by photodetector kl from all holograms can be described as:

$$\overline{f_{kl}} = \sum_{i=1}^{N} x_i\xi_{i,kl} \quad (12)$$

The vector $x_i$ represents logical input variables and $\xi_{i,kl}$ is a control operator represented by a matrix of constant coefficients consisting of 1 or 0. Incoherent superposition of the functionals $\overline{f_{kl}}$ in equation 12, is assured as the lasers in the source array 200 are mutually incoherent. Each DANE cell has a photodetector 222, an amplifier with negation 224 and an optical emitter 226. See inset in FIG. 4. After thresholding at the 0–1 threshold (dark system), the resulting current is applied to optical emitter 226. Equation 12 may be expanded as follows:

$$= (x_1) \begin{bmatrix} \xi_{1,1,1} & \xi_{1,1,2} & \cdots & \xi_{1,1,L} \\ \xi_{1,2,1} & \xi_{1,2,2} & \cdots & \xi_{1,2,L} \\ \cdot & \cdot & & \cdot \\ \cdot & \cdot & & \cdot \\ \cdot & \cdot & & \cdot \\ \xi_{1,K,1} & \xi_{1,K,2} & \cdots & \xi_{1,K,L} \end{bmatrix} +$$

$$(x_2) \begin{bmatrix} \xi_{2,1,1} & \xi_{2,1,2} & \cdots & \xi_{2,1,L} \\ \xi_{2,2,1} & \xi_{2,2,2} & \cdots & \xi_{2,2,L} \\ \cdot & \cdot & & \cdot \\ \cdot & \cdot & & \cdot \\ \cdot & \cdot & & \cdot \\ \xi_{2,K,1} & \xi_{2,K,2} & \cdots & \xi_{2,K,L} \end{bmatrix} + \ldots +$$

$$(x_N) \begin{bmatrix} \xi_{N,1,1} & \xi_{N,1,2} & \cdots & \xi_{N,1,L} \\ \xi_{N,2,1} & \xi_{N,2,2} & \cdots & \xi_{N,2,L} \\ \cdot & \cdot & & \cdot \\ \cdot & \cdot & & \cdot \\ \cdot & \cdot & & \cdot \\ \xi_{N,K,1} & \xi_{N,K,2} & \cdots & \xi_{N,K,L} \end{bmatrix} = \begin{bmatrix} \overline{f_{1,1}} & \overline{f_{1,2}} & \cdots & \overline{f_{1,L}} \\ \overline{f_{2,1}} & \overline{f_{2,2}} & \cdots & \overline{f_{2,L}} \\ \cdot & \cdot & & \cdot \\ \cdot & \cdot & & \cdot \\ \cdot & \cdot & & \cdot \\ \overline{f_{K,1}} & \overline{f_{K,2}} & \cdots & \overline{f_{K,L}} \end{bmatrix}$$

(13)

This shows that the data $x_n$ is operating on matrices of control data rather than vectors of control data as in the two-dimensional parallel case.

The control operator $\xi_{i,kl}$ can be considered as a fixed selection matrix with the function of:

$$x_i \xi_{i,kl} = x_i \text{ if } \xi_{i,kl} = 1$$

$$x_i \xi_{i,kl} = 0 \text{ if } \xi_{i,kl} = 0 \quad (14)$$

If one considers $x_i\xi_{i,kl}$ as a logical function and applies DeMorgan's law, one obtains the minterms (or combinatorial functionals):

$$f_{kl} = \overline{\sum_{i=1}^{N} x_i \xi_{i,kl}} = \prod_{i=1}^{N} \overline{x_i \xi_{i,kl}} \quad (15)$$

where logical multiplication occurs only for the selected i where $\xi_{i,kl}=1$. In this interpretation, the function is evaluated only on the $x_i$ for which $\xi_{i,kl}$ passes light. All other $x_i$'s are ignored.

In the formal mathematical case, after further application of DeMorgan's law, one obtains the arbitrary minterms:

$$f_{kl} = \overline{\sum_{i=1}^{N} x_i \xi_{i,kl}} = \prod_{i=1}^{N} \overline{x_i \xi_{i,kl}} = \prod_{i=1}^{N} (\overline{x_i} + \overline{\xi_{i,kl}}) \quad (16)$$

Thus one has a logical expression relating the action of the selection control operator within Boolean formalism. After detection, amplification and negation, the output DL light emission from the DANE is "on" at the kl th cell when $f_{kl}$ is "true".

The cylindrical lens 230 shown in FIG. 4, placed between the DANE 220 and the output detector array 240, represents the most primitive (parallel) method of forming arbitrary switching functions. Summation of rows or columns of functionals at the DANE matrix 220 output in the vertical (or horizontal) direction can be achieved with this simple cylindrical lens 230. The summed light is detected by the photodiode array 240 producing Boolean summation by using a 0–1 threshold. The output $Y_l$ of each photodiode thus represents a complete logical function or sum of products.

For parallel output, the logical function length is limited to K or L (depending on the lens orientation):

$$Y_l = \sum_{k=1}^{K} \left\{ \prod_{i=1}^{N} \overline{x_i \xi_{i,kl}} \right\} \quad (17)$$

A spherical lens would provide summation of all selected minterms in both k and l dimensions but to only one detector.

Figure 5:
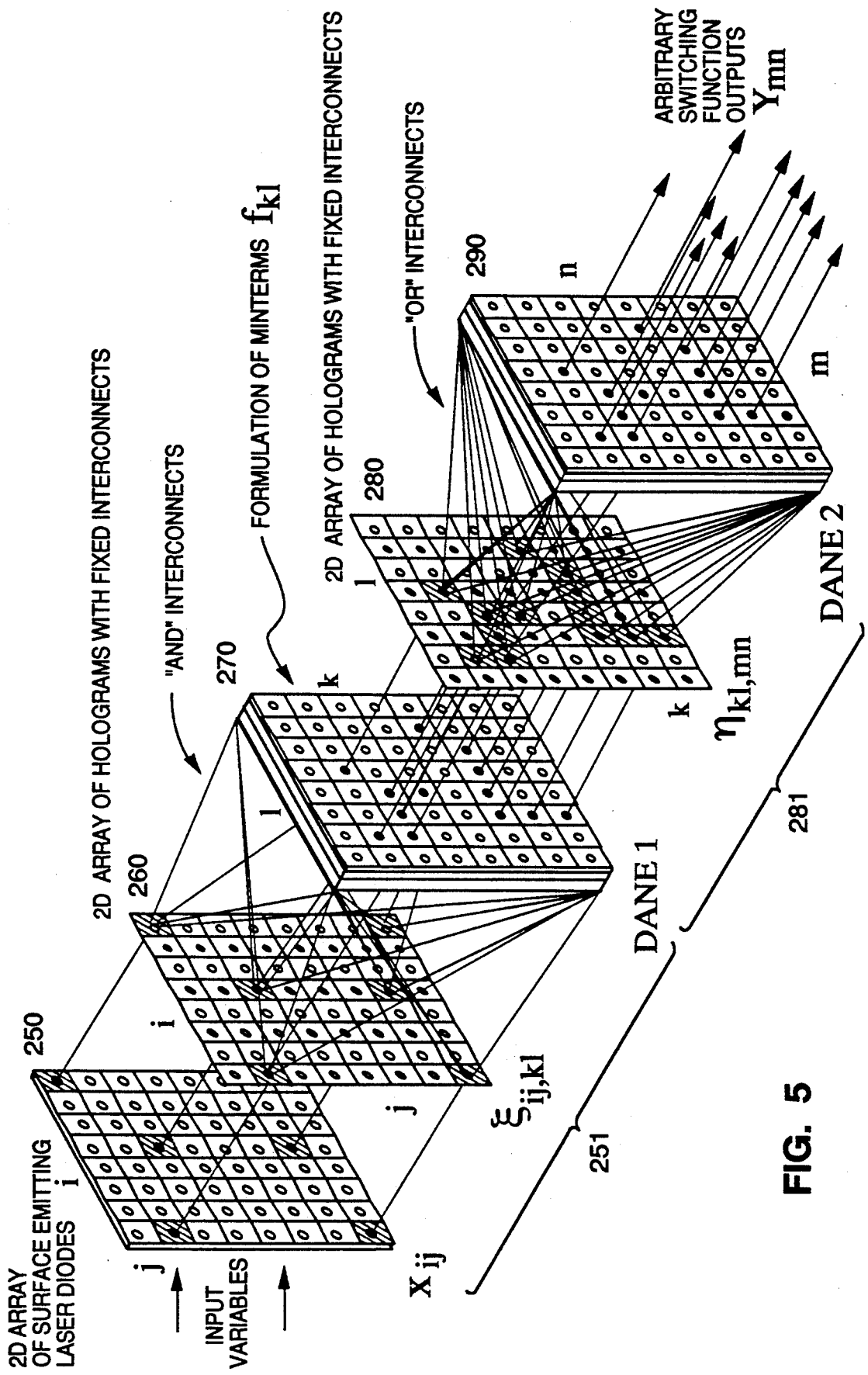
FIG. 5 is a diagram of a dual two dimensional global interconnect architecture for generating a complete, arbitrary user specified instruction.

The architecture of FIG. 4 can be further generalized and extended in accordance with the present invention, as shown in FIG. 5, by the use of a two dimensional input data array 250 and a two dimensional control operator array 260 (as shown in FIG. 3), and the addition of a second control operator plane 280 and detector plane 290 to replace the cylindrical lens 230 and second stage detector array 240, respectively. Again, as in FIG. 4 both sets of Shannon's equations are implemented in one pass through the architecture. The output of the second detector plane 290 is the user specified instruction or arbitrary switching function. Although this architecture is referred to again in detail later in this application, it is presented here to illustrate the progression of concepts represented by the present invention.

The apparatus of FIG. 5 provided a true global interconnect architecture for an optical computer. The single pass architecture is composed of two stages. The first stage 251 is composed of a two dimensional data input array 250 which produces an optical signal representative of the input data bits and propagates that signal to a two dimensional control operator plane 260, here represented as a holographic array. The control plane 260 performs a logical AND of the input data bit and the control plane value, and then propagates that result to the input of the detector plane 270 by means of selective global interconnects. The detector plane 270 performs the operations of detection, amplification, negation, and emission, producing the combinatorial functionals of Shannon's first set of equations as its output.

The second stage 281 of the architecture is composed of the second control operator plane 280 and the second detector plane 290. The output of the first detector plane 270 in first stage 251 propagates to the second control operator plane 280 which performs a logical AND of that output and the control plane value, and then propagates that result to the input of the second detector plane 290 by means of selective global interconnects. The detector plane 290 performs the operations of detection, amplification, and emission, producing the combinatorial summations of Shannon's second set of equations (which represent the user instruction) as its output.

The increase in efficiency provided by the selective global interconnect of the present invention can be appreciated by noting that the control operator plane 170 of FIG. 3 can be reduced to a single control operator vector, when the elements of the control operator vector provide selective global interconnects to the output detector array 180.

Now that an overview of the present invention has been presented, a more detailed discussion of the operation of the stages of the apparatus of FIG. 5 will be given.

First Stage (251)

Figure 6:
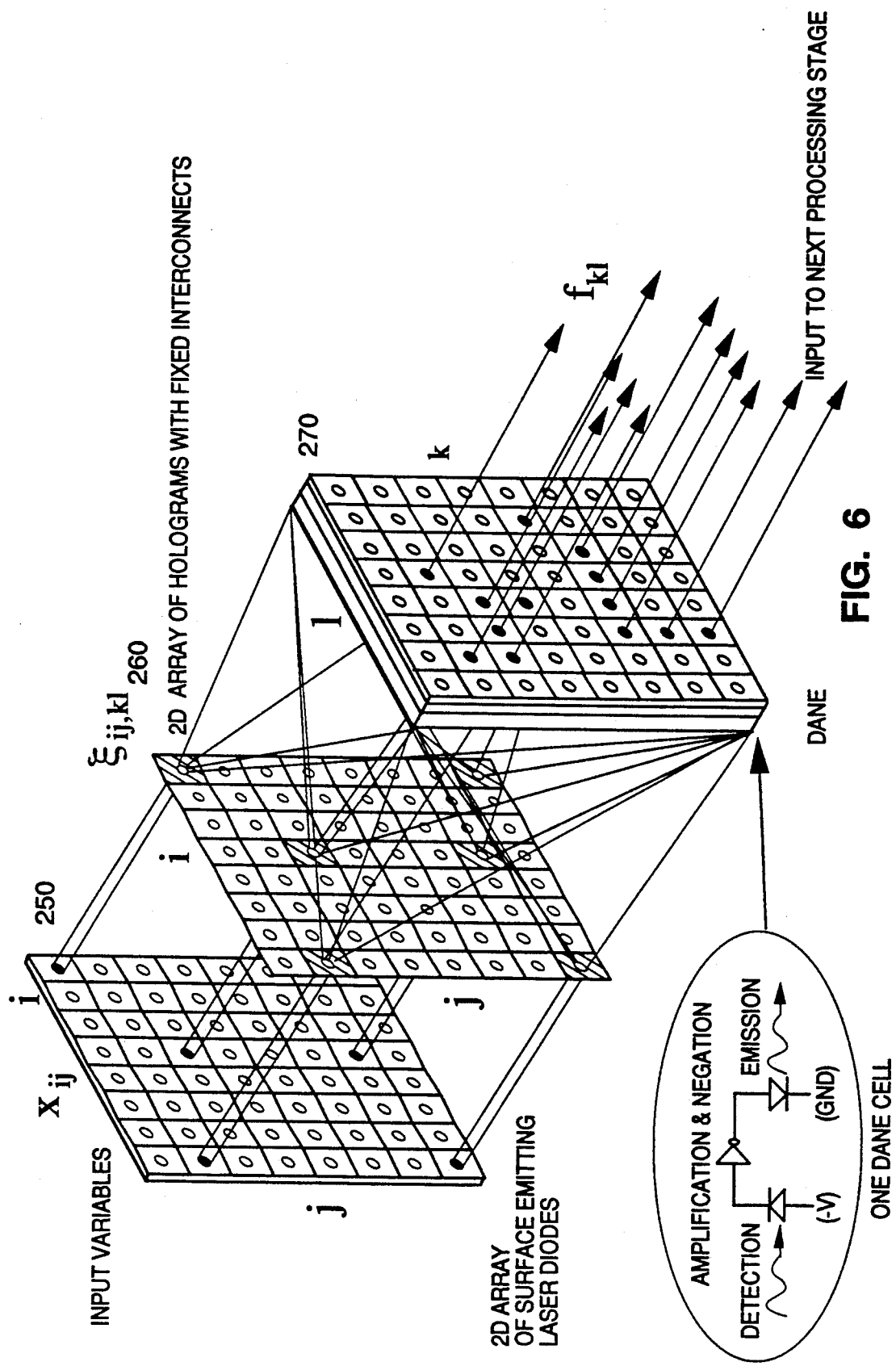
FIG. 6 is a diagram of a two dimensional global interconnect architecture for generating the set of combinatorial functionals which are used to produce an arbitrary user specified instruction.

As mentioned, the optical architecture of FIG. 4 can be generalized. As shown in FIG. 6, it is possible to expand both the data input array 250 and the holographic array 260 to two dimensions. The holographic array 260 is performing a 4 dimensional interconnect. The input is now written $X_{ij}$, the control mask is now $\xi_{ij,kl}$ and the output may be written $f_{kl}$, where a two dimensional array of minterms is generated. Each minterm generated at the output of the detector (DANE) array 270 can consist of up to $N = I*J$ Boolean variables. Equation 16 can thus be expanded as follows:

$$f_{kl} = \overline{\sum_{i=1}^{I} \sum_{j=1}^{J} x_{ij}\, \xi_{ij,kl}} = \overline{\prod_{i=1}^{I} \prod_{j=1}^{J}} \, \overline{x_{ij}\, \xi_{ij,kl}} \quad (18)$$

The apparatus of FIG. 6 is capable of producing at its output the product of logical AND operations, and represents the basic building block of a global interconnect optical computer architecture. Each input variable, representable by binary bits, is fed in dual rail format into one of the $X_{ij}$ elements of the two dimensional input array 250 (note that depending upon whether a combinatorial functional or summation is being formed, the data may or may not be in dual rail format). The array 250 produces an optical output signal corresponding to the binary input value by means of, for instance, a laser diode. The optical signal from the laser diode follows a path to a corresponding $\xi_{ij,kl}$ element of the two dimensional control plane 260. The control plane 260 performs what is in effect a logical AND of the optical representation of the input variable and the control plane value for that element relative to each element of the detector plane 270.

The result of the logical AND operation of each element of the control plane 260 is the selective broadcasting of the input variable to one or more of the KL elements of the detector plane 270. This "selective broadcasting" constitutes the global, four-dimensional interconnect aspect of the architecture because the ijth element of the control plane 260 can sent to one or more of the KL elements of the detector plane 270. The outputs of the detector plane 270 represent the result of a logical AND-OR-INVERT operation which can be used as the basis for generating an arbitrary switching function or user instruction. The outputs are also the $f_{kl}$ combinatorial functionals of Shannon's theorem.

Thus, the output of each klth element of detector plane 270 can be the logical AND of all of the input bits $X_{ij}$ that have been directed to the detector element by the various elements of the control plane 260. For example, using the 8×8 set of elements shown in FIG. 6, assume that the input variables $X_{8,1}$; $X_{1,2}$; $X_{5,5}$; $X_{5,7}$; and $X_{1,8}$ are applied to input array 250. Also assume that control plane elements $\xi_{8,1}$ and $\xi_{5,7}$ direct their corresponding bits to detector plane element $f_{2,2}$; and that control plane elements $\xi_{1,2}$; $\xi_{5,3}\xi_{1,8}$, and $\xi_{5,7}$ direct their corresponding bits to detector plane element $f_{3,3}$.

The output of detector element $f_{2,2}$ would then be $X_{8,1}+X_{5,7}$, and the output of detector element $f_{3,3}$ would be $X_{1,2}+X_{5,7}+X_{1,8}+X_{5,3}$. Using DeMorgan's law it can be seen that:

$$f_{2,2} = \overline{X}_{8,1}\cdot\overline{X}_{5,7},$$

and $$f_{3,3} = \overline{X}_{1,2}\cdot\overline{X}_{5,7}\cdot\overline{X}_{1,8}\cdot\overline{X}_{5,3},$$

where all operations denoted by (·) are Boolean AND logical operations. If the input variables were supplied in complemented form, that is, if $X_{8,1}=\overline{b}_1$; $X_{5,7}=\overline{b}_2$; $X_{1,2}=\overline{b}_3$; $X_{1,8}=\overline{b}_5$; and $X_{5,3}=\overline{b}_6$, then $f_{2,2}=b_1\cdot b_2$, and $f_{3,3}=b_3\cdot b_2\cdot b_5\cdot b_6$. Therefore, by the appropriate formation of the control plane elements $\xi_{ij,kl}$, a detector element $f_{kl}$ can provide the logical AND of any combination of the input data $X_{ij}$.

Second Stage (281)

The apparatus of FIG. 6 can be further generalized, as previously shown in FIG. 5, by adding a second control plane 280 and a second detector plane 290. The second control plane 280 and second detector plane 290 have the capability (subject to implementation constraints) of providing the summation over K * L minterms. More specifically, second control plane 280 elements $\eta_{kl,mn}$ selectively broadcast functionals $f_{kl}$ from the first detector plane 270 to selected elements $Y_{mn}$ of the second detector plane 290. No inversion is performed by the second detector plane 290. This results in an output of each of the selected elements in the form of a summation of the particular functionals $f_{kl}$ that were broadcast to the particular element $Y_{mn}$ by the second control plane 280. As mentioned in connection with the earlier discussion of FIG. 5, in this way both sets of Shannon's equations are implemented in one pass through the architecture. The output of the second detector plane is the user specified instruction or arbitrary switching function.

The apparatus of FIG. 5 provides a true global interconnect architecture for an optical computer. As with the architecture of FIG. 6, each input variable, representable by binary bits, is fed into one of the $X_{ij}$ elements of the two dimensional input array 250 which produces an optical output signal corresponding to the binary input value. The optical signal from the laser diode follows a path to the corresponding $\xi_{ij,kl}$ element of the two dimensional control plane 260, represented (as previously mentioned) by a holographic array. The control plane 260 performs a logical AND of the optical representation of the input variable and the control plane value for that element.

The result of the logical AND operation of each element of the control plane 260 element is then selectively broadcast to one or more of the KL elements of the detector plane 270. Again, the "selective broadcasting" constitutes the global interconnect aspect of the architecture because the ijth element of the control plane 260 can sent to one or more of the KL elements of the detector plane 270. The outputs of the detector plane 270 are again the result of a logical AND-OR-INVERT operation and are also the $f_{kl}$ combinatorial functionals of Shannon's theorem.

The $f_{kl}$ outputs of the AND-OR-INVERT operation are represented by optical signals produced by the emission stage of the first detector plane 270. The optical signal corresponding to the $f_{kl}$ output is projected to a corresponding $\eta_{kl,mn}$ element on the second control plane 280. The second control plane 280 performs a logical AND of the optical representation of the $f_{kl}$ output and the control plane value for the $\eta_{kl,mn}$ element.

The result of the logical AND operation of each control plane 280 element is then selectively broadcast to one or more of the MN elements of the second detector plane 290. The desired interconnects for each individual detector of the second detector plane 290 are individually specified by the elements of the second control plane 280. Note that to produce an arbitrary switching function, represented by Shannon's second set of equations, the second detector plane 290 does not perform a logical inversion or negation operation. Therefore DeMorgan's law is not utilized. This true global interconnect is described by the equation below were KL and MN are the two dimensions of both DANE matrices respectively, and IJ is the number of independent input signals.

$$Y_{mn} = \sum_{k=1}^{K} \sum_{l=1}^{L} \left( \prod_{i=1}^{I} \prod_{j=1}^{J} \overline{x_{ij}\, \xi_{ij,kl}} \right) \eta_{kl,mn} \qquad (19)$$

This architecture allows implementation of a larger Fan-In which allows more than K or L minterms to be summed at each detector. For global output as shown in FIG. 5, the GIBP is dependent only on the interconnects as shown above and the input bandwidth.

An important conclusion may be made regarding the architecture of FIG. 5: for an I*J input array detector matrix and K*L control plane matrix, up to $W^4$ interconnects (I*J*K*L) may be realized in the global interconnect scheme. The theoretical GIBP of $BW^4$, where B is the bandwidth of the signal, represents the maximum possible complexity and the maximum number of realizable Boolean switching functions.

The concepts discussed in this application will be better understood upon consideration of examples, the first of which is now presented. In the example, actual microcode will be mapped into the free space global interconnect structure discussed in this application.

5 Bit Adder Example

First to be presented is a method for single clock, wide word digital addition through free space global interconnects. It will be followed with a 5 bit addition example, and later in this application, a 64 bit addition example.

Addition is of considerable importance for computing, as it is used in other arithmetic operations such as subtraction, multiplication, division, square-root extraction, etc. Implementation of the addition method will also demonstrate the high degree of efficiency obtainable using free space global interconnects in accordance with the present invention.

If two numbers A and B are to be added:

$$A = A_{n-1}, A_{n-2}, \ldots, A_i, \ldots A_0 \qquad (20)$$
$$A_{n-1}, B_{n-1} \quad \text{Most Significant Bit (MSB)}$$

$$B = B_{n-1}, B_{n-2}, \ldots, B_i, \ldots B_0 \qquad (21)$$
$$A_0, B_0 \quad \text{Least Significant Bit (LSB)}$$

Then the arithmetic sum can be obtained through three steps:
1. generating a partial sum and partial carry,
2. calculating a look-ahead carry, and
3. generating a true sum for each digit using the partial sum, and true carry.

In step 1, the partial sum $P_k$ and partial carry $G_k$ are precalculated:

$$P_k = A_k \oplus B_k$$
$$G_k = A_k \cdot B_k \qquad (22)$$

This procedure may be performed either optically or electronically with 2 gate delays.

In step 2, the look-ahead carry is calculated in two more gate delays:

$$C_m = G_m + \sum_{i=1}^{m} G_{m-i} \prod_{j=1}^{i} P_{m-i+j} \qquad (23)$$

In step 3, the true summation is calculated X-"OR"-'ing the true look-ahead carry $C_{m-1}$ with the partial sum $P_m$ in each digit:

$$S_m = P_m \oplus C_{m-1} \qquad (24)$$

A 5 bit look head carry implementation will demonstrate the efficiency of using global optical free space interconnect techniques. When computing the partial sum and carry (Step 1), the gate interconnect requirement is 10. The gate interconnect requirement for the look-ahead carry term is 35, however the gate interconnect requirement for the final true sum is only 5. Thus, the interconnect increases linearly with primitive width for Steps 1 and 3, but on the order of $\beta^* W^2$, where W is the primitive width and where $\beta$ increases monotonically with, but is less than the primitive width, for Step 2. Therefore, the focus will be on the utilization of global free space optical interconnects to calculate the look ahead carry calculation in Step 2.

In the 5-bit example, a total of 15 "minterms" of the look-ahead carry must be generated:

| | | | | | (25) |
|---|---|---|---|---|---|
| $C_{01} = G_0$ | $C_{02} = 0$ | $C_{03} = 0$ | $C_{04} = 0$ | $C_{05} = 0$ | |
| $C_{11} = G_1$ | $C_{12} = G_0 P_1$ | $C_{13} = 0$ | $C_{14} = 0$ | $C_{15} = 0$ | |
| $C_{21} = G_2$ | $C_{22} = G_1 P_2$ | $C_{23} = G_0 P_1 P_2$ | $C_{24} = 0$ | $C_{25} = 0$ | |
| $C_{31} = G_3$ | $C_{32} = G_2 P_3$ | $C_{33} = G\,hd\,1 P_2 P_3$ | $C_{34} = G_0 P_1 P_2 P_3$ | $C_{35} = 0$ | |
| $C_{41} = G_4$ | $C_{42} = G_3 P_4$ | $C_{43} = G_2 P_3 P_4$ | $C_{44} = G_1 P_2 P_3 P_4$ | $C_{45} = G_0 P_1 P_2 P_3 P_4$ | |

The 15 minterms consist of 35 factors with only 9, (2N−1), different factors and 10 zero terms. To obtain the 5 look-ahead carry terms, a Boolean summation is completed across each row of the matrix, as shown in FIG. 7.

Figure 7:
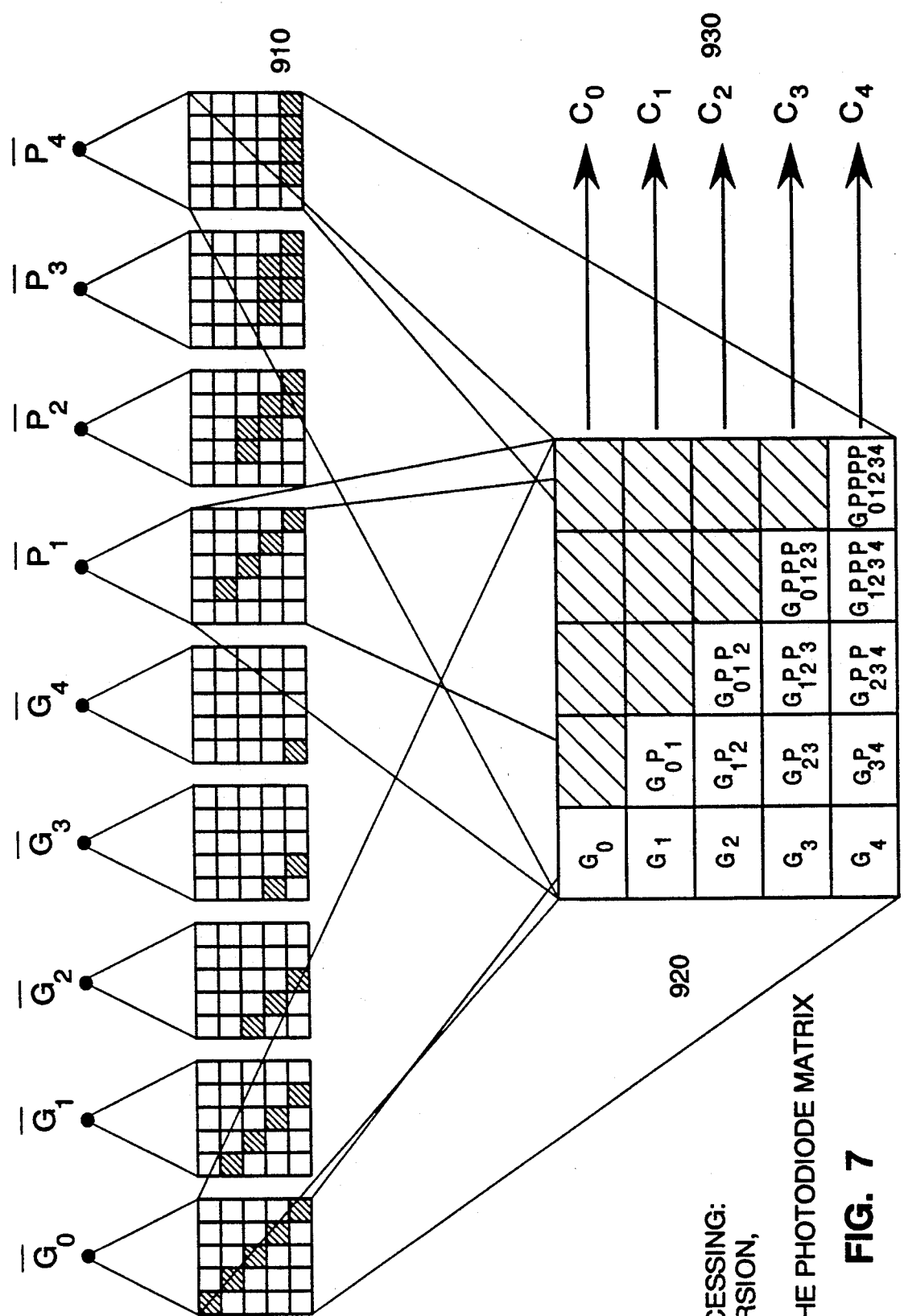
FIG. 7 illustrates a global free space digital optical computation scheme for a full 5-bit look-ahead carry.

For ease of understanding, the control operator plane in FIG. 7 is shown in the form of individual masks for each input $P_k$ and $G_k$. In this configuration the output of each mask is imaged onto detector plane 920 by a lenslet array and spherical imaging lens which form a set of telecentric imaging systems (not shown). In practice, control operator masks 910 can be replaced with a control operator plane (such as control operator plane 260 in FIG. 6) in which each control mask would be implemented by way of a corresponding holographic element which would provide the desired selective global broadcasting.

Initially, the precalculated partial sum $P_k$ and partial carry $G_k$ are negated and input to laser diode bar arrays (not shown). Each term illuminates its individual control operator mask 910 (which can correspond to a holographic element $\xi_{ij,kl}$ of control operator plane 260). The masks 910 are programmed for a 5-bit look-ahead carry computation. Each $5 \times 5$ element mask 910 (for the 5-bit case) is imaged onto a $5 \times 5$ photodetector array 920. Each detector initially performs a Boolean OR of 9 inputs. The output is logically negated at this point to provide the appropriate minterm (AND products) by virtue of DeMorgan's Law.

Subsequent Boolean summation across the rows of the detector array 920, using a lens (not shown), provides the sum of products and (as programmed) subsequent detection of the sum of products of each row, using a detector (not shown) which detects the presence or absence of light, provides the full look-ahead carry output for 5-bits 930. With the DANE matrix, the Boolean summation across the rows is performed optically. These carries are then exclusive ORed (XOR'ed) with the partial sum for the full ADD result. The example of FIG. 7 uses the architecture of FIG. 4, except that instead of the column-wise ORing lens 230, a row-wise ORing lens is substituted, and instead of the row-wise detector 240, a column-wise detector is substituted. Thus, it can be appreciated that the present invention is capable of greatly reducing the complexity of the lookahead carry generation.

Returning now to FIG. 5, the apparatus of FIG. 5 utilizes selective global interconnects between the elements of the control operator planes 260 and 280 and the detection stages of the elements of the detector planes 270 and 290. This allows the efficient generation of an arbitrary switching function as the output of the second detector plane 290. The architecture of FIG. 5 also utilizes a DANE device in the preferred embodiment of the present invention, which combines the attributes of electronic and optical based logic families as the elements of the detector planes. The apparatus of FIG. 5 thus incorporates the fundamental concepts of the present invention and is an extension of the previous approaches and architectures.

The DANE arrays shown in FIGS. 4, 5, and 6, and the individual DANE devices involve, in accordance with the present invention, the augmentation of semiconductor based logic with optical digital logic. Signal selection, algorithmic organization and routing, and combinatorial evaluation are performed by optical means. Detection, amplification, negation, and emission are performed by electronic means. Before presenting additional applications of the present invention, a discussion of the benefits obtained from augmenting semiconductor based logic with optical logic, and of the benefits and features of the DANE device are given. The DANE discussion focuses on the required attributes of the DANE and currently available devices which perform some, but not all of those functions.

Overview of the DANE Device

The DANE device performs the functions of detection, amplification, negation (if desired), and emission in an integrated device. To better understand the motivation for such a device and its benefits, its functional aspects are first discussed.

Figure 8:
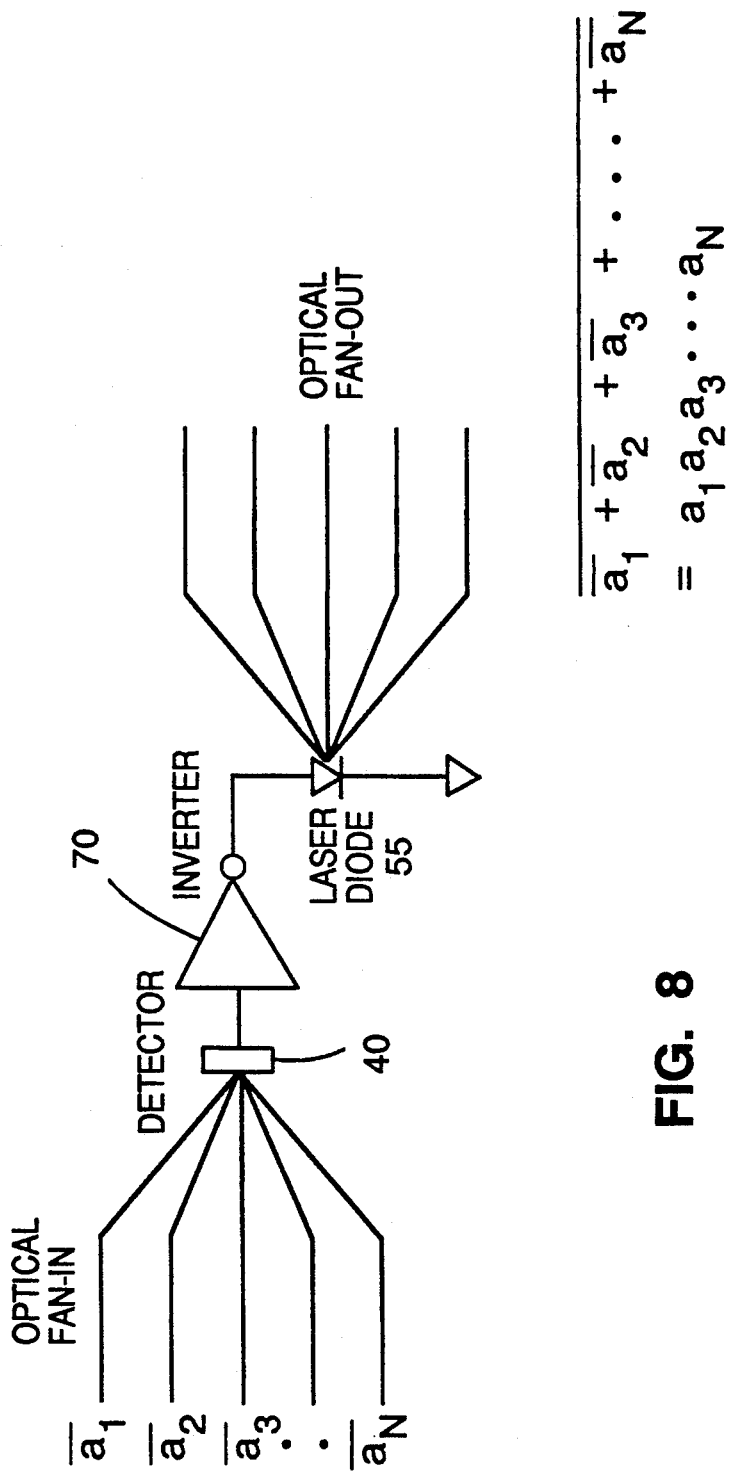
FIG. 8 is a diagram showing a simple example of an opto-electronic DANE-type device.

FIG. 8 is the simplest example of a DANE-type device, in accordance with the present invention, although it does not explicitly show the amplification function. The figure also represents the primitive method that is used to produce wide word addition, counting and floating point multiplication structures in this application.

The Fan-In is N bits wide in FIG. 8. When an arbitrary digital wide-word is represented in its complemented form, the detector 40 acts as an OR gate, literally performing a Boolean summation on the wideword. After electronic inversion by the inverter 70, and re-emission by the laser diode 55, the output light represents the N-bit AND product of the input bits (by application of DeMorgan's theorem). Consequently, a single gate delay for 64 bit wide AND gates is possible. These structures may be arbitrarily expanded to any digital function required.

It has been further discovered by the inventors that if the device of FIG. 8 is implemented by augmenting electronic semiconductor based logic with features of optical based logic, the resulting device makes the global interconnect architecture discussed in this application commercially viable. Therefore, a fuller explanation of the benefits obtained by augmenting one type of logic with the other is now presented.

Optical Logic Augmentation of Semiconductor Logic

The ultimate reason for suggesting a "marriage" between photonic technology and GaAs is to obtain the highest possible computing speed at a much lower power consumption level, which subsequently will reduce the overall cost and make the architecture commercially viable. GaAs presents the highest possible modulatable bandwidths. Photonic technology offers the highest level of global interconnect capability at the lowest power consumption level to bandwidths of $\frac{1}{2}$ the center frequency of light (approximately 10E14 Hz). Consequently, the maximum possible GIBP may be achieved by integrating both technologies.

Another point is that for military and space applications, GaAs ICs offer exceptional radiation hardness (typically $10^7$ to $10^8$ RADs). By contrast, free space optical interconnects offer infinite radiation hardness. This is an additional benefit of using both semiconductor and optical logic elements in an architecture.

The optically augmented semiconductor logic of the present invention provides high Fan-In and Fan-Out, low power consumption, and wide noise margins. These attributes compliment the "smart" gate interconnect concept of the present invention.

Opto-Electronic OR Gate

To demonstrate the benefits which can be realized by combining features of semiconductor and optical based logic families, and to further illustrate the advantages of the present invention, the architecture of a standard electronic OR gate will be contrasted with that of an opto-electronic implementation of the same gate.

Figure 9:
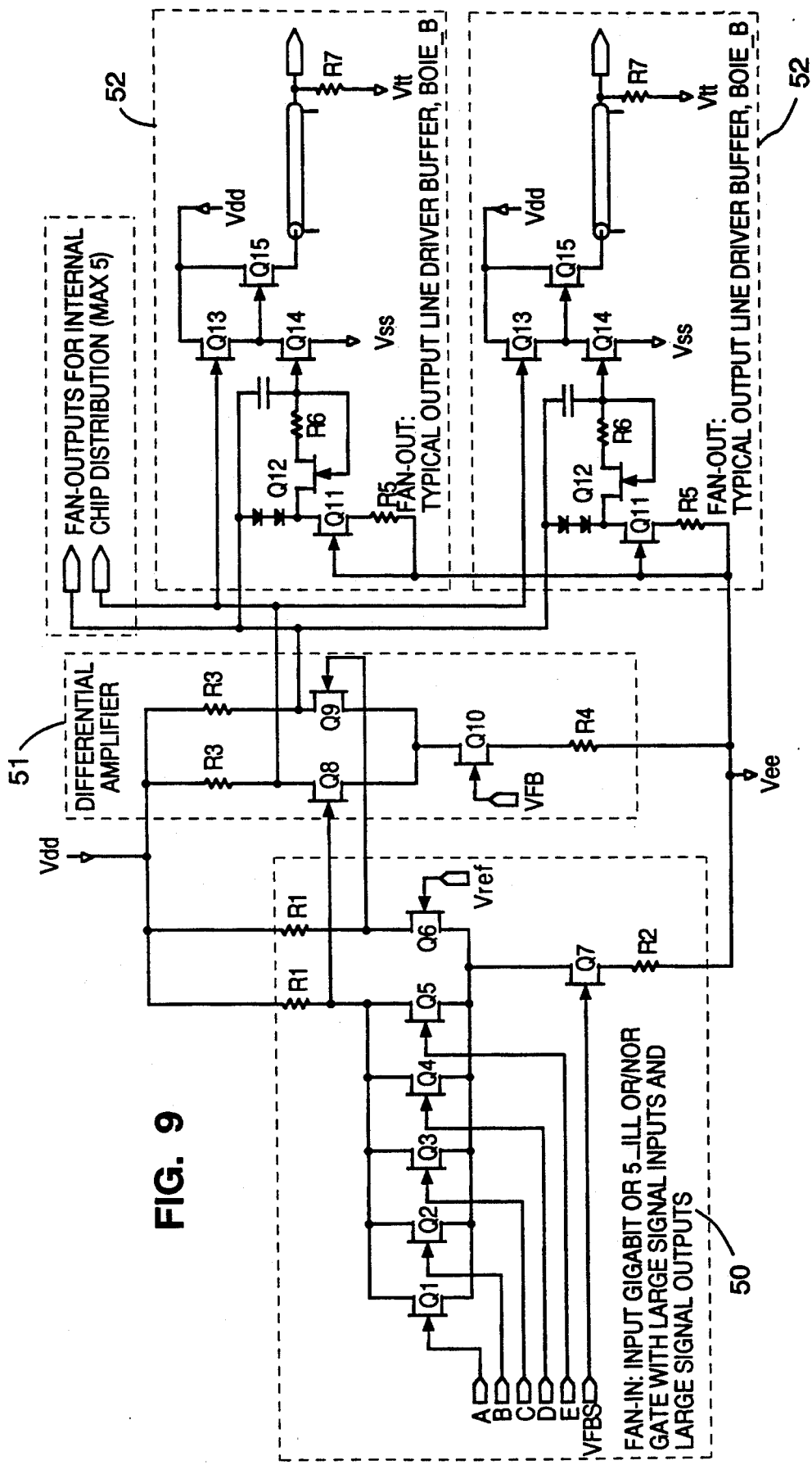
FIG. 9 is a diagram of a GaAs based monolithic OR gate showing the Fan-In, differential amplifier, and Fan-Out stages of the device.

FIG. 9 shows the construction of a prior art electronic OR gate. The schematic is taken directly from a standard cell library of GigaBit Logic Corporation, now Triquint, of Portland, Oreg. (Gigabit part number OR5_iLD). The figure shows the Fan-In stage 50, a differential amplification and inversion stage 51, and multiple Fan-Out stages 52. The OR gate is all-electronic and utilizes both enhancement and depletion mode metal semiconductor field effect transistors (E/D MESFETs) and Schottky barrier diode process (Gigabit SC 10000 standard cells).

Figure 10:
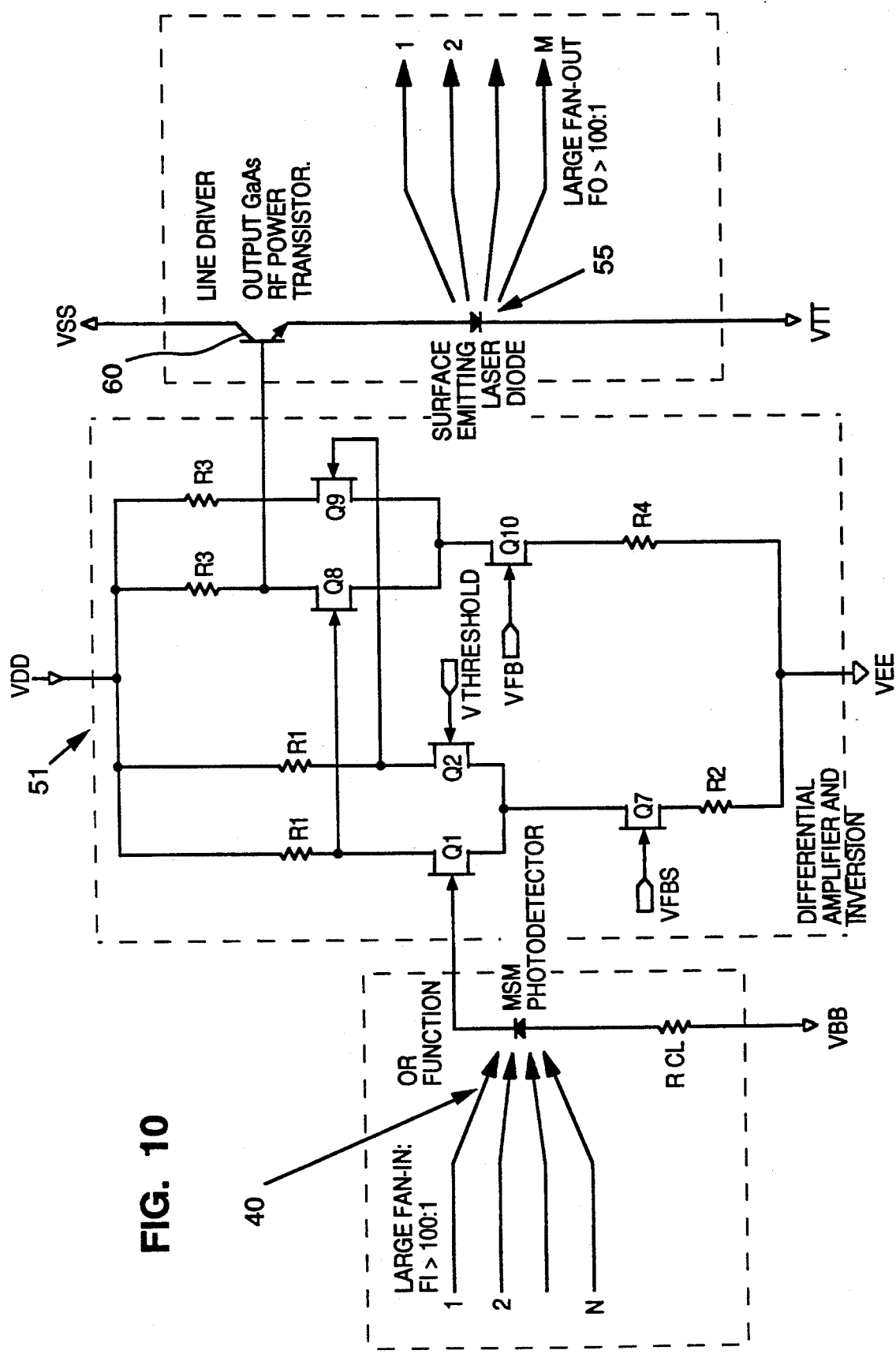
FIG. 10 is a diagram of an opto-electronic implementation of the OR gate of FIG. 9 which includes the negation operation because of the negative rail bias of the detector.

FIG. 10 depicts an opto-electronic version of the OR gate of FIG. 9 in accordance with the present invention. This design combines the features of semiconductor and optical logic based families. The Fan-In stages 50 of the electronic OR gate have been replaced by an inverting photodetector 40. The Fan-Out line driver stages 52 of the electronic OR gate have been replaced by a solid state laser diode 55 and driver transistor 60 which are fed from the non-inverting output of differential amplifier 51. The differential amplifier 51 remains the same, except that the GaAs MESFET technology can be replaced by GaAs HEMT technology. In both cases, the differential design provides thermal stability over a wide temperature range. The internal amplification stages of the opto-electronic OR gate and the electrical OR gate are essentially similar. Each has a dual differential pair gain stage circuit.

The monolithic version of the opto-electronic OR gate of FIG. 10 incorporates the following four elements:

1. A GaAs MSM (metal semioonductor metal) photodetector for low noise and high speed;
2. GaAs HEMT (high electron mobility transistor) or GaAs MESFET transistors for high bandwidth;
3. A GaAs bipolar power transistor or equivalent; and
4. A surface/edge emitting laser diode.

The differential pairs are made out of HEMT transistors because of low noise (20 fA/$\sqrt{Hz}$) and wide bandwidth considerations. HEMT shows greater potential than MESFET (metal semiconductor field effect transistor) for wider bandwidth and lower noise. HEMTs were previously known as modulation doped FETs, or MODFETs.

A principal advantage of the HEMT device is that the electron mobility in the channel is higher in the HEMT than in a MESFET component, because there are no dopant ions in the channel to scatter carriers. This attribute gives HEMT devices a fast-turn-on characteristic. They develop nearly their full transconductance with gate-logic voltages only slightly above the threshold. Furthermore, the thin gate insulator gives them a comparatively high transconductance.

In addition, the effective electron velocities achieved are also higher than those in room-temperature MESFETs so that the potential clock speed is also higher. This attribute was noted by R. Eden, A Livingston, and B. Welch in "Integrated circuits: the case for gallium arsenide", *IEEE Spectrum,* December 1983, pg 30. Because of these high electron velocities, HEMT devices are excellent candidates for building high-performance VLSI opto-electronic integrated circuits.

The benefits of the opto-electronic OR gate of FIG. 10 when compared with the electronic OR gate of FIG. 9 will now be discussed.

Opto-Electronic Fan-In/Fan-Out

The electronic OR gate Fan-In stage 50 of FIG. 9 requires a separate FET per input. The signal energy required is a function of the gate capacitance. Typically, the best GaAs gate input capacitance is approximately 60 femto Farads. The corresponding energy consumption, per gate, is calculated by the equation $E=CV^2/2$. Consequently, each gates requires 30 fJ per Fan-In and an extra FET. The maximum Fan-In in GaAs is limited by the speed required. Each time a gate is added, parallel capacitance is added across the first differential input stage, which causes a decrease in system speed. Currently, maximum Fan-Ins of 5 are realizable with GaAs technology.

These problems may be significantly alleviated by the incorporation of opto-electronic technology in accordance with the present invention. The input MESFETs are replaced by a single photodetector 40 as shown in FIG. 10. The photodetector has no capacitive loading effect on the Fan-In. Fan-In energy of 1.2 fJ has been routinely achieved using an avalanche photodiode followed by conventional transimpedance amplifier design. The present invention utilizes a MSM photodetector followed by HEMT differential amplification stages. The MSM photodetector has demonstrated noise sensitivities on the order of 50 fA/$\sqrt{Hz}$. For purposes of comparison, an APD device currently available operates at 100 fA/$\sqrt{Hz}$. In addition, MSM technology may be monolithically integrated into GaAs.

The output structure 52 of the electronic OR gate is shown in FIG. 9. The maximum off-chip Fan-Out which can be achieved is 10, where the line drive power consumption is the limiting factor. At an impedance of 50 ohms and 1 volt of output swing, the power consumption per line driver buffer is calculated to be 20 mW. Consequently, a Fan-Out of 10 will consume 200 mW. This 50 ohm load requirement appears when the pin driver must send the electronic pulse a distance d, whenever the desired rise time is $t_r < d\epsilon/2c$, where $\epsilon$ is the dielectric constant of the transmission material (assumed to be 1) and c is the speed of light. A 50 ohm transmission line system is used to dampen reflections. At a 1 GHz clock rate, the energy consumption is 20 pJ per gate.

Low Power Consumption

The opto-electronic implementation of FIG. 10 of the OR gate of FIG. 9 operates at low power. A driver transistor 60 and laser diode 55 replace the line drivers (a 1 mW laser diode is preferably employed in the present invention). Because the laser diode Fan-In energy is 1.2 fJ, a 1 mW laser diode can provide up to 1 pJ of energy at a clock rate of 1 GHz.

At 100% efficiency, this is equivalent to a Fan-Out ratio of 3000:1. At 3% efficiency, the Fan-Out can approach 100:1. Capacitive loading effects and rise time requirements do not affect the opto-electronic implementation, as they would a GaAs based design. Consequently, for off chip line driving, the power consumption is reduced from 200 mW to 1 mW when the opto-electronic implementation is used.

Photonic interconnect technology for on-chip Fan-Out in accordance with the present invention is competitive with existing technologies. Where the transmission line length is short (on the scale of microns) and rise time effects are insignificant, energy consumption drops from 20 pJ per gate to 30 fJ per gate (note that 30 fJ is still a factor of 30 over the 1 fJ requirement for the opto-electronic implementation).

With current laser diode technology, threshold currents are only slightly less than 1 ma. Projected current thresholds of 10 μA which employ extremely small active volumes (0.05 cubic microns) are projected in the future. Due to the relatively high threshold current required in today's devices, the laser diode output minimums are as high as a few mWatts. Consequently, it is an attractive solution for line drivers, but not as good a solution (only a 30:1 advantage) for direct gate level interconnects when only the issue of Fan-Out is considered. However, on-chip Fan-In is still limited by capacitive loading effects, and therefore on-chip Fan-Out is affected accordingly.

Realistic energy consumption per gate Fan-In of 100 fJ can be achieved with GaAs. The operating point of optical Fan-Outs and Fan-Ins can be biased for example, at 800 photons, which is approximately 200 attoJoules (aJ). This corresponds to a signal to noise ratio of $\sqrt{(800/2)}$, and a corresponding bit error rate of 7.7E-24. This attribute makes the photonic augmentation of the GaAs technology extremely attractive.

Noise Margin

Another benefit of opto-electronic technology is that the wide noise margin of a detection scheme based on detecting the presence or absence of light allows the architecture to achieve a significantly wider Fan-In and the equivalent or lower Bit Error Rate (BER) than obtainable with GaAs or other semiconductor based architectures operating at comparable power levels. This means that the architecture of the present invention can operate with higher Fan-In and lower power requirements than would an equivalent GaAs architecture, while maintaining a high level of computational accuracy (as there are fewer concerns with signal fluctuations and noise levels).

In Appendix A an expression for the BER as a function of the contrast ratio $R_c$, and the Fan-In, N is derived. The calculation demonstrates that even with a high Fan-In, an excellent contrast ratio (and hence signal-to-noise ratio) can be achieved at a low BER. This means that even with light leakage from adjacent control plane masks creating a noise source, opto-electronic technology provides a low power and highly accurate computation architecture. The expression from Appendix A is:

$$BER \simeq \frac{4\sqrt{2}\,N}{R_c\sqrt{\pi}} \exp\left(-2\left\{\left[\frac{R_c}{4\sqrt{2}\,N}\right]^2\right\}\right) \quad (26)$$

Figure 11:
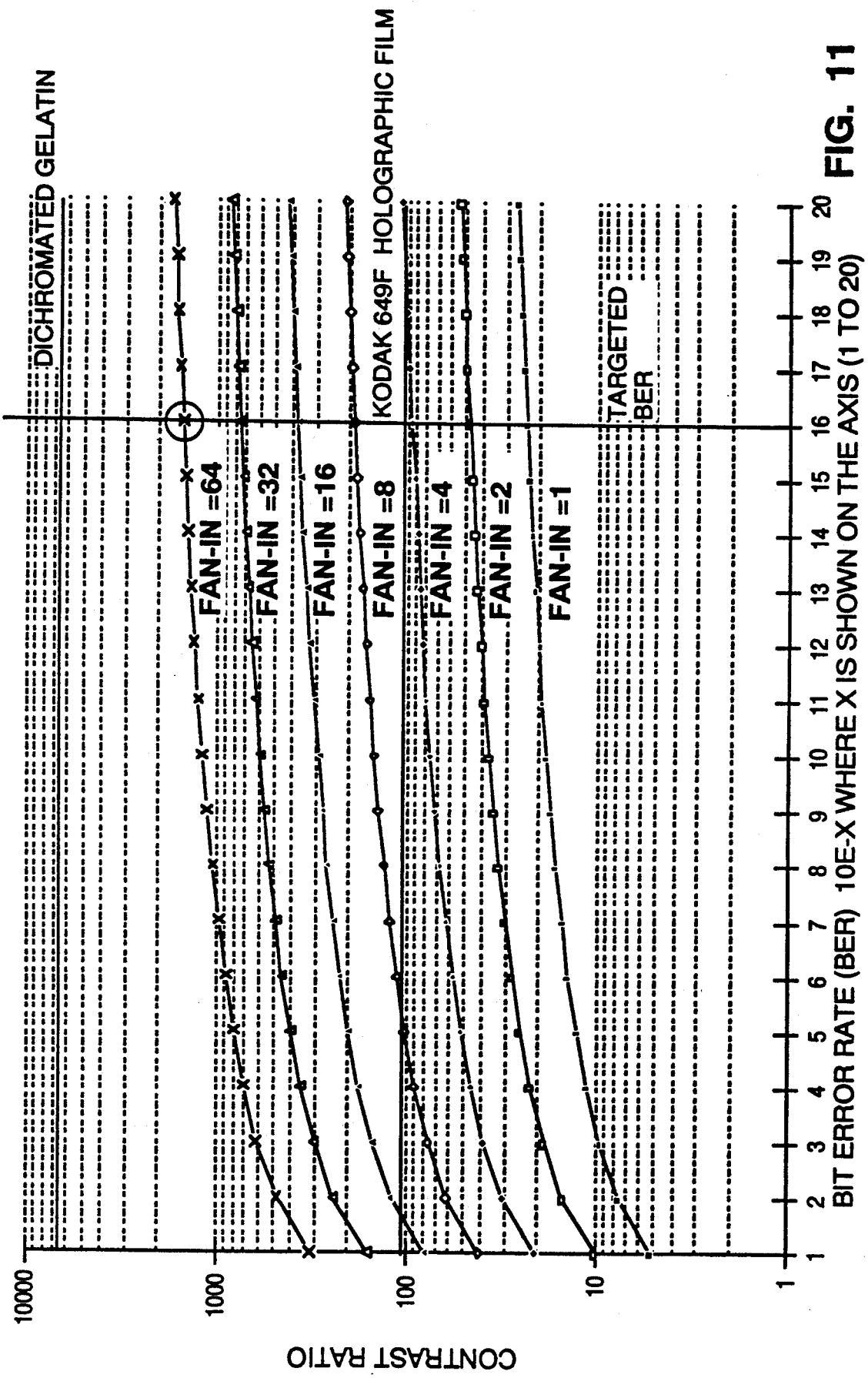
FIG. 11 is a graph showing the required global interconnect Contrast Ratio versus Bit Error Rate (BER) based on the derivation found in the Appendix.

FIG. 11 is a plot of the Bit Error Rate vs. system contrast ratio requirement given wide word Fan-In, based on equation (26). A wide noise margin is available, especially with the use of a dichromated gelatin holographic medium (contrast ratio over 6000:1) for the control operator plane elements. For example, a BER of $10^{-6}$ or better can be obtained for a Fan-In of 64 when dichromated gelatin is used for the holographic elements of the control plane.

"Smart" Gate Interconnects

An additional feature of opto-electronic devices is their ability to utilize "smart" gate interconnects. This permits a more efficient use of the logic gates to produce the terms of the user specified instruction. The ability to perform wide word Fan-In allows implementation of digital combinatorial methods which are not currently implemented with lower Fan-In structures. In effect, this allows a reduction in computational pipeline delays.

There are trade-offs between the number of gates required for a given computational primitive as a function of the pipeline gate delay and the width of each gate. However, the width of each gate has typically been limited by the Fan-In. Consequently, algorithmic structures utilized extensive pipelining. The use of photonic interconnect technology permits significantly more computationally intensive computing at each gate delay level.

Power Balance Issues

As mentioned, the power requirement of the computing architecture of the present invention is a critical issue because it influences the commercial viability of the approach. It is important to recognize that a significant benefit of the present invention is that it provides a more optimal use of power than would a purely semiconductor or electronic based architecture.

There are two main areas in which the present invention improves on the power requirements of semiconductor based architectures: signal detection power requirements, and increased Fan-In and Fan-Out capacity. Because the noise floor for optical detection is much lower than that for electronic based detectors, less input signal energy is required and a good signal-to-noise ratio can be achieved by optical detectors, all with a lower power requirement than would be necessary for electronic devices.

This is important because the combination of the optical detection and emission stages with the higher Fan-In and Fan-Out capabilities of opto-electronic devices (as compared to electronic devices) further leverages the benefits obtained from the detector and emitter power requirements. In this way the gate power requirement is minimized and does not dominate that of the gate interconnect structure.

This is not the case with semiconductor devices which are limited in Fan-In and Fan-Out capabilities and require higher power for signal detection. It is also not the case with some present approaches to using optical devices as signal detectors and modulators in which the optical intensity is increased to facilitate detection, rather than taking advantage of the low optical noise floor. The DANE device of the present invention maintains the benefits resulting from the lower power requirements of the optical interconnects and thus provides a competitive alternative to existing computing architectures.

Now that the benefits of augmenting semiconductor logic with optical logic have been discussed, a more detailed discussion of the DANE device is given.

The DANE Device and Array

The present application is directed to the design and development of a new class of spatial light modulator. The motivation is to design the modulator to the application and not to fit the application to an arbitrary modulator design. As indicated in this application, the ideal device consists of a two dimensional array of detection, amplification, negation and emission cells (or DANE cells) in monolithic GaAs technology. As will be discussed, it is believed feasible to integrate all required parameters into one hybrid/monolithic device.

This device can ultimately achieve the utilization of the low power levels that optical logic can provide. In addition, the device provides the capability to wire "smart" interconnects into its environment not only for optical computing purposes but also for communication, be it chip-to-chip, multi-chip module to multi-chip module, or processor to processor.

All networks in digital communication and digital computing consist of a number of switches and logic gates connected according to a specific design. As previously shown, to realize an arbitrary switching function, a complete set of logic functions must be available. The two most important sets are: AND & NOT and OR & NOT. Through each of these logical functions the complete sets, S-of-P (sum of products) and P-of-S (product of sums) forms, can be realized. This enables any arbitrary switching function to be implemented.

There are other complete logic function sets like the SHEFFER STROKE or PIERCE FUNCTION, as described in A. Barna and D. Porat, *Integrated Circuits in Digital Electronics*, 2nd edition, John Wiley & Sons, p. 57, but it is important that the NOT (negation) function be included as part of any complete functional set.

The utilization of DeMorgan's law is important. This law states that the inverted Boolean sum of logic variables is equivalent to the Boolean product of these inverted variables. In optics, the summation of optical beams through a lens and photodetection of this flux implements an "OR" operation, providing the physical basis for utilizing this law.

In the approach of the present invention, the photodetector output (detection) is proportional to the input light power. By setting the threshold above the KT limit by the amount required to achieve the desired BER, i.e. between the zero and one levels, the action of the lens and the photodetector is equivalent to the logical OR operation. Each unblocked ray-path to a detector represents a logical variable. If the photodetector output is thresholded and then inverted (the absence of light is considered as TRUE), then the output of this scheme is equivalent to the logical AND operation by the absence of light beams. Without the NOT function and DeMorgan's law, optical systems for smart optical interconnects and optical computing would be impractical. A sequential or serial stack of J spatial light modulators would be required to implement a J input logical AND operation.

The necessary and sufficient set of required logical functions are NOT, AND or OR, and a gain function (amplification) for signal restoration (and depending upon the architecture used, the capability of feedback for further computation). The functions contained in one cell of a DANE matrix are light detection, current amplification, thresholding, inversion or negation, and emission.

The resulting signal after amplification and negation is applied to a diode laser to supply an output source (emission) of coherent light. The requirements for laser emission in stacked DANE assemblies include:

(1) Speed

GaAs/AlGaAs diode lasers should be used for DANE because of the requirement for ultra-low threshold current, sub-nanosecond to a few tens's of picosecond rise and fall time, and the possibility for 2-D monolithic array integration with other high speed GaAs integrated circuits. Similar schemes have been demonstrated in many laboratories, such as MIT-Lincoln Lab, Lexington, Mass., David Sarnoff Lab, Princeton, N.J., and Spectra Diode Labs, San Jose, Calif.

(2) Control Means

Coherency and narrow emission spectra provide the ability to utilize holographic technology for the control means. The interconnects provide information from a single source to N different destinations (N-fold Fan-Out). They also provide a simultaneous path from N different sources of information to a single destination (N-fold Fan-In). The use of holographic technology allows the arbitrary routing of an incoming light beam to many desired pre-calculated directions with minimal interference from non-desired sources.

The interconnect hologram requires illumination by coherent light such as from a single mode laser diode with a coherence length greater than a few mm. Because the angular scaling of a hologram image depends on wavelength it is very important that a tightly controlled wavelength be emitted so as to achieve correct image registration.

(3) Low Threshold

A Fan-Out of 100 at the 5000 photon per bit energy level (1.2 fJ) is equivalent to 20 watts of cw power (60% pulse duty cycle modulation at 100 MHz). Adding a factor of 10 for losses (such as holographic efficiency), means that each laser should emit approximately 200 $\mu$watts. Therefore the threshold current should be very low to allow the emitted coherent light power to be well above the spontaneous emission power region of the diode.

Current Research Into Spatial Light Modulator Devices

There are many types of high-speed and sensitive SLM (Spatial Light Modulators) under development for optical interconnects and optical computing. These SLM's may be divided into three main categories: reflective (R-SLM), transmissive (T-SLM) and emissive (E-SLM). A review of the best results achieved with present day technology follows.

At MIT's Lincoln Laboratory a new quantum-well optoelectronic switching device for optical information processing known as a Monolithic OptoElectronic Transistor (MOET) has been developed. The device is described in B. Aull, K. Nichols, C. Mehanian, "Quantum well Optoelectronic Switching Devices for Optical Information Processing", 1990 Technical Digest *SPATIAL LIGHT MODULATORS AND APPLICATIONS*, p. 52.

Figure 12:
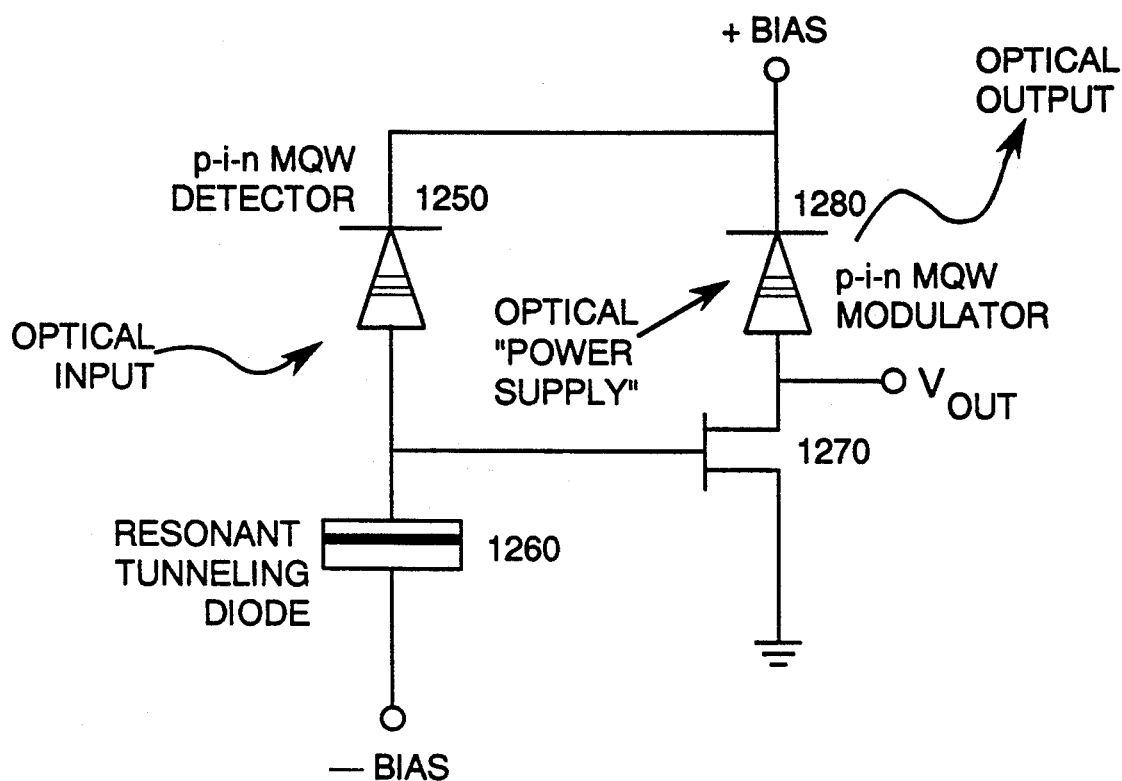
FIG. 12 illustrates a prior art configuration of a MOET (Monolithic OptoElectronic Transistor) device.

When light enters the MOET device shown in FIG. 12 (taken from the above reference), it illuminates a p-i-n multiple-quantum-well (MQW) diode 1250. Generated photocurrent flows through a resonant tunneling diode (RTD) 1260 which is in series with the detector. The RTD 1260 has a region of negative differential resistance in its current-voltage characteristic. When the photocurrent exceeds the peak current of the RTD 1260 the operating voltage of the RTD abruptly increases. This voltage change is amplified by a field effect transistor 1270 and then drives a multi-quantum well modulator 1280 which modulates another light beam to produce an optical output signal.

MOET devices built with discrete components have been tested. Light at a wavelength of 863 nm from an AlGaAs laser was reflected off a MQW reflection modulator with a built-in asymmetric Fabry-Perot cavity. The optical power incident on the modulator was about 1 mW and the reflectivity contrast was about 12 to 1 in the experiment. The optical input power required to drive the optical output is approximately 10 mW. This device has many desirable characteristics: considerable Fan-Out, and possibilities exist to implement logic functions such as negation and more sophisticated functionality. Additionally, it can be monolithically integrated. MOET can serve as an optically modulated R-type or T-type SLM.

There are several drawbacks to using a MOET device for DANE: 1) the p-i-n MQW detector has a significantly higher dark current noise level than does a MSM detector such as that expected to be used in DANE; 2) logic is performed internal to MOET since MOET does not use smart interconnects; and 3) MOET requires an optical power supply. The output is modulated light from the cw power supply, therefore the device is not regenerative. These differences mean that higher power levels, and possibly a different detection scheme than are envisioned for the present invention would need to be used.

Arrays of Symmetric Self-Electro-Optic Effect Devices (S-SEED) with low operating energies and fast switching speeds have been under development at AT&T Bell Laboratories. The device is described in L. Chirovsky et. al., "Batch-Fabricated Symmetric Self-Electro-Optic Effect Device", OSA Proceedings on PHOTONIC SWITCHING, Mar. 1–3, 1989, Salt Lake City, Vol. 3, p. 2., A. Lentine et. al., "Integrated self electro-optic effect device Photonics switching nodes", 1991, Technical Digest PHOTONIC SWITCHING, Mar. 6–8, 1991, Salt Lake City, p. 170, and in L. Chirovsky et. al., "Large arrays of symmetric self electro-optic effect devices", 1991 Technical Digest PHOTONIC SWITCHING, Mar. 6–8, 1991, Salt Lake City.

The concept is to combine photodetectors and quantum well modulators to give an optically controlled device with optical outputs. The fundamental principle of operation of a SEED is as follows: exciton peak absorption at certain wavelengths persists in a multiple quantum well structure even at room temperatures. An externally applied electrical field can significantly modulate this absorption by red-shifting the exciton absorption peak. In a p-i-n diode, sandwiched between a p and n layer, a reverse-bias voltage produces an electric field which controls the intensity of a light beam that passes through the MQWS as well as the magnitude of the photocurrent that is generated. Such a diode, when reverse-biased through a load, can be made into an optically bistable device that is switched by optical signals. This diode and load become a Self Electro-optic Effect Device (SEED).

The Symmetric-SEED (S-SEED) is formed when two such diodes are reverse-biased in series, for example, between ground and a positive voltage. An internal dielectric mirror is fabricated in the S-SEED providing better parameters for a reflective design as opposed to a transmissive. An S-SEED matrix consisting of 128 elements in one 16*8 array has been fabricated and tested. This work has been extended to arrays with 8192 devices (128*64) and 32,768 elements (256*128). Subnanosecond switching times were achieved with the smallest device, however, the switching energy required is several picojoules (pJ), which is three orders of magnitude greater than the DANE element (1.2 fJ). There is currently no evidence that S-SEED power consumption can be reduced by this factor. The S-SEED is an R-type (reflective) SLM.

S-SEED devices are not suitable for DANE because they presently have a Fan-In and Fan-Out capability which is limited to two. This means that multiple devices would have to used to achieve the same results as those desired for DANE. Also, implementing "smart" interconnects would require an additional level of complexity in the architecture as the operation of the multiple S-SEED devices would have to be coordinated.

Several Japanese research programs are making significant progress towards semiconductor arrays of optoelectronic bistable devices and sources for parallel interconnects and computing.

NEC Corporation is developing a Vertical to Surface Transmission Electro-Photonic device (VSTEP). The goal is to develop a functional optical interconnection device which not only has light emission/absorption capabilities, but also includes such functions as thresholding, latching, and optical amplification. A pnpn doped structure with dual gate electrodes exhibits thyristor-like electronic nonlinearity. The ON or OFF state can be determined and memorized either optically or electrically. Switching-off is performed by application of a negative reset pulse to the anode. The device is described in K. Kasahara, I. Ogura, and Y. Yamanaka, "Progress in Arrays of Opto-Electronic Bistable Device and Sources", OPTICAL COMPUTING 1991, Technical Digest, p. 2–4.

In the LED-mode VSTEP, the feasibility of larger-scale integration has been confirmed by successful fabrication of a 1K bit VSTEP matrix, where 32 by 32 pnpn elements are integrated on a semi-insulating GaAs substrate. In the LED-mode VSTEP, poor light output conversion leads to low optical switching speed. Based on this, a laser-mode VSTEP has been fabricated. The device has a pnpn structure with three inserted undoped InGaAs strained quantum wells. Two distributed Bragg reflector mirrors are formed at both ends.

These active layers serve as absorption layers in the OFF state. The switching voltage is 5 V, and he holding voltage is 2.5 V. The reported threshold current was as low as 1.2 mA and the oscillation wavelength was 955 nm. Using two VSTEPs, one as a laser source and the other as an optical switch, cascading as fast as 10 ns write-in time has been successfully demonstrated. This represents two to three orders of magnitude improvement over the experiments with an LED mode VSTEP. The VSTEP implements an E-type (emissive) SLM.

VSTEP devices are not as suitable for DANE as the device proposed for the present invention because: 1) no inversion is possible in a VSTEP electro-photonic device with only photonic amplification; and 2) Fan-In is limited to small numbers due to stringent mode-coupling relationships.

Researchers at Kyoto University of Japan have demonstrated integration of a heterojunction phototransistor (HPT) and a laser diode. Their work is described in S. NODA et. al., "Photonic Switching Device by Integration of Heterojunction Phototransistor and Laser Diode", 1991 Technical Digest PHOTONIC SWITCHING, Mar. 6–8, 1991, Salt Lake City, p. 232.

The switching characteristic of the integrated device exhibited hysteresis loop when the bias voltage was set at 4.35 V and the load resistance was chosen to be 60 ohms. The device was switched with a very low power of approximately 10 nW and was at the ON state in cw operation at room temperature, emitting 1.5 mW. The optical gains reported were as large as $10^5$. This large gain was due to achievement of lasing oscillation and the internal optical feedback from the laser diode to the heterophototransistor. The switching energy was as small as 300 fJ. When the surface area of a HPT is reduced by a mesa etching technique to 50*50 µm², a predicted switching energy less than 10 fJ is expected. This device is an E-type SLM. This is the first photonic switching device featuring a very high sensitivity and a very large gain.

The disadvantage to using a HPT and laser diode device for DANE is that: 1) no inversion is possible with the HPT technology; and 2) the balance of power aspect of the present invention is altered, leading to a less efficient level of power consumption. This is because the gate power requirement of a HPT device would dominate the interconnect structure power requirement.

In summary, there are many projects under development for fast and low energy photonics switch arrays which are close to DANE in many respects:

(1) integrated light detection,
(2) signal amplification, and
(3) integrated 2-D light emission device.

However, none of them combine all of the features which are present in the DANE of the present invention, and more significantly, there is one function of great importance not employed in this work, logical negation. This property of photonics switching elements significantly increases the functionality of optoelectronic digital systems, allowing possibilities for the practical implementation of a competitive free-space global interconnect technology.

Hardware Implementation of a DANE Device

The specific hardware implementation of a DANE device will now be discussed. The approach to fabricating a DANE matrix is an important issue for optical interconnects and optical computing technology.

A number of hardware implementation approaches exist for a DANE design using existing technologies. These can be divided into two categories: H - type (hybrid approach) and M - type (monolithic approach). At this time, it is believed a H-DANE device is technically feasible. Though more desireable, the development of a M-DANE device is still confronted with several significant fabrication problems.

For H-DANE, the surface emitting diode laser matrix on GaAs-substrate and the photodiode matrix (Si or GaAs- basis) can be produced in separate technological processes. Amplification and negation may be implemented by electronics in either GaAs or Si technology. These matrices may be incorporated into DANE using solder bump or other hybrid bonding technologies.

Figure 15A:
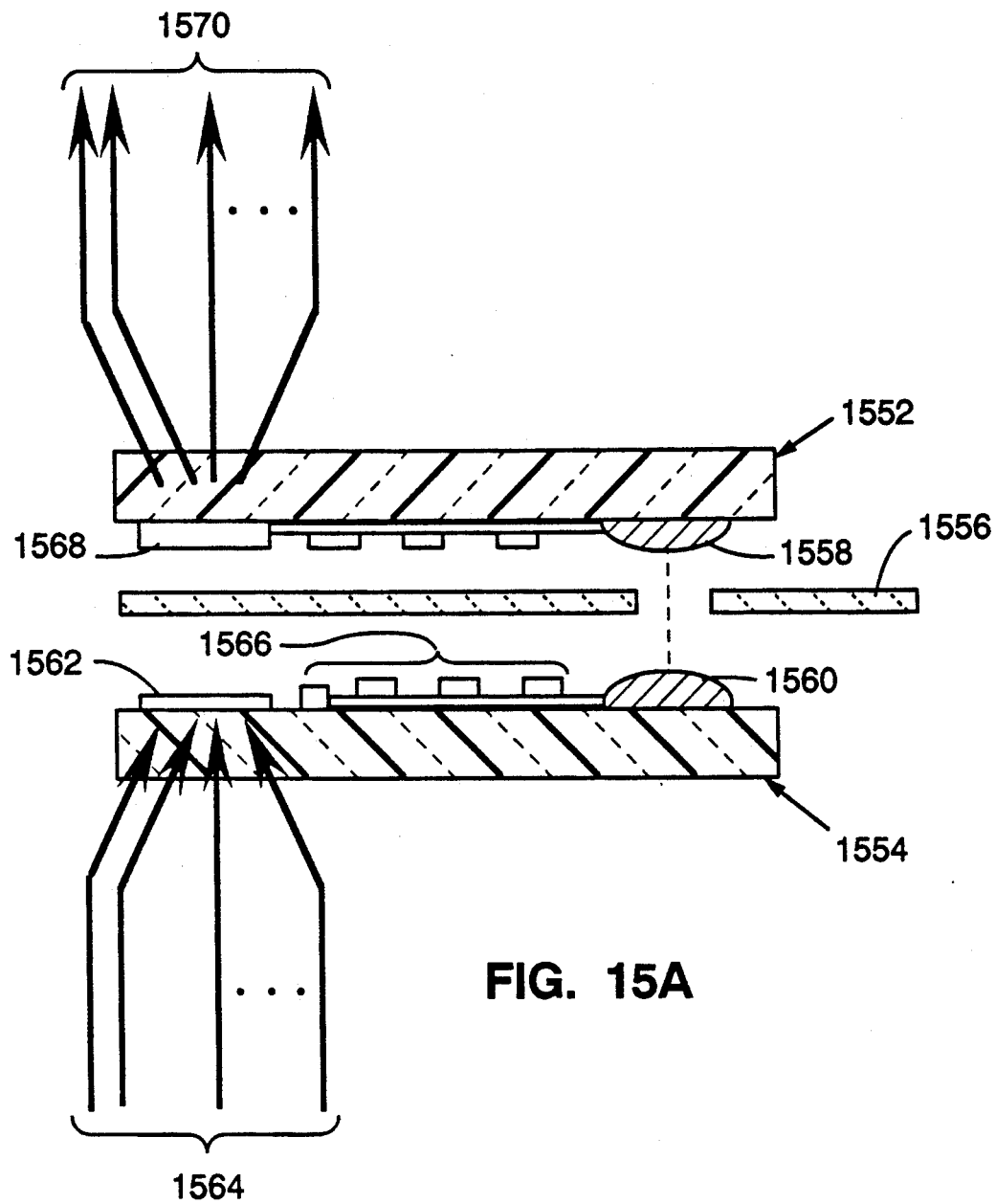
FIG. 15A illustrates the features of a hybrid DANE device constructed using solder bump technology.

Such a hybrid device is shown in FIG. 15A and would be composed of two substrates 1552 and 1554, separated by a light blocking, intermediate material 1556, and connected to each other by means of solder bump technology 1558, 1560. The first substrate 1554 would contain a MSM photodiode detector 1562 to detect the incoming optical signals 1564. It would also contain a semiconductor (GaAs) based amplification and negation stage 1566. A light blocking material such as a ceramic 1556 would provide the required optical isolation between the substrates 1552 and 1554. The second substrate 1552 would contain a laser emission source 1568 to provide an optical output signal 1570 for use in subsequent stages of the architecture.

A laser diode bar produced by Spectra Diode Labs of San Jose, Calif. (Model No. SDL5410-C) is of the type suitable for fabricating a H-DANE device. The Spectra Diode Labs device is designed to produce single mode, high power (>35 mW) output radiation. The laser diode bar incorporates a quantum well structure and a real refractive index, single lasing waveguide. This design provides a high power, low astigmatic, single, stable fundamental spatial and temporal mode $TE_{00}$ spectral output. Each element in the device is spaced 100 microns from center to center. The output radiation is at a wavelength of 0.83 microns. All lasers are single longitudinal mode and mutually incoherent, which is a desireable requirement for DANE. These laser diode bars exhibit on the order of 1 nanometer (nm) of deviation in center wavelength.

For a monolithic device, M-DANE is manufactured on a $A^3B^5$ semiconductor (such as GaAs) in a single technological process, providing a fully integrated solid state device. M-DANE uses surface emitting diode lasers integrated with high-performance electronic devices to produce an optoelectronic integrated circuit (OEIC). It is believed that Metal-semiconductor-metal (MSM) detectors, followed by a high-electron-mobility transistor (HEMT) or a metal-Schottky field-effect transistor (MESFET) are the optimal choices for M-DANE implementation.

As mentioned, there are still several problems which complicate the fabrication of a M-DANE device. These include the processing compatibility of the two-sided structure of the device, the issue of output leakage from the emission stage back to the detector, except when latching is desired, and the integration of a laser output stage with a MSM photodetector.

An H-DANE device should be able to be fabricated from existing technologies. In order to compare H-DANE and M-DANE one needs a strong understanding of the utilized technologies, and some of the issues which may arise are difficult to predict at this time. It is possible, however, to provide a rough system analysis on the basis of power considerations and heat dissipation, and to indicate some common features of both types of devices.

Let $P_{out}$=output power of a diode laser (DL), $P_{in}$=input power to photodiode, $b_1$=diffraction efficiency of the control plane hologram, $b_2$=losses in optics, and N=number of interconnects. Then the incoming power for each DANE photodiode cell will be $P_{in}=P_{out}b_1b_2/N$. The optical gain should be $G=P_{out}/P_{in}$ which equals $N/b_1b_2$.

We may assume that $b_1$ is approximately 0.1, and if we assume a diffraction limited diode laser output beam then, $b_2=1$. For a 32*32 element DANE matrix it will be extremely difficult to exploit all the available interconnects. $N_{available}=1000$ and if we assume that $N_{max}=100$, then the largest needed optical gain $G_{max}=10^3$ (it has been shown previously that the adder algorithm is approximately 10% efficient which supports this assumption).

Let $P_{in}=0.2$ µW, then the maximum diode laser output power $P_{out}=10^3*0.2*10^{-6}W=0.2$ mW. We assume that 30% total efficiency is typical for a good diode laser. Electrical power applied to diode laser is thus $P_e=0.7$ mW. The dissipated power due to the laser part of DANE is $P_d=0.5$ mW. For silicon p-i-n, or MSM, photodiode technology, a responsivity of approximately 0.5 amp/watt is assumed. At 5000 photons per bit (and a 10 ns clock rate) this corresponds to a power level of 0.2 µW (assuming 60% duty cycle). The photocurrent, $i_p=0.5$ A/W *$0.2*10^{-6}$ W=100 nA, is then amplified bu up to $10^4$ (which is the maximum electronic gain required).

It is reasonable to assume that 50% of the heat is generated by the optical part of DANE and 50% of the heat is generated by the electronic part of DANE. When the total dissipated power is limited to $P_T = 1$ W/cm², the number of diode lasers per cm² is limited to approximately $10^3$. The space occupied for one diode laser in DANE should therefore be about 0.1 mm² or 300 μm × 300 μm.

This data may be summarized as follows for a candidate DANE (Detection-Amplification-Negation-Emission) device:

| DANE Specification Characteristic | Specification |
| --- | --- |
| Number of DANE cells | 32 * 32 |
| Optical Gain | 1,000 |
| Electrical Gain | 10,000 |
| Max. Fan-Out | 128 |
| Threshold (detection) | 0.2 μW |
| Gain Characteristic | Limiting 1-bit |
| Min. SNR (after Fan-In) | >13 db |
| Pulse Width | 1.0–10.0 nsec |
| Min. Optical Output Power/Cell | 0.2 mW |
| Max. Power Dissipation/DANE | 1 W/cm² |
| Max. One Cell Size | 0.1 mm² |
| Laser Modulation | RTZ |

The M-DANE device includes a 2-D surface emitting diode laser array as a desired component. Several types of two dimensional surface emitting diode laser arrays have been developed. They may be divided into two categories: (1) arrays of edge emitting horizontal cavity lasers with various types of horizontal to vertical coupling mechanisms, and (2) arrays of vertical cavity emitting diode lasers. In the horizontal cavity structures, a 45 degree deflector or grating is used to deflect the light emission perpendicular to the substrate. In the vertical cavity structure, mirrors are formed with a ¼ wavelength multi-layer superlattice and the laser output is emitted directly through the substrate.

Figure 13:
FIGS. 13($a$), 13($b$), 13($c$), and 13($d$) illustrate potential implementations of (a) a surface emitting laser diode matrix element and, (b-d) edge emitting laser diode matrix elements.
Figure 13:
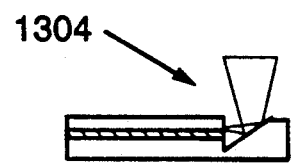
Figure 13:
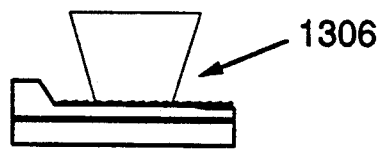
Figure 13:
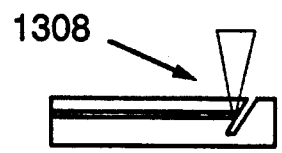

In the horizontal cavity structure, the lasing characteristic and beam quality are similar to those of conventional edge emitting diode lasers except for optical aberration due to the deflecting mirror. Vertical cavity lasers have very small volumes resulting in single mode operation, good spatial and temporal coherency, and low threshold current. Different schemes (vertical cavity 1302, horizontal cavity 1304, 1306, and turn up cavity 1308) for surface emitting diode laser arrays are shown in FIGS. 13(a-d), which depict work being done at Bell Labs (FIG. 13a), MIT-Lincoln Labs (FIGS. 13b,d), and David Sarnoff Labs (FIG. 13c).

Figure 14:
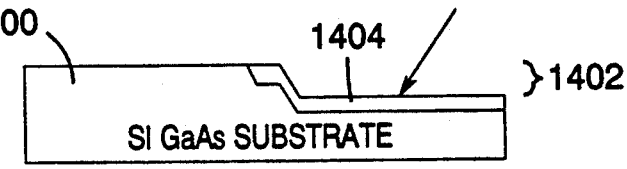
FIGS. 14A–D illustrate the production sequence for a combined MQW (multi-quantum-well) laser and MESFET structure.
Figure 14:
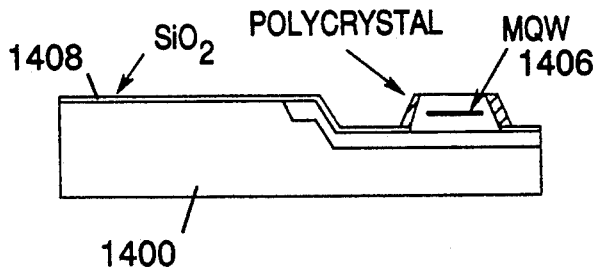
Figure 14:
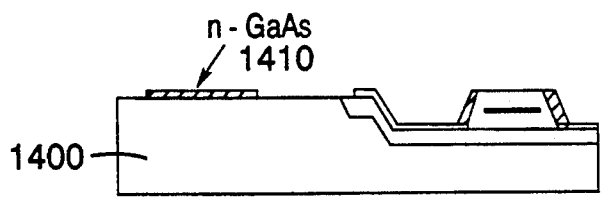
Figure 14:
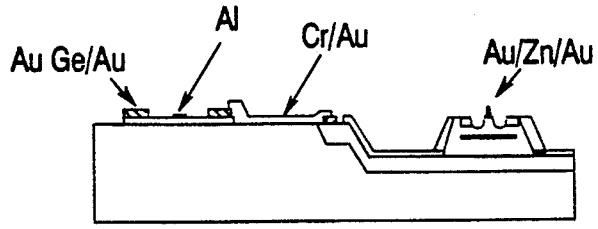

The diode laser arrays are to be integrated with electronic amplifiers and inverters on the same chip. The first GaAlAs/GaAs diode laser was integrated with a transistor as early as 1978. This work is described by Lee C. P., Margalit S., Ury I., and Yariv A., *Appl. Phys. Lett.* 32, 806–807, 1978. The structural complexity and the degree of integration possible are increasing as the technology improves. The production sequence of a multi-quantum-well (MQW) laser with a superlattice structure within the active area and a metal-Schottky field-effect transistor (MESFET) is shown in FIG. 14. The figure was obtained from the article by Wada O., Sakuzai T., and Nakagami T., *IEEE J. Quantum Electronics* QE-22, 805–821, 1986.

Figure 15B:
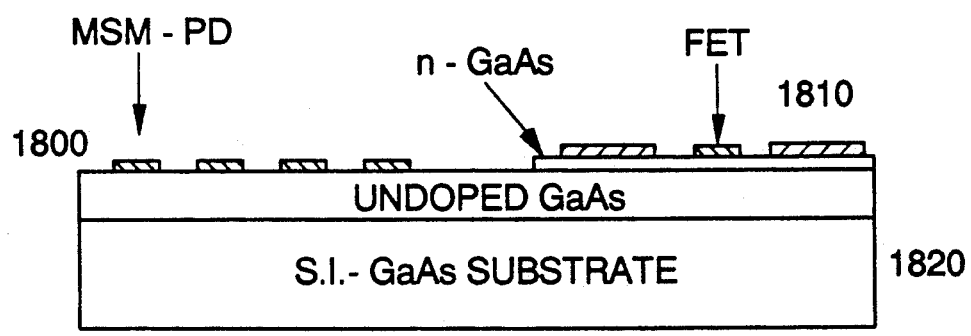
FIG. 15B illustrates a MSM (metal-semiconductor-metal) photodiode array integrated on a GaAs substrate with a MESFET structure.

A physical step 1402 is first etched in the semi-insulated substrate of GaAs 1400 which is then filled with n+ GaAs 1404 in order to produce a contact layer. A MQW heterostructure 1406 is produced through a SiO₂ mask 1408. An n layer 1410 of a field-effect-transistor is then grown. In consecutive steps, wells and contact layers are formed. Integration of surface emitting diode laser arrays with driving electronics is therefore possible on semi-insulating GaAs with the present state of technology. To demonstrate the conceptual feasibility of a fully integrated M-DANE, an example of a metal-semiconductor-metal array of photodiodes 1800 integrated with MESFET 1810 on semi-insulating GaAs 1820 is presented in FIG. 15B, taken from Morozov, "Diode Lasers in Optical Computing" in *Optical Processing and Computing*, Academic Press, 1989, p. 184.

The MSM photodiode detector 1800 is followed by an amplifier 1810 which is based on a MESFET transistor. The MSM photodetectors are simple in design and compatible with FET monolithic technology. MSM detectors have been demonstrated with low dark current (100 pA), low noise (20 fA/Hz$^{-\frac{1}{2}}$), high speed (60 ps rise/fall time) and quantum efficiency of approximately 35%. Such a device is described in C. Jagannath, A. Choudhury, A. Negri G. Elman, and P. Haugsjaa, "High Speed 1.3 μm InGaAs/GaAs metal semiconductor-metal photodetector", *Appl. Phys. Lett.* 58(4), 28 Jan. 1991, pg 325–327.

In conclusion, it is possible to integrate diode lasers with MESFET transistors, to integrate MSM photodetectors with MESFET or HEMT amplifiers, and to manufacture a matrix of surface emitting diode lasers with extremely low thresholds. MESFET and resistor-based electronic circuits are produced by ion implantation. This result was achieved by the Japanese semiconductor industry in 1985.

On the basis of above discussion, the following conclusion can be made: state-of-the-art semiconductor technology makes the realization of M-DANE very realistic, although as indicated, some problems remain regarding the details of the fabrication process. It is believed that these problems can be overcome and that M-DANE is therefore a realizable device.

GaAs and InP semiconductors are possible candidates for a fully integrated M-DANE. Optical computing interconnect concepts, algorithms and architectures are insensitive to wavelength. In the optical sense a key difference between these two semiconductor implementations is the processing light wavelength: approximately 0.8 μm vs. approximately 1.3 μm respectively. All optical and holographic elements have to be appropriately chosen in accordance with the wavelength.

Holographic Optical Interconnect Elements for the Control Plane

A second area of technology important to the invention described in this application is that for the elements of the control plane. Although masks or lens configurations can be used to direct the optical signals from the control plane elements to the detection means of the detector (DANE) planes, the full benefits of the augmentation of the combined electronic and optical technologies can be realized by the use of holographic optical interconnect elements to perform the free space global interconnect (smart interconnects).

The present invention envisions the use of holographic optical interconnect elements (HOIE) to selectively image the optical signals from each laser diode element on the DANE's surface emitting laser diode array in free space to predetermined positions in the photodetector plane of the next DANE in accordance with the minterms and/or switching function to be formed. This implements the interconnection pattern between source plane and detector plane. As mentioned, the alternative to the use of HOIEs is the geometric implementation of direct imaging of micro control masks using well established optical imaging technology.

The HOIEs for optical interconnects should have the following properties, as discussed in L. Wang, "Efficient multiple-image holographic optical element", *Optical Engineering*, March 1990, Vol. 29, No. 3, p. 257: 1) high efficiency (thus maximizing diode laser output power, 2) uniformity of energy distribution over the multiple reconstructed beam, 3) high space bandwidth product (the capability to form accurately positioned spots with diameters 50–100 $\mu$m and accuracies of less than 10 $\mu$m), 4) translational invariance (should have a reasonable misalignment tolerance with respect to image displacement), 5) wavelength stability (must have a reasonable tolerance to wavelength fluctuations caused by temporal intensity fluctuation of diode lasers or from laser diode mode shifts due to temperature), and 6) High SNR (to provide satisfactory high signal to noise ratio on the input of the next stage).

There are several recording materials and recording techniques that have been previously developed that are believed to be suitable for the control plane elements. The choice of recording materials is critical to obtain the desired properties for free space global interconnects using holograms.

For example, the main requirements for the holograms for the one clock look ahead carry 64-bit adder to be described herein can be formulated. In this adder the maximal Fan-Out value is $n(n+1)/2$, i.e., the hologram has to form approximately 2080 equal intensity beams. However, the Fan-Out does not govern the required contrast ratio of the hologram or the photodetector. calculation occurs on the P(64,64) photodetector where the maximum Fan-In is 64. In this example, this occurs when cell the is illuminated with 63 false bits and only one true bit. Define intensity in the on state as $I_{on}$ and intensity in off state as $I_{off}$. Then the contrast ratio of the image as reconstructed from the hologram can be defined as the power ratio $I_{on}/I_{off}$.

All of the $I_{off}$ states are summed on the detector. The detection threshold requirement is such that the threshold level must be greater than the sum of the off states. Therefore, considering the worst case example under discussion, the contrast ratio of the hologram ($CR_{HOIE}$) should be more than Fan-In * $SNR_{BER}$, i.e., Fan-In * $SNR_{BER} < CR_{HOIE}$. $SNR_{BER}$ is defined here as the signal to noise ratio required for adequate bit error rate considerations. $CR_{HOIE}$ must exceed 64*25:1. In general, the Fan-In will not exceed the data word length and therefore, the hologram should not require a contrast ratio in excess of a few thousand to one. This number is consistent with the accuracy achievable in high performance optics.

The dominant noise source for the $I_{off}$ state is light scattered from all locations from its associated hologram. In addition, there are multiple holograms under simultaneous reconstruction as well, one for each data bit. This scattered light produces a background noise signal on the DANE photodetector plane. The extent of this noise is dependent on the S coefficient of the holographic material, the scattered light intensity spectral density (cm$^2$). This is described in H. Smith, "Light Scattering in Photographic Materials for Holography", *Appl. Opt.* 1972, VII, N1, p. 26. The contrast ratio of a given single hologram for one input data laser can be estimated as follows where:

P—incident laser power (Watts)
$\beta$—diffraction efficiency of hologram (%)
$M^2$—number of bits in the hologram
$l^2$—the area of photodetection cell, then the power density (W/cm$^2$) on the photodetector will be:

$$I_S = \frac{\beta P}{M^2 l^2} \quad (27)$$

The power density for the scattered light is:

$$I_n = \frac{PS}{(\lambda F)^2} \quad (28)$$

where
F—focal length of optical system,
S—coefficient—scattered light intensity spectral density (cm$^2$).

As a physical example, consider standard 649F holographic film. Assume $A = l^2 = 1$ cm$^2$, a wavelength of 1 $\mu$m, $\beta$ is approximately $10^{-1}$ (diffraction efficiency) and S is approximately $10^{-11}$cm$^2$ for "KODAK 649F" (or "KODAKHRP") photoplate. After calculation, $CR_{HOIE}$ is approximately $10^2$. The maximum contrast ratio obtainable with this media is about 100:1 for 10% diffraction efficiency. Note if more than one hologram is used, i.e., for more data inputs, this contrast ratio would allow insufficient margin to maintain a sufficient BER.

The noise is additive in the mean. When reconstructing multiple holograms the noise increases proportionally with the number of holograms. The noise is a result of light scattering on photoplate grains. It therefore follows that a photosensitive media with extremely low scattered light levels should be used to make holograms to implement high numbers of free space global smart interconnects.

Fortunately, there is a wide class of materials with very low scattered light levels that can be used to record holograms including dichromated gelatin, some classes of photoresists, photopolymers and photochromic materials (but excluding silver halide emulsions). Dichromated gelatin, for example has a scattering coefficient $S < 0.02 \times 10^{-11}$cm$^2$ which means that a contrast ratio CR of approximately 100 might be achieved for a 64 hologram (where each hologram has 64$\times$64 bits recorded) free space global interconnect. This design meets all BER requirements. The holographic approach is therefore reasonable.

It follows from diffraction theory that the minimum hologram diameter required to record 32 * 32 bits could be rather small. The space-bandwidth product of a square hologram of size d*d is the product $G = (n_o d)^2$, where $n_o$ is the highest spatial frequency in the hologram. If we assume $n_o = 200$ lines/mm (200 lp/mm is the Nyquist limit), then the corresponding angle between object and reference planar beams becomes 11.5° at a wavelength of approximately 1 $\mu$m. The size of hologram has been assumed to be d = 320 $\mu$m.

To further decrease crosstalk from adjacent spots the hologram can be recorded at a higher sampling frequency (angle) and correspondingly faster f-number. For example, if we increase the carrier to 600 lp/mm, while decreasing the recording f-number by a factor of 3, then the crosstalk will be decreased to 20.65 db from 10.5 db. The reconstructed image effectively "sharpens up." At 1000 lp/mm this side lobe interference is reduced sufficiently to handle higher Fan-In's.

The general approach to producing holographic control elements is presented next. The process first involves generating the masks for the desired interconnect structure. Then a 2-dimensional Fourier transform is made of the masks. The transform data is then placed on a carrier signal of frequency equal to two times the Nyquist frequency.

The resulting data is a 2-dimensional array of numbers where each number represents a gray-scale value for a location on the control element. The array is used to produce a holographic film by means of electron-beam lithography, or a similar process. The holographic film then becomes the control plane for the architecture.

In this way any desired instruction set can be represented in the elements of the control plane, allowing the production of the desired logic function as the output. For instance, a RISC (reduced instruction set computer) instruction set could be generated which would implement the desired logical operations for the architecture. It is also envisioned that each control plane element could consist of multiple holograms, with each hologram responsive to a different frequency of light. In that way multiple instruction sets could be implemented by the control plane, with the selection mechanism being the light frequency used to illuminate the control plane.

A means of using holographic elements as the basis for an interconnect system is described in U.S. Pat. No. 5,056,039, "Holographic Interconnect System", issued Oct. 8, 1991 to H. John Caulfield. The patent teaches a general methodology for interconnecting a planar input array and a planar output array by means of a holographic planar array situated between the input and output arrays. It is believed that the disclosure of the '039 Pat. finds its roots in work previously done and reported by one of the inventors of the subject application.

Now that the design and engineering aspects of the present invention have been discussed, further examples are presented to indicate the full power and benefits of the approach. Some of these examples can serve as elements from which other, more complicated applications can be constructed.

64-Bit Addition Example: Free Space Global Interconnect Architecture For Wide Words The architecture for the 5-bit adder can be expanded to an arbitrary width. In a 64-bit addition algorithm, the general expression for the carry is:

$$C_0 = G_0$$
$$C_1 = G_1 + G_0 P_1 \quad (29)$$

General Expression for lookhead carry $$C_2 = G_2 + G_1 P_2 + G_0 P_1 P_2$$
$$C_3 = G_3 + G_2 P_3 + G_1 P_2 P_3 + G_0 P_1 P_2 P_3$$
$$\vdots$$
$$C_{i-1} = G_{i-1} + G_{i-2} P_{i-1} + G_{i-3} P_{i-2} P_{i-1} + \ldots +$$

-continued $$C_i = G_i + G_{i-1} P_i + G_{i-2} P_{i-1} P_i + \ldots + G_0 P_1 P_2 \ldots P_{i-1}$$
$$C_{i+1} = G_{i+1} + G_i P_{i+1} + G_{i-1} P_i P_{i+1} + \ldots + G_2 P_3 P_4 \ldots P_{i+1} + G_1 P_2 P_3 \ldots P_{i+1} + G_0 P_1 P_2 \ldots P_{i+1}$$

Figure 16:
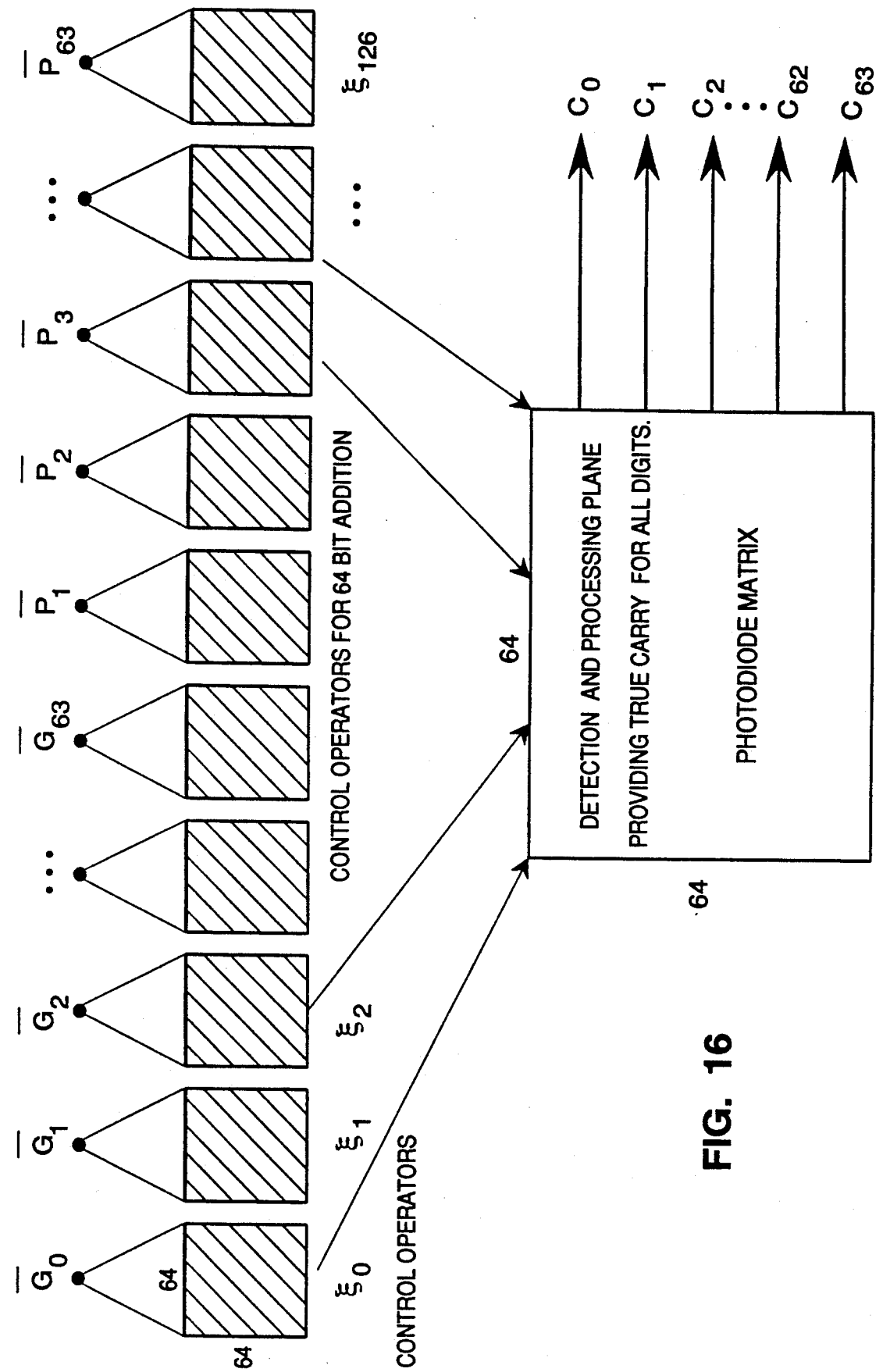
FIG. 16 illustrates a global free space digital optical computation scheme for a 64-bit look-ahead carry.

These expressions are calculated using 127 laser diodes, 127 64×64 element control masks or holograms and a single 64×64 element photodiode array. Examples of wide word addition are provided in FIGS. 16 and 17. FIG. 16 is simply the expansion of the architecture of FIG. 7 to the 64-bit case.

Figure 17:
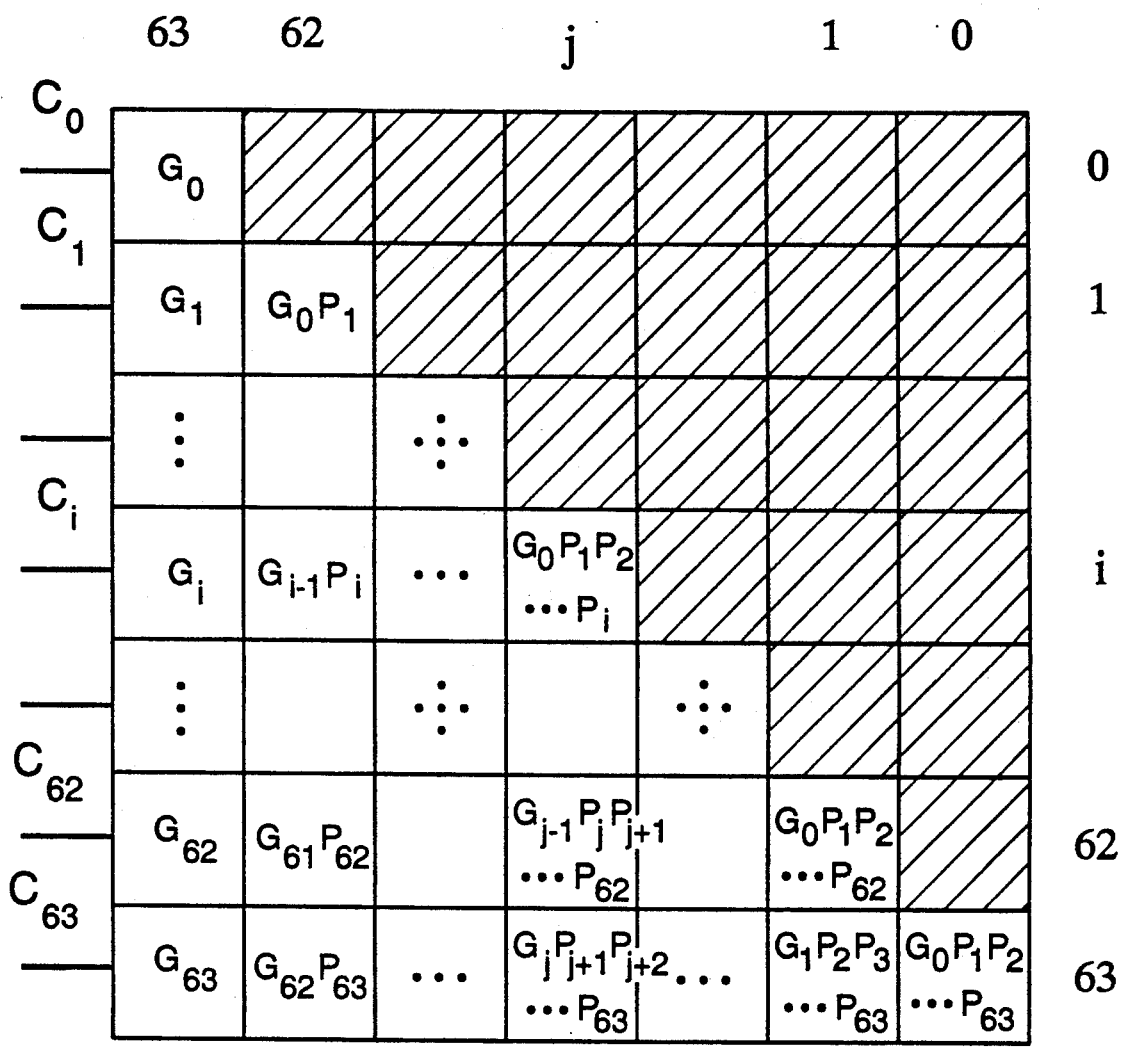
FIG. 17 illustrates the combinatorial functionals (minterms) generated after negation in each cell of a photodiode matrix for a 64-bit look-ahead carry computation.

In FIG. 17, a true carry for each digit is obtained by true electrical ORing in the photodiode matrix 1100. The minterms generated after the negation operation are shown for each cell of the photodiode matrix 1100. In wide word algorithms it is extremely important that the signal to noise ratio allows a total Fan-In of 64 or more per detection element. The required Fan-In increases linearly with the number of bits in a single level look-ahead carry. Wide word arithmetic addition can also be realized using additional logic levels. Consequently, the need for additional logic levels is dependent on the Fan-In capabilities of the hardware.

Figure 18:
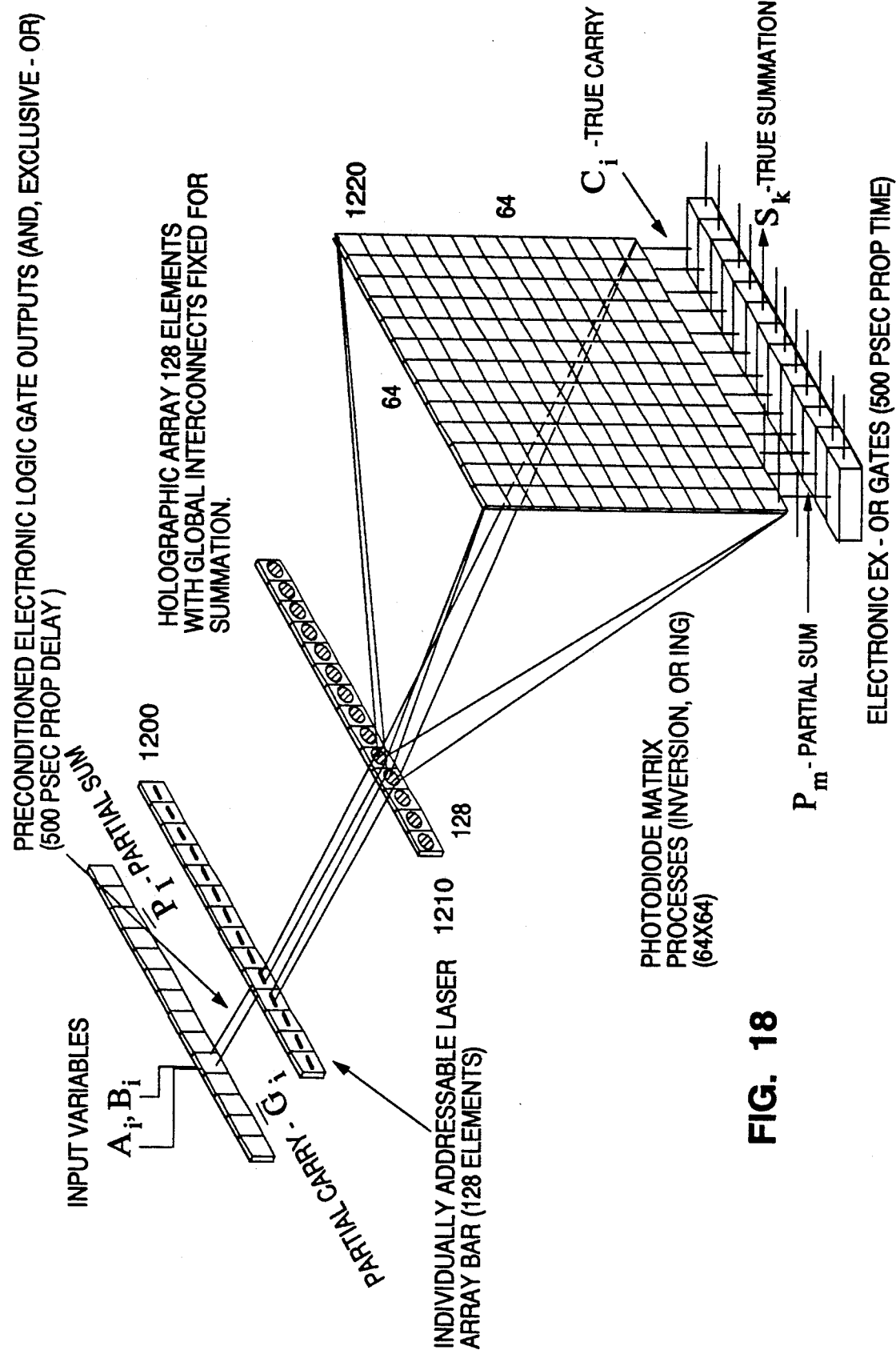
FIG. 18 illustrates an integrated optical-GaAs hardware architecture for a single clock 64-bit addition computation based on free space global interconnects.

FIG. 18 demonstrates an example of 64-bit addition using global optical interconnects with individually addressable diode laser bars 1200, a hologram array 1210 and a photodiode matrix 1220. Pre- and post-conditioning electronics are used for regular simple operations like two-input exclusive OR's on each bit. A row of Fourier holograms 1210 is also utilized for signal beam redirection or control mask encoding.

In the 2-dimensional (2D) matrix configuration, as illustrated in FIG. 18, individually addressed surface emitting diode lasers 1200 are combined with holographic optical interconnect elements (HOIE) 1210 and a 64-bit single clock Look Ahead Carry adder (LAC) with folded global smart optical interconnects.

Figure 19:
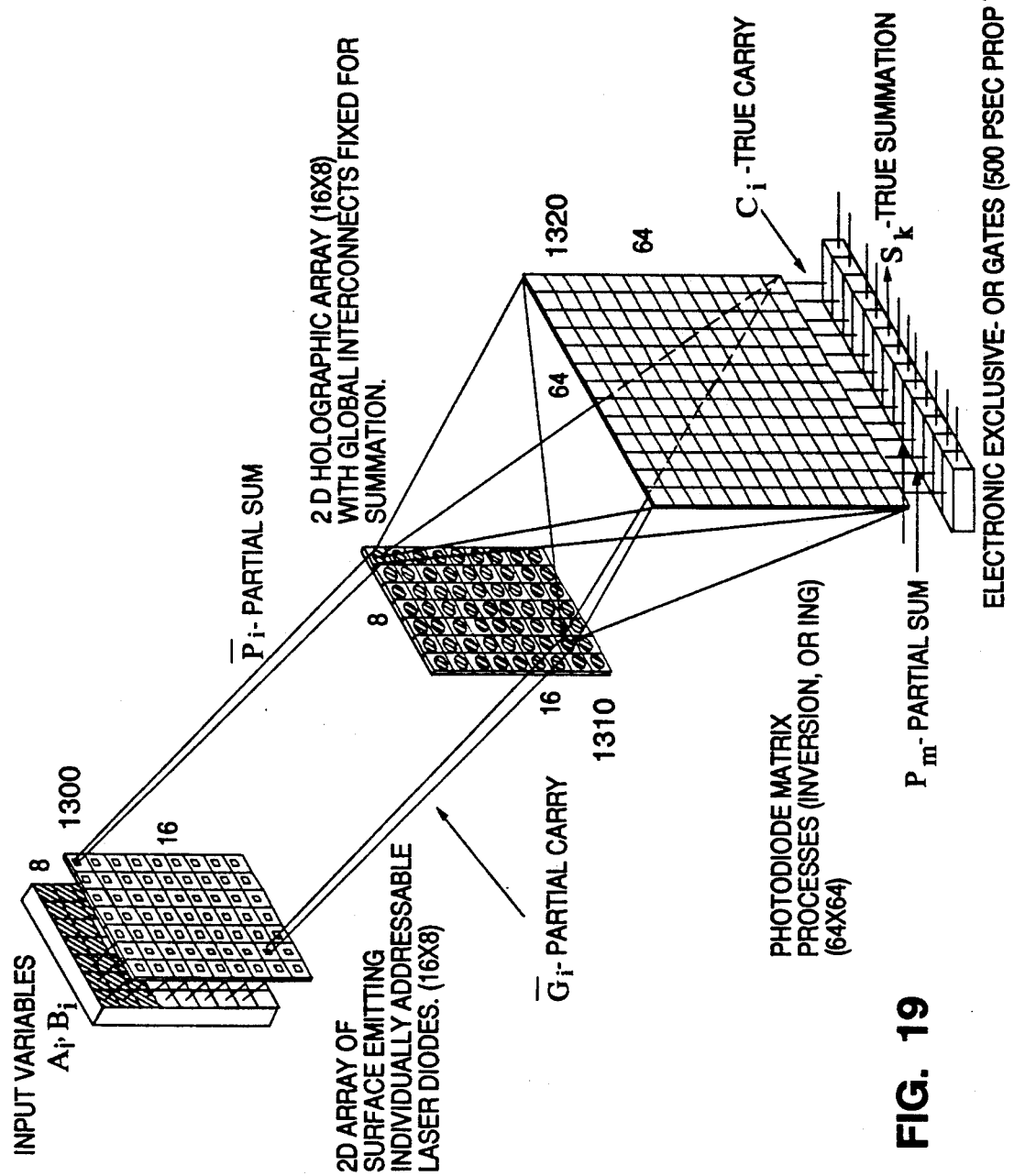
FIG. 19 illustrates a folded global optical interconnect scheme for a single clock 64-bit addition computation.

FIG. 19 shows a folded global smart optical interconnect architecture for the single clock 64-bit addition computation of FIG. 18. In order to implement the scheme shown in FIG. 19, the following parameters are needed: a 2-D (8×16) surface emitting laser diode matrix array 1300, a 2-D matrix of Fourier holograms (8×16) 1310 for control mask encoding and a 2-D processing matrix of photodetectors (64×64) 1320 Global free space optical interconnects can be configured for 2 level execution of a N-bit wide word addition given sufficient Fan-In margins.

The advantages of utilizing global interconnects becomes apparent when the algorithmic efficiency and projected gate interconnect bandwidth products (GIBP) obtainable are examined.

The following table demonstrates the interconnect efficiency for one clock wide word addition. Efficiency is calculated as the number of interconnects used divided by the total number available for use. A one corresponds to a used interconnect; a zero to a possible interconnect that the algorithm never uses.

| Bits | Total 1's | Total 1's and 0's | Efficiency |
|---|---|---|---|
| 1 | 4 | 12 | 33.33 |
| 2 | 10 | 45 | 22.22% |
| 3 | 20 | 112 | 17.86% |
| 12 | 455 | 4225 | 10.77% |
| 16 | 969 | 9537 | 10.16% |
| 24 | 2925 | 30625 | 9.55% |

-continued

| Bits | Total 1's | Total 1's and 0's | Efficiency |
|---|---|---|---|
| 32 | 6545 | 70785 | 9.25% |
| 64 | 47905 | 545025 | 8.79% |

Figure 20:
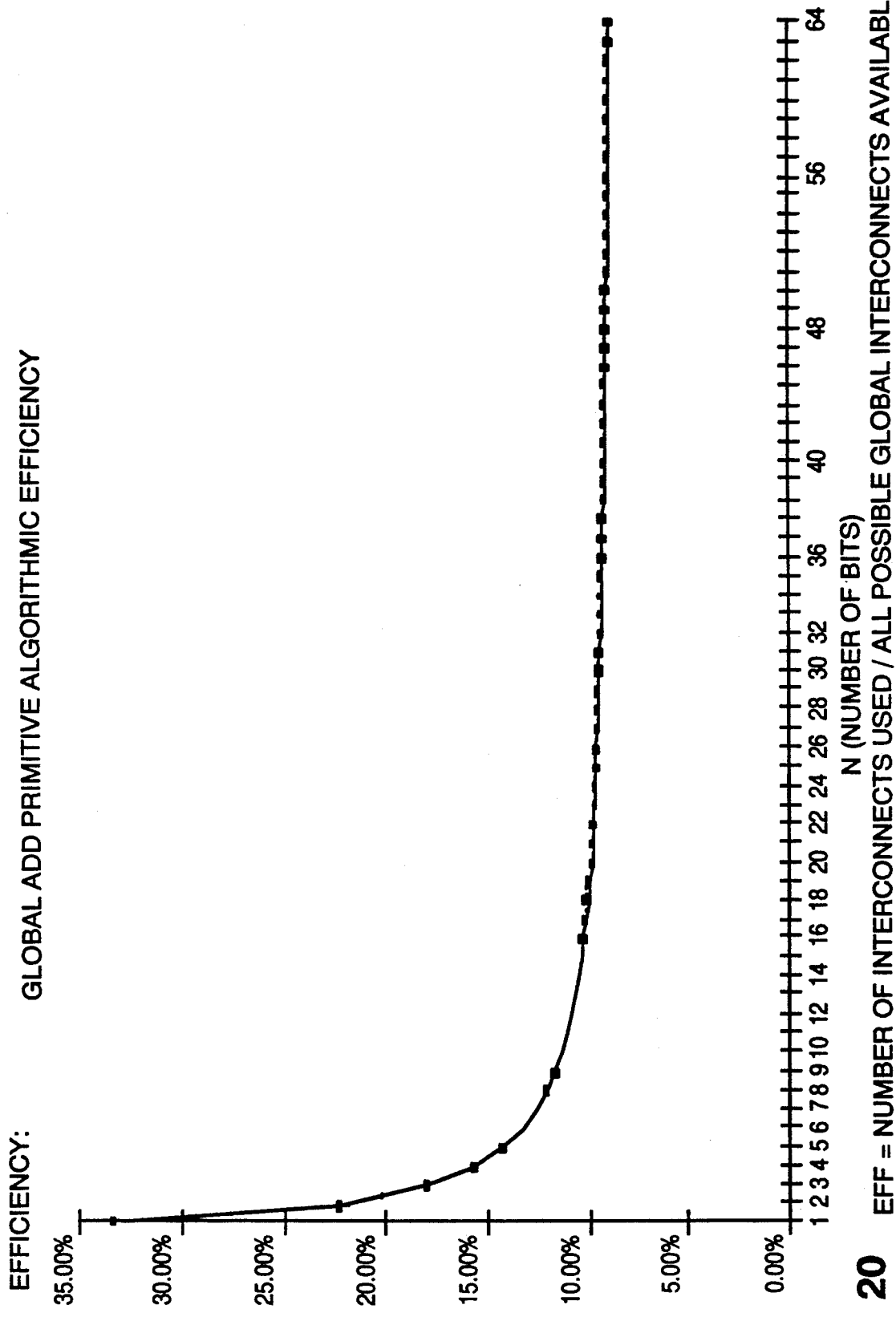
FIG. 20 is a graph showing the global ADD primitive algorithmic efficiency vs. word length.

The gradual reduction of efficiency as a function of word width indicates that the global interconnect architecture has significant merit for extremely wide word processing. The values in the above table, expressed as the algorithmic efficiency as a function of the number of bits are plotted in FIG. 20.

The total gate interconnect is 47,905 for the 64-bit addition implementation. If a 5 nsec clock is used, the gate interconnect bandwidth product (GIBP) will be $9.58 \times 10^{12}$. Since the photodiode arrays allow an optical signal power per bit of 5000 photons, which corresponds to 1.2 fJoules per gate, theoretical optical signal power consumption at $10^{13}$ GIBP is only 12 mW at 100% efficiency, assuming all power is deflected into the interconnects. If the 8.79% efficiency factor calculated for 64-bit addition is not leveraged, i.e. zeros are uniformly illuminated along with the ones, then the power consumption increases to 136 mW. Total system power including DANE amplifier power should be no more than a factor of 10 above the total optical emission power. Thus, the 64-bit adder should be practical at 1.5 W total power dissipation. Typical best silicon gates operate at 2 pJoule which would correspond to a power consumption of 20 watts at a GIBP of $10^{13}$.

These numbers dramatically point out the efficiency and lower power consumption achievable by the present invention. A simpler, more efficient architecture is possible by using the optical interconnect scheme as opposed to a purely semiconductor based design. These benefits make the present invention suitable for implementing algorithms and computational processors which would not be as fast or efficient if based on GaAs technology alone.

3:8 Mux Decoder Example

This application is an example of "chip-to-chip", or multi-chip-module to multi-chip-module optical BUS-ing using "smart" global free space interconnects for signal/data routing and communication.

Figure 21:
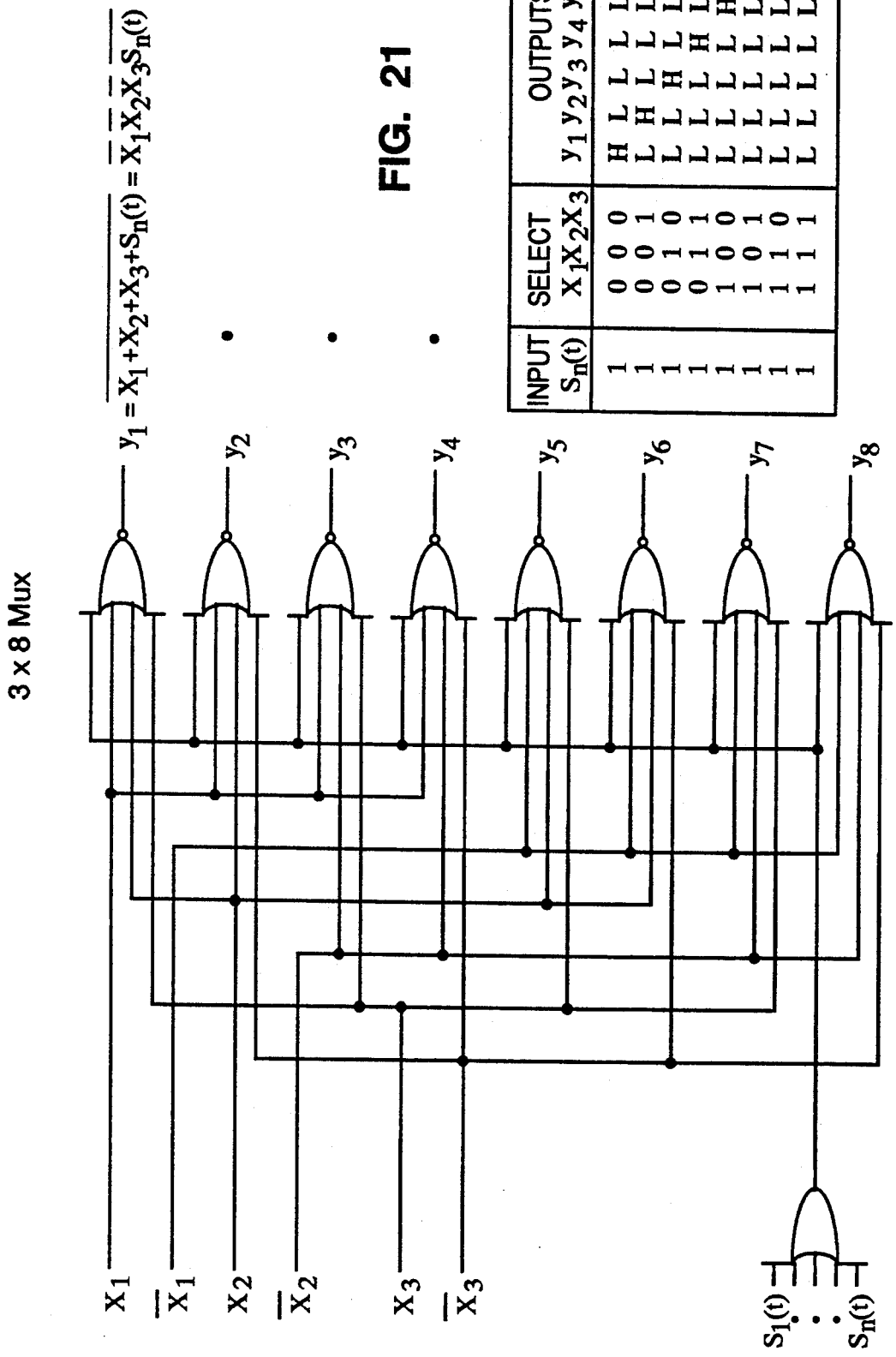
FIG. 21 illustrates an electronic representation of a 3:8 MUX or, data router.

The digital multiplexer circuit shown in FIG. 21 has a 3 bit address field input represented in dual rail format, i.e., $x_1$, $x_2$, and $x_3$, and their complements. The circuit has eight outputs: $y_1$ through $y_8$. The circuit is used to route a signal $s_n(t)$ to a given location. As the truth table in FIG. 21 shows, the signal goes to one of eight locations depending on the address.

Figure 22:
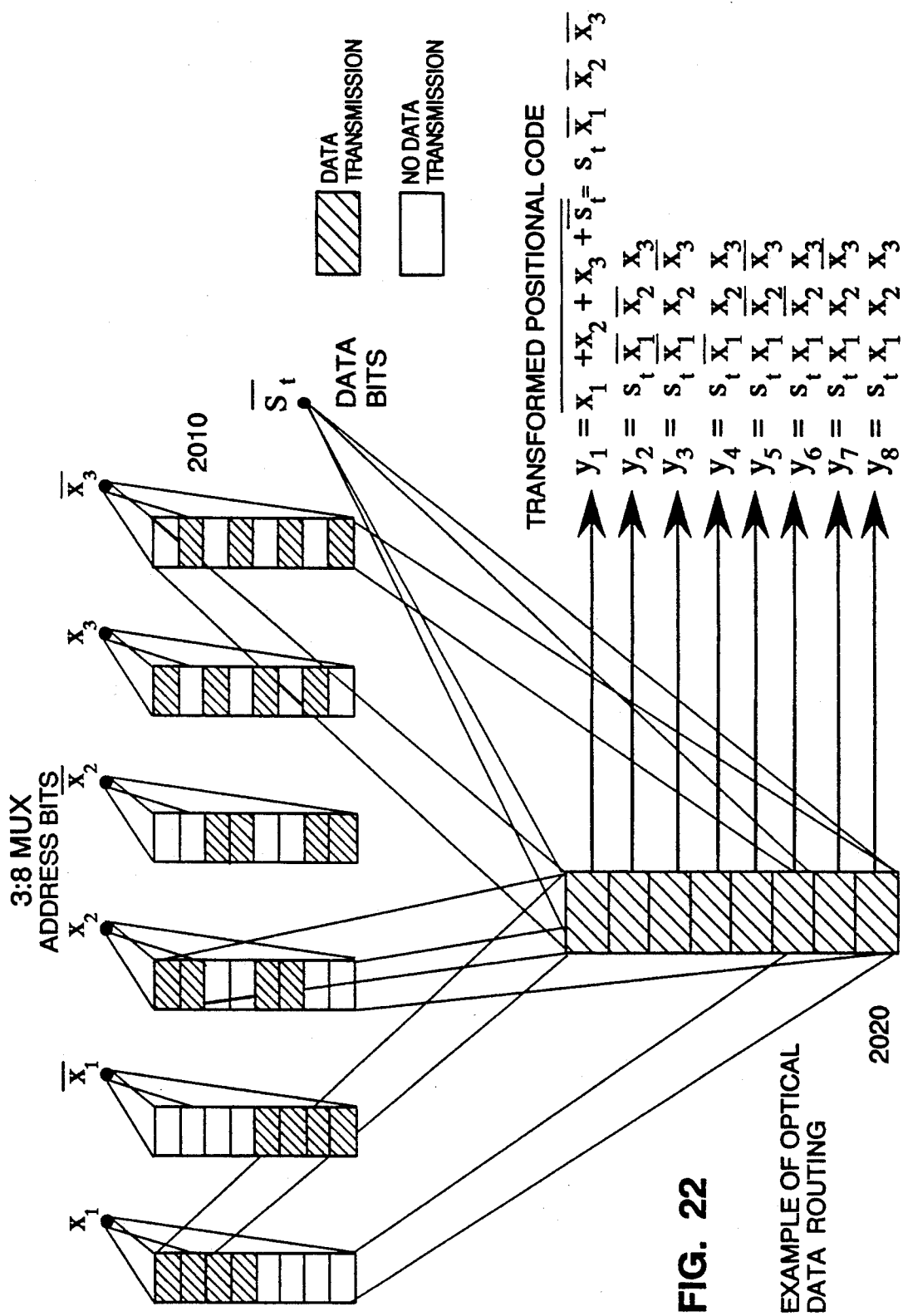
FIG. 22 illustrates an optical architecture for the 3:8 MUX of FIG. 21 which uses free space data routing.

The circuit can be realized using global free space smart optical interconnects at an efficiency of 50% as shown in FIG. 22. Its efficiency is the ratio of the total number of interconnects available divided into the total number of interconnects used. All optical decoders of this type or higher level (4:16, 5:32, 6:64, n:$2^n$, 32:4,294,967,296 etc.) are 50% efficient.

FIG. 22 shows the global configuration. Six laser diodes (not shown) are modulated by the address field, $x_1$, $x_2$, $x_3$, and their complements. The output radiation from each diode illuminates a fixed mask 2010. Each mask 2010 is subsequently imaged onto a detector array, in this case a linear detector array 2020. By imaged we mean that each pixel of the mask is projected exactly to each pixel on the detector. In this case the Fan-In on the detector from the address generator is exactly six. One can also define the efficiency of the system by the percentage of transmitting elements in the control mask that transmit, which in this case is 50%. The data bits $s_n(t)$ also "flood" illuminate the detector, i.e., its mask has all ones.

Each detector 2020 now sees seven inputs. Suppose it was desired to send the signal to the 4th detector only. Then the address 1,0,0 would be sent to the address input. This would cause $x_1$ to be on, $\bar{x}_1$ to be off, $x_2$ to be off, $\bar{x}_2$ to be on, $x_3$ to be off, and $\bar{x}_3$ to be on. Upon close examination one can see that under this condition no light is incident on detector number 4, whereas every other detector has light incident upon it. A "zero" or a no light condition is literally projected onto the detector that one wishes to send the signal to. Consequently, after inversion, all detector channels except channel 4 go to zero, and $s_n(t)$ is routed through channel 4 only. The interconnects are consequently "smart."

Figure 23:
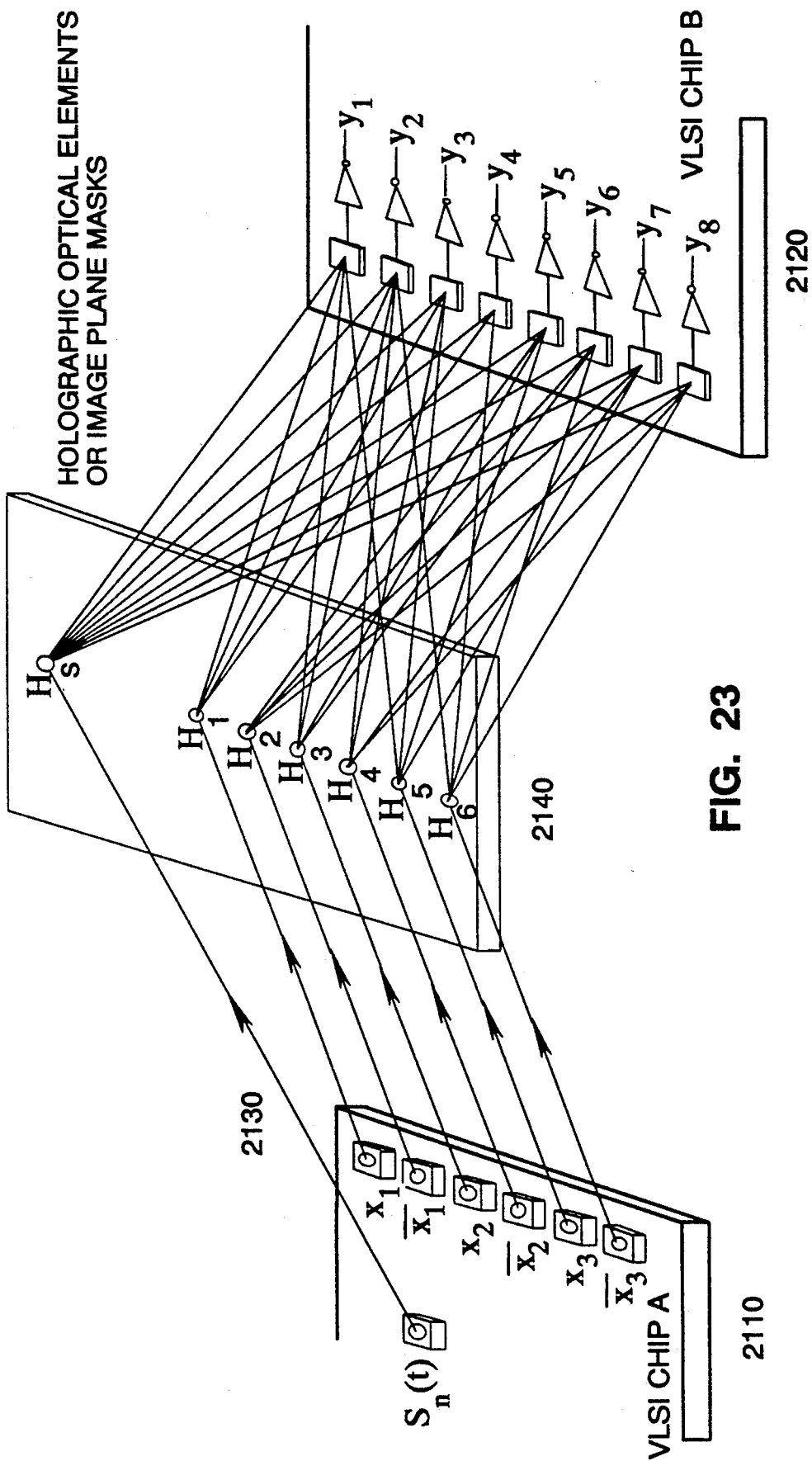
FIG. 23 illustrates an optical architecture for the 3:8 MUX of FIG. 21 which uses "smart" chip-to-chip level interconnects combined with an optical bus.

As shown in FIG. 23, smart interconnects may be applied to the chip-to-chip level communication problem. Optical VLSI chip-to-chip level interconnects have been suggested by several authors (such as Goodman, J., "Optics as an Interconnect Technology," Ch. 1, *Optical Processing and Computing*, Ed H. Arsenault et. al, Academic Press, Inc 1989) for the purpose of clock distribution and point to point data transmission. We refer to this type of interconnect as "dumb", i.e. unity Fan-In, or no application of DeMorgan's law to non-unity Fan-In. However, here the interconnects are computing.

For example, FIG. 23 depicts the data routing of an arbitrary data from VLSI Chip A 2110 to VLSI Chip B 2120 by simple address application to the laser diode array 2130 on Chip A. Previous schemes would require changing the masks for fixed point to point interconnect. Here the mask doesn't need to be changed and yet one can still route the data (Fourier transform reflective holograms 2140 have been introduced for the mask implementation).

Binary Full Adder Example

The Boolean equations for binary full addition of S of P (sum of products) form are shown in equations 30 and 31. Here the two data bits to be added are $x_1$ and $x_2$ and the carry input bit is $x_3$.

$$C = x_1 x_2 + x_1 x_3 + x_2 x_3 \tag{30}$$

$$S = \overline{x_1}\overline{x_2}x_3 + \overline{x_1}x_2\overline{x_3} + x_1\overline{x_2}\overline{x_3} + x_1 x_2 x_3 \tag{31}$$

Figure 24:
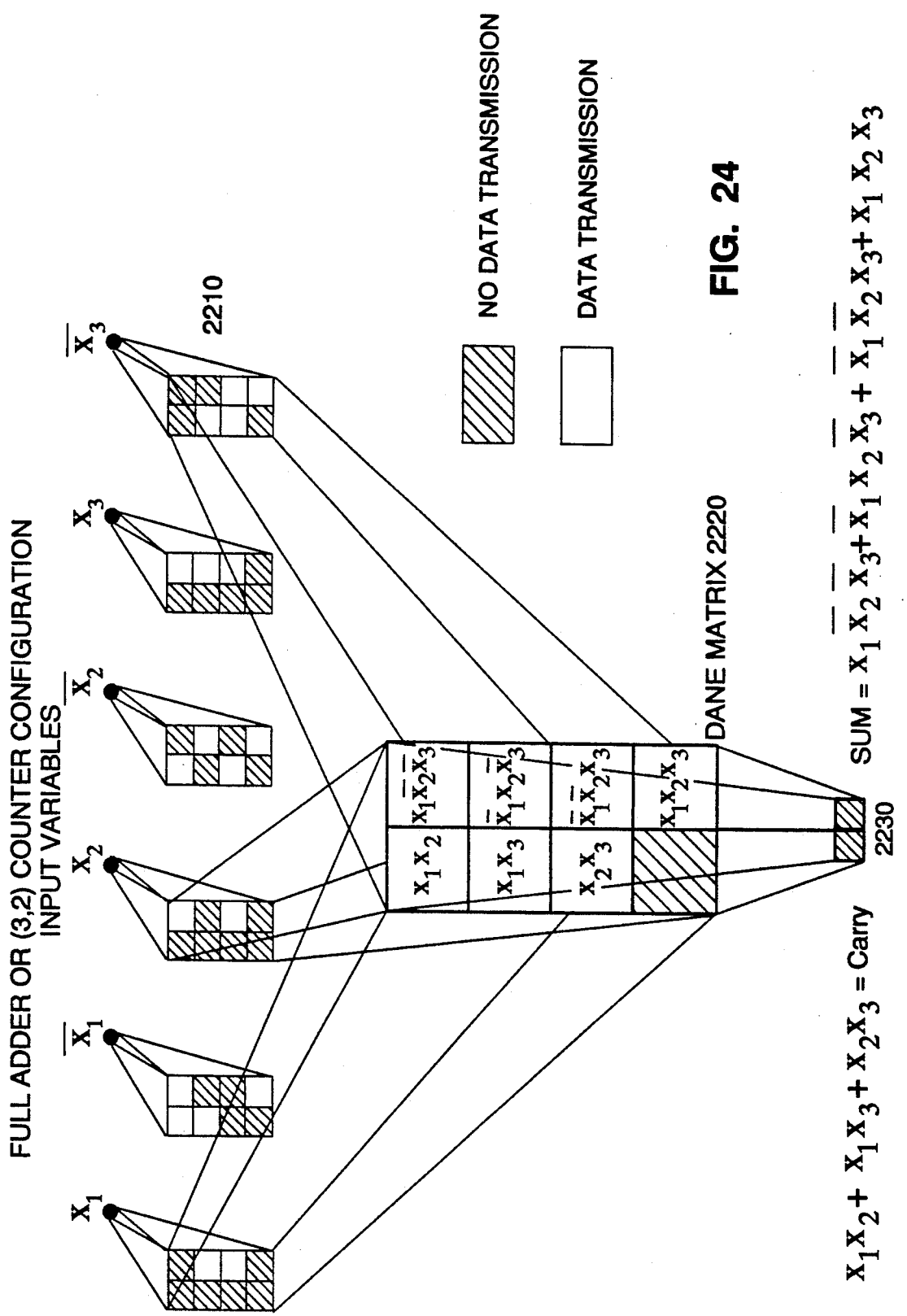
FIG. 24 illustrates an optical architecture for a binary full adder.

In FIG. 24, these equations for the binary full adder are realized within the same global free space architecture by simply re-programming the mask function. To realize a full adder, three dual rail inputs illuminate independent masks 2210 which are imaged onto an eight element DANE matrix 2220. The DANE output is summed using a cylindrical lens or part of a hologram (not shown) onto a two element detector 2230 where both the Sum and Carry results are obtained.

Figure 25:
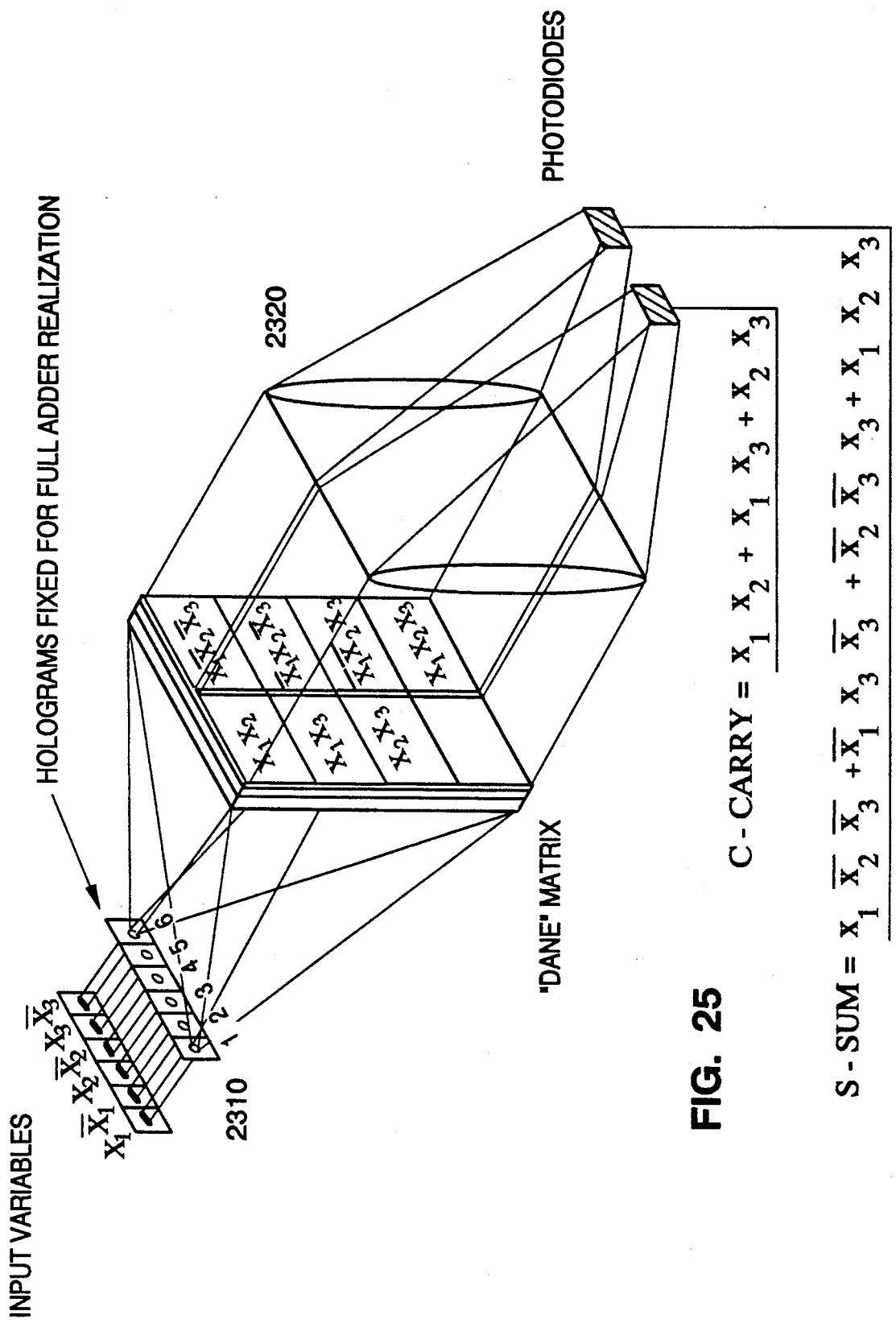
FIG. 25 illustrates a global optical free space interconnect architecture for a full adder based on a (3,2) counter.

As shown in FIG. 25, these masks may be converted to Fourier transform holographic elements 2310 to maintain translational invariance for the hardware implementation. The inverse Fourier transform lens 2320 may actually be combined with the Fourier transform hologram of the program mask image so that the hologram not only contains the control tensor but also the fixed free space interconnect pattern.

IEEE Standard 754 Double Precision Floating Point Multiplication Example

Figure 26:
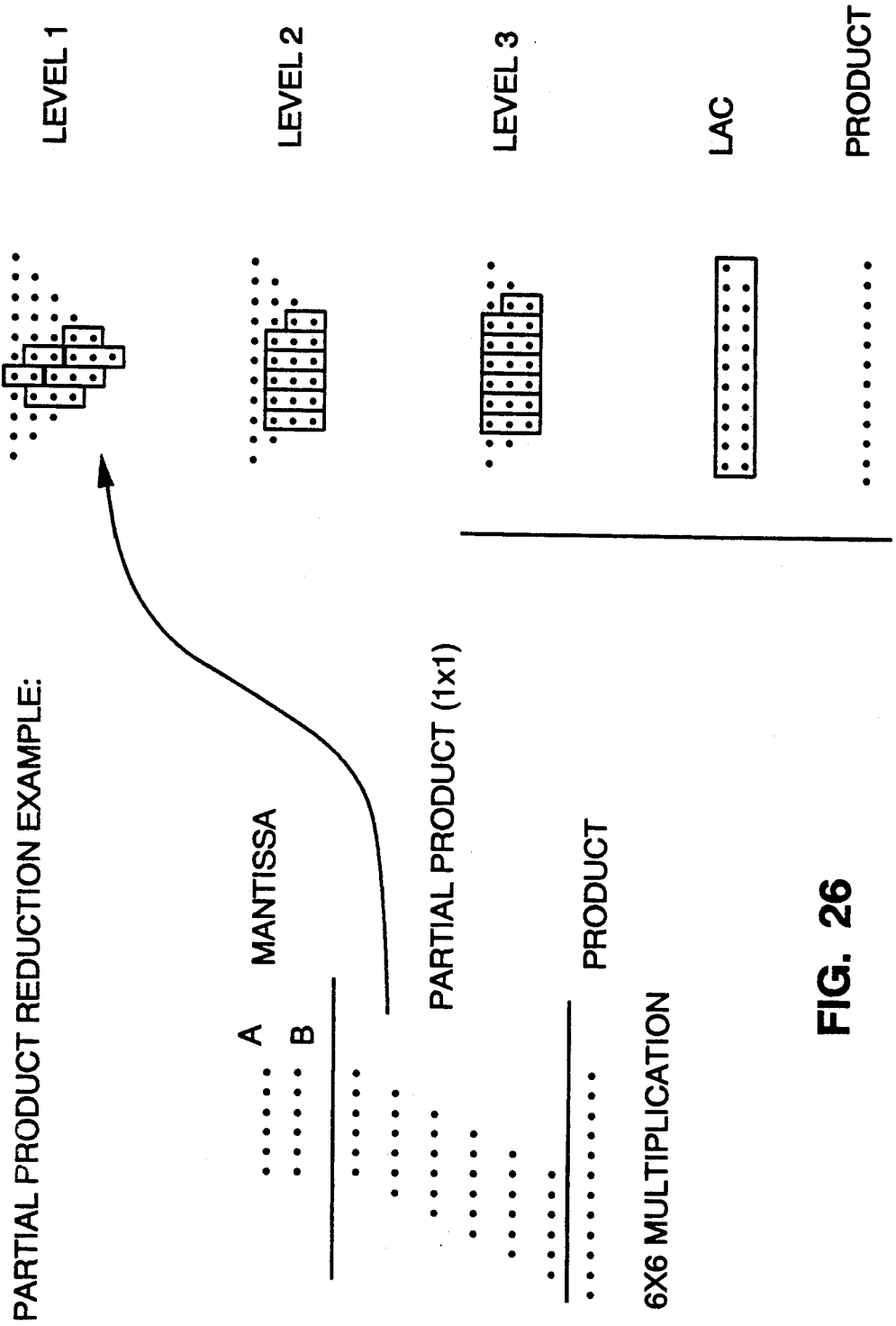
FIG. 26 is a schematic representation of "paper and pencil" multiplication and partial product matrix reduction utilizing counting.

The multiplication of two binary numbers is identical to simple "pencil-and-paper" multiplication where the multiplicand is multiplied by successive digits of the multiplier and the partial products are added as shown in FIG. 26 (reproduced from T. Dadda, "Schemes for Parallel Multipliers", reprinted in *Computer Design Development*, Hayden Books, 1976). In binary multiplication, each digit (bit) can be either 1 or 0; thus, each partial product is either equal to the shifted multiplicand or it is zero. The multiplication of an m-bit multiplicand times an m-bit multiplier rests in an 2 m-bit product. However, in floating point calculations only the high order 60 bits are retained so as to minimize truncation error. The double precision floating point representation of IEEE standard 754 is used in the following discussion. The format of the scheme is compatible with the IEEE standard, however, some of the special features of that standard are not implemented.

A double precision floating point representation consists of an exponent E and a mantissa M. Both E and M depend on the precision of the computer word and the floating point standard under consideration. With a 52-bit mantissa, the multiplication of two numbers in floating points representation is $X = 2^{Ex}(M_x)$, $Y = 2^{Ey}(M_y)$. This equation can also be expressed as:

$$XY = (2^{Ex+Ey})(M_x M_y) \qquad (32)$$

The multiplication of two 52-bit wide numbers must be considered in order to multiply two double precision (64-bit wide) floating point words.

The product terms in this matrix are generated by 1*1 multipliers. Arithmetic summing of matrix rows or bit counting in columns can reduce the partial-product matrix to a product. The following steps are used for multiplication (either step 2-add or 2-counter method is used for reduction):

Step (1): A partial products matrix must be generated by either using a 1*1 multiplier or by using a higher order multiplier such as (3*3 or 4*4) in order to reduce the resulting partial product matrix height.

Step (2-add): Simultaneously summed pairs of rows of the partial product matrix with single clock LAC (look-ahead carry) adders. This process is repeated until only a single sum results; or Step (2-counter method): Up to 2*m rows of the partial product matrix are reduced to two rows by using bit counting in columns of this matrix (all carries are processed in the next logic level). A Look-Ahead Carry adder provides the final result.

When more efficient and more complex counters are used, the number of required reduction levels decreases. Carries from the previous columns are only introduced at a later level to prevent "ripple carry". Consequently, all calculations occur synchronously from one plane to the next.

A single clock wide word multiplication is only hypothetically possible. For example, a (15,4) counter will have more than 33,000 total minterms. This is why the reduction of a partial product matrix typically requires more than one level of logic. The following table gives an indication of the required counter complexity. It shows the number of minterms for each counter output for the counters listed.

Counter complexity
A (N,K) counter takes N input bits and returns a K bit binary number corresponding to the number of bits that are "ones".

| Counter type | # Minterms required to compute | | | | Total Minterms | % reduction |
|---|---|---|---|---|---|---|
| | S0 | S1 | S2 | S3 | | |
| (15,4) | 16384 | >5000 | >6000 | 6435 | >33,800 | 73% |
| (5,5,4) | 16 | >320 | >105 | 15 | >436 | |
| (8,4) | 128 | 92 | 70 | 1 | 291 | |
| (7,3) | 64 | 42 | 35 | | 141** | 57% |
| (6,3) | 32 | 21 | 15 | | 68** | 50% |
| (3,3,4) | 4 | 24 | 3 | | 41 | |
| (5,3) | 16 | 10 | 5 | | 31** | 40% |
| (4,3) | 8 | 6 | 1 | | 15 | |
| (3,2) | 4 | 3 | "Full Adder" | | 7*** | 33% |
| (2,2) | 2 | 1 | "Half Adder" | | 3 | |
| (N,K) | $2^{**}(K-1) > C(N,2) > C(N,4)$ | | | | | |

It is important to understand the tradeoffs between the degree of complexity of a free space global interconnect counter implementation and the resulting number of partial product matrix reduction stages or levels. The critical large columns should be addressed with very efficient complex counters while the small columns can be reduced with very simple (3,2) counters.

The implementation of the intermediate calculations required for the double precision floating point algorithm are presented next. They indicate both the usefulness of the present invention for implementing the final algorithm, and also point out the benefits of the invention when applied to the intermediate calculations discussed.

3*3 Multiplier Utilizing Free Space Global Interconnects

Figure 27:
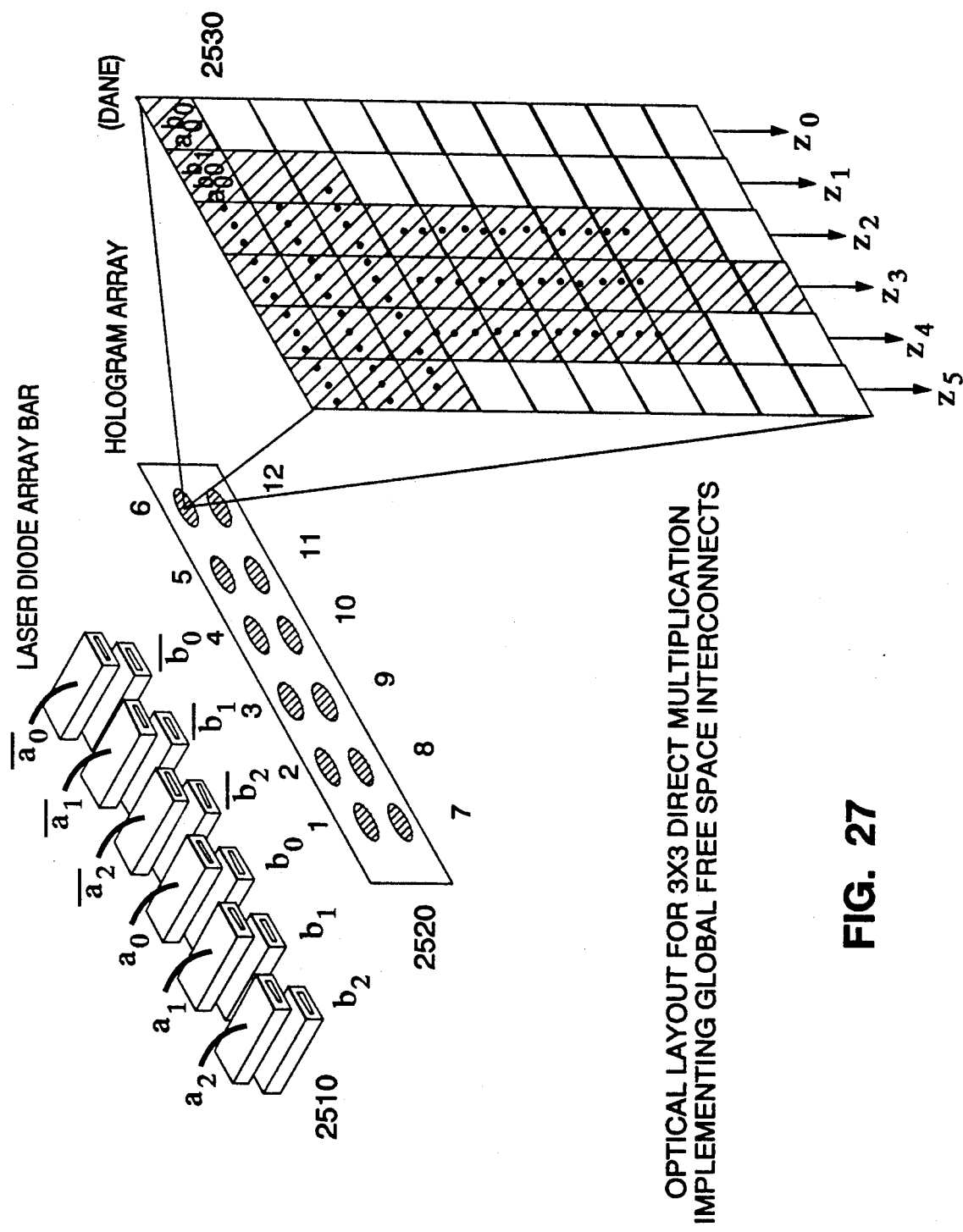
FIG. 27 illustrates an optical architecture for 3×3 direct multiplication using global free space interconnects.

The number of partial product matrix (PPM) reduction levels will decrease when a 3*3 or 4*4 multiplier is used. The partial product matrix output produced from a 3*3 multiplier when multiplying the three-bit words: $a_2a_1a_0$ and $b_2b_1b_0$ is represented by the Boolean equations below (equation 33). Thus an optical implementation of a 3*3 multiplier is similar to an optical scheme for a single clock look-ahead carry, as is illustrated in FIG. 27.

$$z_0 = a_0 b_0 \qquad (33)$$

$$z_1 = a_0 \overline{b_0} b_1 + \overline{a_0} a_1 b_0 + a_1 b_0 \overline{b_1} + a_0 \overline{a_1} b_1$$

$$z_2 = \overline{a_0 a_1} a_2 b_0 + a_0 \overline{b_0 b_1} b_2 + a_0 a_2 b_0 \overline{b_2} + a_0 \overline{a_2} b_0 b_2 + a_1 \overline{b_0} b_1 \overline{b_2} +$$
$$\overline{a_0 a_1} \overline{a_2} b_1 + \overline{a_0} a_1 \overline{b_0} b_1 + a_0 \overline{a_1} b_0 b_1 b_2 + \overline{a_0} a_1 b_0 b_1 \overline{b_2}$$

$$z_3 = a_1 \overline{b_0 b_1} b_2 + \overline{a_0 a_1} a_2 b_1 + a_0 a_2 \overline{b_0} b_1 + \overline{a_0} a_1 b_0 b_2 +$$
$$\overline{a_1} a_2 b_1 \overline{b_2} + a_1 \overline{a_2 b_1} b_2 + a_2 \overline{b_0} b_1 b_2 + \overline{a_0} a_1 \overline{a_2} b_2 +$$
$$a_0 \overline{a_1} a_2 b_0 \overline{b_1} b_2 + a_0 a_1 \overline{a_2} b_0 b_1 \overline{b_2}$$

$$z_4 = a_2 \overline{b_0 b_1} b_2 + \overline{a_0 a_1} a_2 b_2 + \overline{a_0} a_2 \overline{b_1} b_2 + \overline{a_1} a_2 \overline{b_0} b_2 + \overline{a_1} a_2 \overline{b_1} b_2 +$$
$$a_0 a_1 \overline{a_2} b_1 b_2 + a_1 a_2 b_0 b_1 \overline{b_2} + a_0 a_1 a_2 b_0 b_1 b_2$$

$$z_5 = a_1 a_2 b_1 b_2 + a_0 a_1 a_2 b_0 b_2 + a_0 a_2 b_0 b_1 b_2$$

Input variables and their negations are applied to two diode laser (DL) bars 2510. Each diode laser 2510 reconstructs its own hologram 2520. The reconstructed 2-D image illuminates the photodetector array 2530. After detection, the signals are amplified, negated and ORed. ORing is performed electronically, in each column, at the photodiodes, thus providing the following output results: $Z_0, Z_1, Z_2, Z_3, Z_4, Z_5$.

A 4*4 multipler can be computed in the same way. When multiplying a 52×52 bit mantissa, a 4*4 optical multipler can be efficiently employed to form the partial product matrix. The algorithm for a 52*52 bit multiplication uses 4*4 optical multiplers followed by reduction of the partial product matrix using (7,3), (6,3), and (3,2) optical counters. The reduction stages for the tallest column are described in FIG. 28.

Figure 28:
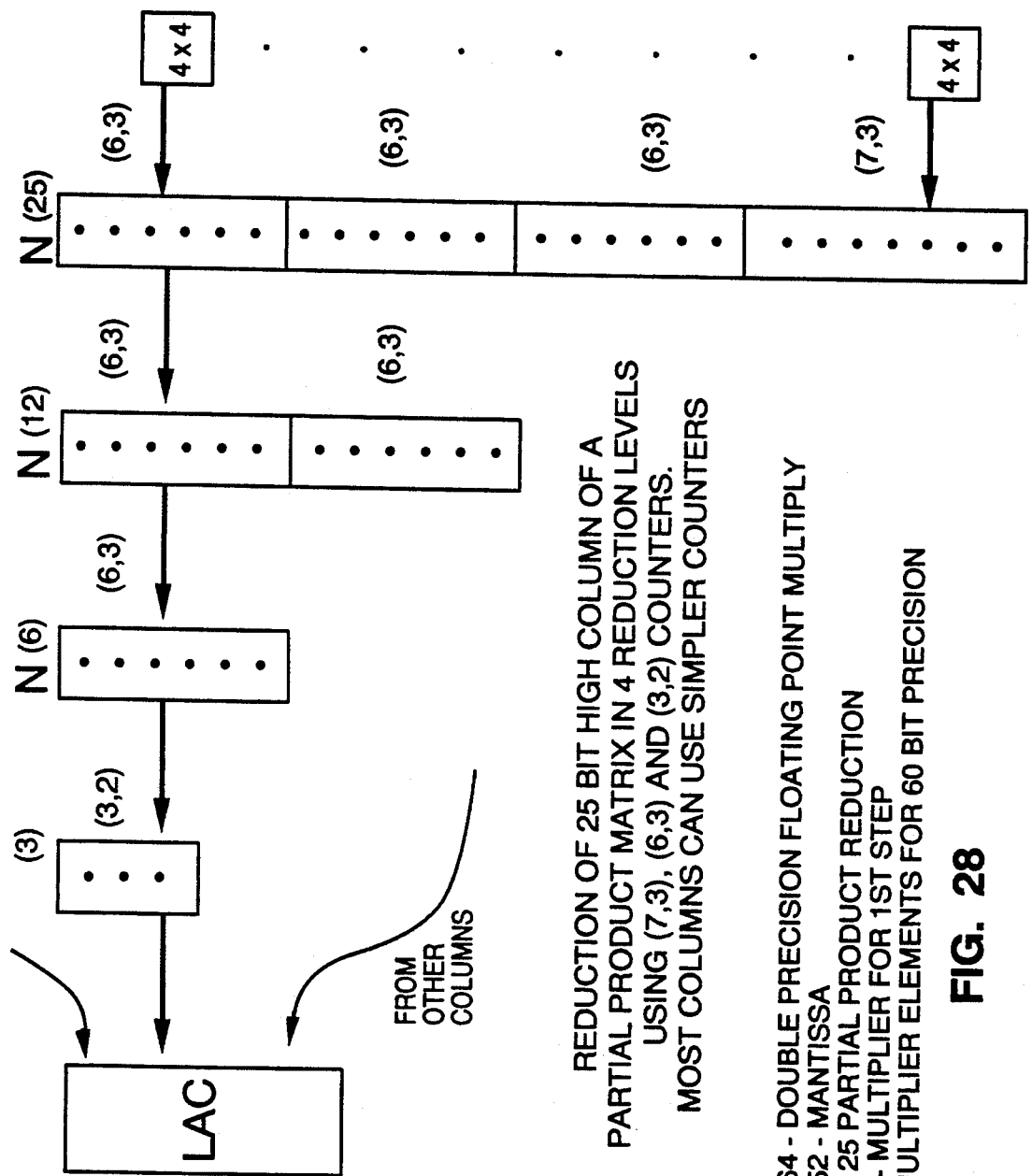
FIG. 28 is a schematic of the reduction of a 25-bit high column of a partial product matrix utilizing (7,3), (6,3), and (3,2) counters.

The worst case calculation of columns which occurs in the middle of the multiplication sum is represented in FIG. 28. An analogous procedure must be applied to each of the other columns which are of lesser complexity resulting in simpler and fewer counters. The algorithm must use an identical number of reduction levels in each column to achieve a totally synchronous operation. When this is done, multiple problems can be computed in an overlapped or pipelined fashion and higher throughput achieved.

4×4 Multiplier Characteristics

The 4×4 flash multiplier produces only 25 entry columns instead of the 35 produced by a 3×3 multiplier array. Furthermore only 114 4×4 multipliers are required instead of 200 3×3 multipliers. The 4×4 multiplier is more complicated than the 3×3 multiplier and requires 148 minterms to be summed instead of only 35 minterms. However, there is a net reduction of system complexity since fewer reduction stages are required with the 4×4 multiplier. The 4×4 Multiplier array outputs a partial products matrix (PPM) with a maximum column height of 25 while the 3 ×3 array produces a maximum column height of 35 and thus requires an additional reduction stage.

When two 4 bit numbers $a_{3:0}$ and $b_{3:0}$ are multiplied an 8 bit product $S_{7:0}$ is produced:

|   |   |   |   | $a_3$ | $a_2$ | $a_1$ | $a_0$ |
|---|---|---|---|---|---|---|---|
|   |   |   |   | $b_3$ | $b_2$ | $b_1$ | $b_0$ |
|   |   |   |   | $a_3b_0$ | $a_2b_0$ | $a_1b_0$ | $a_0b_0$ |
| (34) |   |   | $a_3b_1$ | $a_2b_1$ | $a_1b_1$ | $a_0b_1$ |   |
|   |   | $a_3b_2$ | $a_2b_2$ | $a_1b_2$ | $a_0b_2$ |   |   |
|   | $a_3b_2$ | $a_2b_2$ | $a_1b_2$ | $a_0b_2$ |   |   |   |
| $S_7$ | $S_6$ | $S_5$ | $S_4$ | $S_3$ | $S_2$ | $S_1$ | $S_0$ |

The complexity of each of the expressions for $S_7 \ldots S_0$ is described below in terms of the number of minterms and the number of a factors in each minterm (a listing of the individual terms is reproduced in Appendix B).

|    | 2 | 3 | 4 | 5 | 6 | 7 | 8 |              |
|----|---|---|---|---|---|---|---|--------------|
| $S_7$ |   |   |   | 1 | 6 | 2 |   | 9 minterms   |
| $S_6$ |   |   |   | 1 | 4 | 16 | 2 | 23 minterms |
| $S_5$ |   |   |   |   | 6 | 10 | 14 | 6 | 36 minterms |
| $S_4$ |   |   |   |   | 6 | 18 | 10 | 2 | 36 minterms |
| (35) $S_3$ |   |   |   |   | 18 | 6 | 1 | 5 | 30 minterms |
| $S_2$ |   |   |   | 9 |   |   |   | 9 minterms   |
| $S_1$ |   |   | 4 |   |   |   |   | 4 minterms   |
| $S_0$ | 1 |   |   |   |   |   |   | 1 minterms   |

Total: 148 minterms

Multiplications using 4*4 multipliers and performing PPM, and performing reduction by counting in columns using (6,3), (5,3), and (3,2) counters requires 4 reduction levels. PPM reduction using counting is more efficient than reduction using look ahead carry addition which requires 6 LAC/full add reduction levels. The number of reduction levels is defined by the height of this matrix, which corresponds to the worst case of complexity. In the expression $N^i_j(k)$, k is the number of bits in the column, j is the number of columns, and i is the index reduction level. The 4×4 multiplier array forms the PPM T(25,60).

The most complicated 25 input column $N^0_j(25)$ is counters to a 12 input column $N^1_j(12)$, as shown in FIG. 28. This is further reduced to $N^2_j(6)$ with two (6,3) counters into a $N^2_j(6)$ column which is subsequently transformed with a (6,3) counter into a $N^3_j(3)$ column. The 3 high PPM is then reduced to two input rows, T(2,60), using only (3,2) counters. This stage combines the low order bit of the current output with the carry outputs from the previous columns, which, in turn, feeds the LAC. In this reduction case, all bits are processed through the same number of stages resulting in equal delays for all bits, which creates a totally synchronous operation. A look ahead carry Addition then reduces the T(2,60) matrix to obtain the final result.

Figure 29:
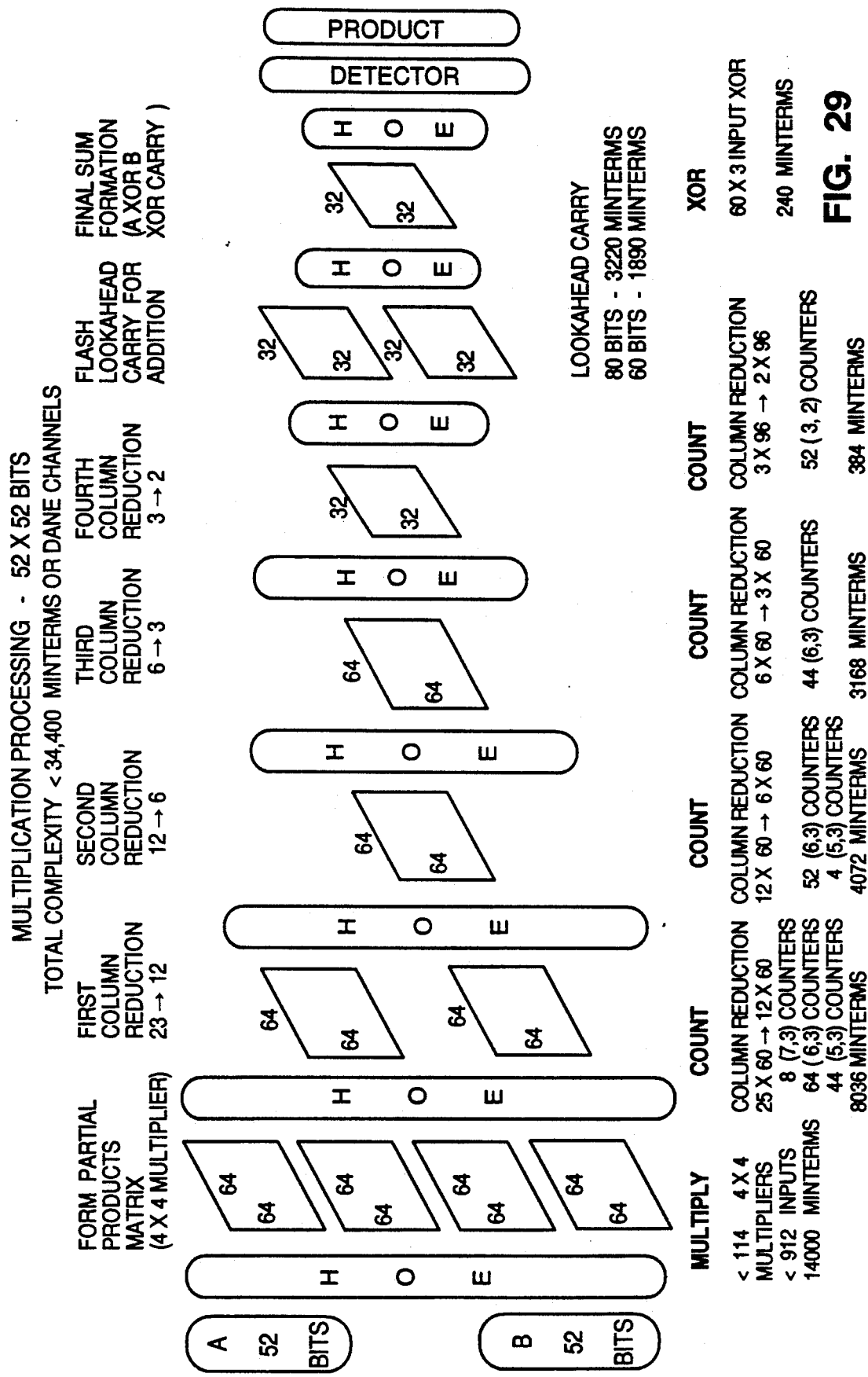
FIG. 29 illustrates the reduction stages for a 52×52-bit multiplication using column reduction.

FIG. 29 summarizes the required steps which must be followed in the multiplication process for a 52×52 bit mantissa using a 4 * 4 free space global interconnect multiplier to provide a PPM of T(25,60). Emission from the DANE channels are directed using a matrix of Holographic Optical Interconnect Elements (HOIE) (although as previously mentioned, masks could also be used). The resulting collimated laser beams illuminate a hologram matrix (HM). Each hologram is designed for the fixed interconnect pattern responsible for minterm calculation at this stage. If optical ORing is chosen for implementation, then the DANE matrix is followed with a second HOE and DANE to combine the minterms generated in the previous stage and to present them to the next stage.

If a DANE matrix with electronic ORing is used, then the optical system is less complex. However, the DANE matrices are more complicated; specifically, the number of optical inputs is much larger than the number of optical outputs corresponding to the numbers of the minterms used to generate the logical expressions.

The PPM consists of (25*52)=1300 terms (FIG. 28). When implementing the IEEE double precision floating point standard, only 60 bits rather than the full 104 need be retained. Thus, the total number of terms can be reduced from 1300 to 676 retained bits and 200 additional roundoff and normalization control bits for a total of 876 bits. Thus only 876 bits in the matrix T(25,104) are utilized for the full 60-bit mantissa after two double precision numbers are multiplied. Since each bit must be represented in dual rail format (both high true and negated), the total number of output cells in the DANE matrix input to the first level of reduction must be 876*2=1852 cells.

This 25-height PPM matrix can be reduced to 12 high using two 64×64 matrices. The 12-bit high column PPM can then be reduced to 6 high in the second DANE matrix using one 64*64 matrix. The third reduction level reduces the 6 high PPM to 3 high using 44(6,3) counters and 4(5,3) counters while using part of one 64×64 DANE. The final step feeding the look-ahead carry uses 52 (3,2) counters and 5(1,1) pipeline relays and requires only 389 cells of a DANE matrix.

Partial Product Matrix (PPM) Reduction Using Successive Look-Ahead Carry (LAC) Addition If 1×1 multipliers are used to form a PPM of m rows and a single clock look-ahead carry is used for partial product reduction, then the number of reduction levels is n=[next integer greater than or equal to $\log_2 m$], where m is the number of rows in the partial production matrix.

To illustrate the complexity tradeoffs between different types of counters, for a given multiplication, if:

the multiplicand is A=$a_{51}a_{50}a_{49}$ ... $a_3a_2a_1a_0$, the multiplier is B=$b_{51}b_{50}b_{49}$ ... $b_3b_2b_1b_0$, and 1*1 multipliers are used to form the partial product matrix, then this matrix will consist of 52 rows with 52 digits in each row. The reduction of this matrix to a final product will take n=6 levels in accordance with the upper bound LAC reduction sequence of: 64-32-16-8-4-2-1(=product) for binary reduction.

The reduction scheme for 52 row reduction using successive additions is 52-26-13-7-4-2-1, as shown in the following table.

| Reduction stage | Input rows | resulting rows | # LAC adders required. |
|---|---|---|---|
| 1 | 52 | 26 | 26 |
| 2 | 26 | 13 | 13 |
| 3 | 13 | 7 | 6 (unchanged) |
| 4 | 7 | 4 | 3 (unchanged) |
| 5 | 4 | 2 | 2 |
| 6 | 2 | 1 | 1 (final) |
| Table #3 | | total | 51 LAC adders required |

In this scheme for 60 bit precision in the retained result, the required adder complexity varies considerably depending on the position of the input data in the final sum. Thus, the first stage adders range from 8 bits to 56 bits with similar alignment words paired together for each adder. The maximum adder precision required is 60 bits. The "unchanged" inputs should also pass through the DANE so as to provide equal delays on all bit paths in order to allow fast pipelining.

Figure 30:
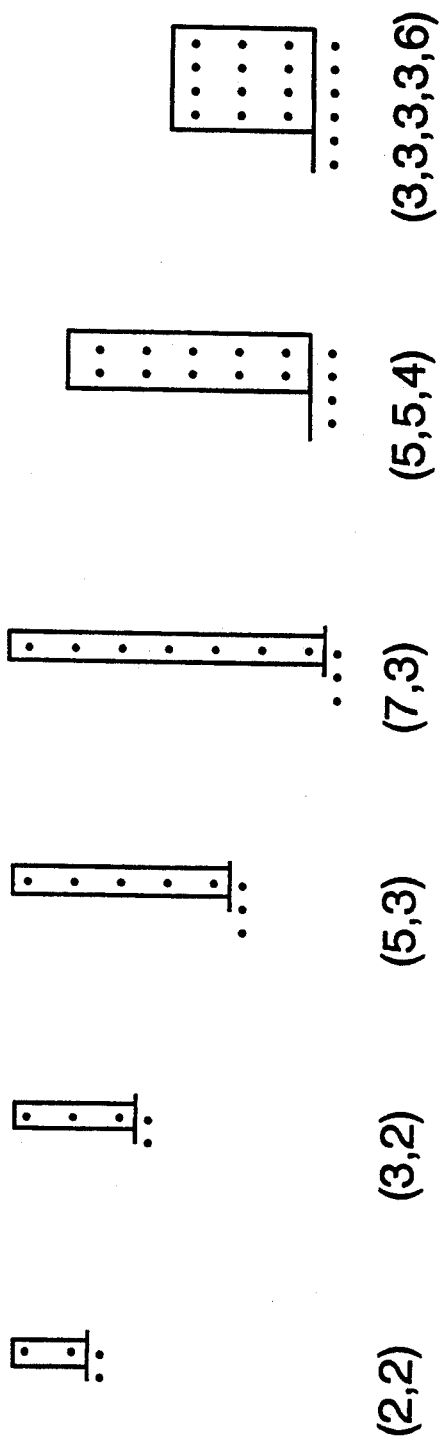
FIG. 30 illustrates different types of counters which can be used for partial product matrix reduction.

Several types of counters can be used to reduce a partial product matrix. T. Dadda, in "Schemes for Parallel Multipliers", reprinted in *Computer Design Development*, Hayden Books, 1976, has introduced the notion of a (c,d) counter as a combinatorial network which receives c bits of equal weight as input, and produces a d-bit word corresponding to the sum as output. This class of counters has been extended to counters which sum according to the number of weighted input columns. These counters are denoted as: $(c_{k-1}, c_{k-2}, \ldots, c_0, d)$ and are summarized in FIG. 30, taken from W. J. Stenzal, W. J. Jubitz, and G. H. Garcia, "A compact High Speed Parallel Multiplication Scheme", *IEEE Transactions on Computers*, Vol, C-26, No. 10, October 1977.

Figure 31:
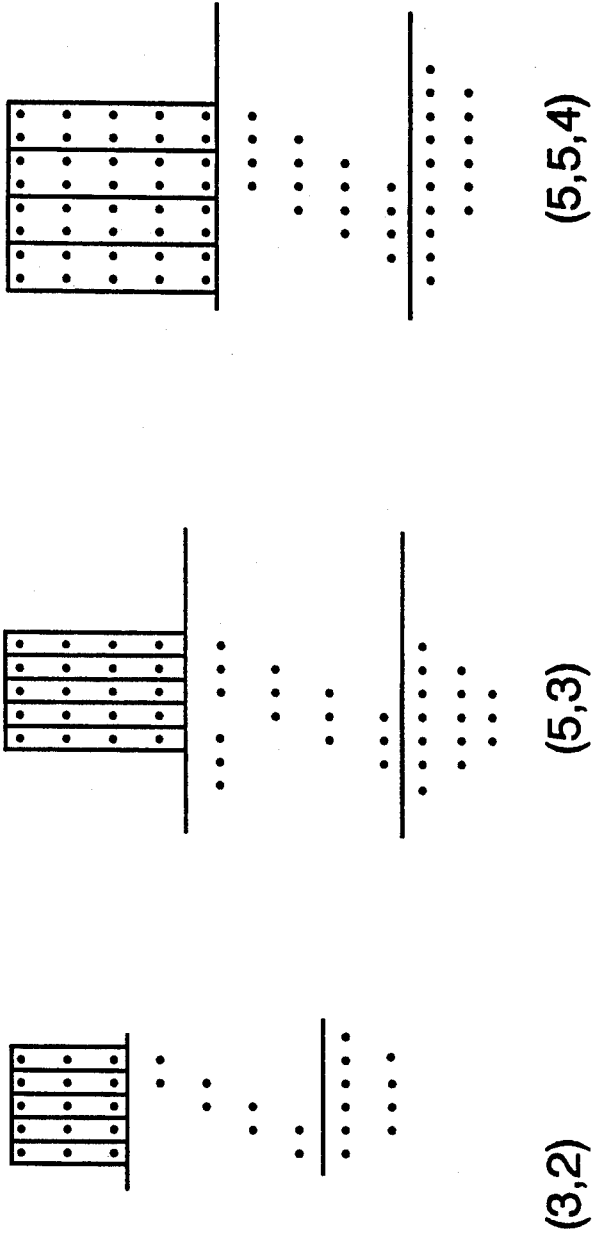
FIG. 31 illustrates the result of equal counters acting on adjacent columns of a partial product matrix.

The result of equal counters acting on adjacent columns is shown in FIG. 31 (taken from the same reference as FIG. 30) for the counter types (3,2), (5,3) and (5,5,4). A series of (3,2) counters reduces a matrix 3 rows high, to a matrix 2 rows high. A series of (5,3) counters reduces a matrix 5 rows high to 3 rows high. Similarly, a series of (5,5,4) counters reduces a matrix 5 rows high to 2 rows.

By using more powerful counters, fewer levels are needed for matrix T reduction. For example, a (15,4) counter can reduce a 15-bit height column into 4 rows in one step. If only (7,3) counters are available, then the reduction of this column into 3 rows will take two steps. It is important to balance the complexity of the counters used. In actuality, for any pipelining to work, there must be an identical number of stages of processing for all columns regardless of complexity. Thus the more complex counters should only be specified where their greater reduction capability is in the critical path.

If 6 reduction levels are utilized to reduce the partial product matrix T(52,60), then this goal might be achieved with (6,3) and (3,2) counters, where the maximum total number of sums using (6,3) counters is 32. When more powerful counters are used, the required number of reduction levels is reduced, or more rows can be reduced in the same number of levels.

A gate efficient 5 stage reduction sequence using 2 (5,3) and 12 (3,2) counters is (18-12-8-5-3-2), for a total complexity of 146 minterms. A more expensive but implementable 5 stage sequence allowing greater reduction in each stage using 15(6,3) and 1(3,2) counters is (48-24-12-6-3-2), for a total complexity of 1027 minterms. Typical Partial product matrix reduction schemes use the more efficient and more expensive counters to reduce the tall center parts of the Partial Products Matrix (PPM) and simple counters to reduce the shorter columns.

A (5,3) Counter Implementation Using Free Space Global Interconnects

In a (5,3) counter using free space global interconnects, the output consists of the sum $S_0$, and carries $S_1$ and $S_2$, so that the binary number $S_2 S_1 S_0$ represents the number of one's set in $x_5 \ldots x_1$. In equation 36, $S_0$ is the 5 input exclusive OR of the $x_1 \ldots x_5$ inputs, and $S_1$ and $S_2$ are the carry outputs of value 2 and 4 respectively, that are fed to the next stage. $S_2$ is computed from the OR of the 4 possible combinations of 4 (or 5) bits set. A total of 31 minterms are ORed for this function. If $x_5, x_4, x_3, x_2, x_1$ are the input variables to be counted, the terms $S_o$, $S_1$, and $S_2$ are given in equation 36.

$$S_0 = x_5\bar{x}_4\bar{x}_3\bar{x}_2\bar{x}_1 + \bar{x}_5 x_4 \bar{x}_3 \bar{x}_2 \bar{x}_1 + \bar{x}_5 \bar{x}_4 x_3 \bar{x}_2 \bar{x}_1 + \bar{x}_5 \bar{x}_4 \bar{x}_3 x_2 \bar{x}_1 + \quad (36)$$

$$\bar{x}_5\bar{x}_4\bar{x}_3\bar{x}_2 x_1 + \bar{x}_5\bar{x}_4 x_3 x_2 x_1 + \bar{x}_5 x_4 \bar{x}_3 x_2 x_1 + \bar{x}_5 x_4 x_3 \bar{x}_2 x_1 +$$

$$\bar{x}_5 x_4 x_3 x_2 \bar{x}_1 + x_5 \bar{x}_4 \bar{x}_3 x_2 x_1 + x_5 \bar{x}_4 x_3 \bar{x}_2 x_1 + x_5 \bar{x}_4 x_3 x_2 \bar{x}_1 +$$

-continued $$x_5x_4\bar{x}_3\bar{x}_2x_1 + x_5x_4\bar{x}_3x_2\bar{x}_1 + x_5\bar{x}_4x_3\bar{x}_2\bar{x}_1 + x_5\bar{x}_4x_3x_2x_1$$

$$S_1 = x_4x_3\bar{x}_2\bar{x}_1 + x_1\bar{x}_3x_4\bar{x}_5 + x_2\bar{x}_3x_4\bar{x}_5 + \bar{x}_1x_2x_4\bar{x}_5 +$$
$$x_1\bar{x}_3\bar{x}_4x_5 + x_1\bar{x}_2x_3\bar{x}_4 + \bar{x}_2\bar{x}_3x_4\bar{x}_5 + \bar{x}_1x_2x_3\bar{x}_4 +$$
$$\bar{x}_1x_2\bar{x}_3x_5 + \bar{x}_1\bar{x}_2x_3x_5$$

$$S_2 = x_1x_2x_3x_4 + x_1x_2x_3x_5 + x_1x_2x_4x_5 + x_1x_3x_4x_5 + x_2x_3x_4x_5$$

Figure 32:
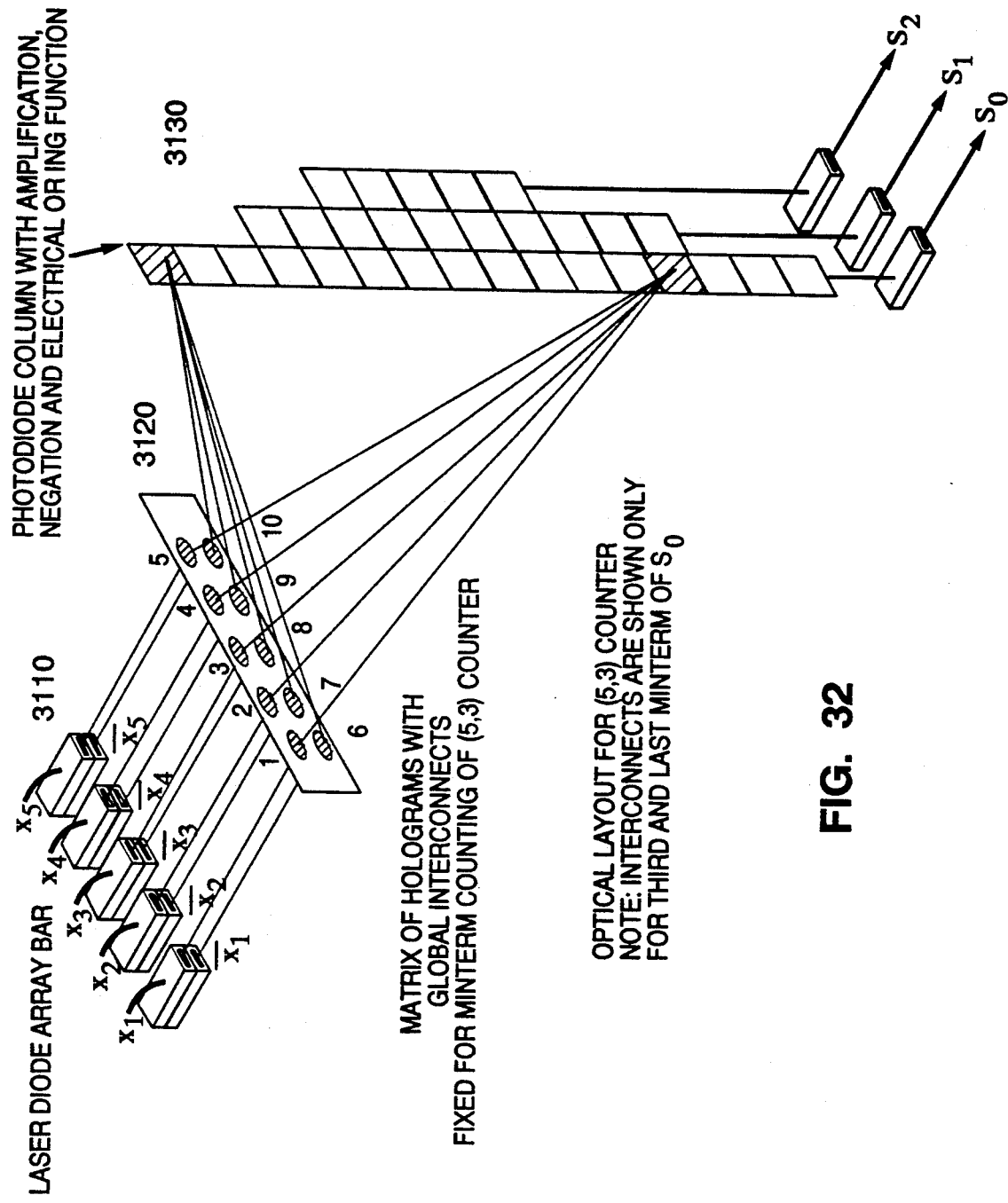
FIG. 32 illustrates an optical architecture implementation of a (5,3) counter.

In FIG. 32, which shows an optical architecture for a (5,3) counter, a portion of the surface emitting diode laser matrix 3110 representing variables $x_1$ and their negation is included in vertical column i where digits of equal weight are summed. Each laser 3110 illuminates its own hologram 3120 and the positions of the reconstructed bits are precalculated in such a way that each photodetector array 3130 receives data from all of the holograms. After summing the literals and negating the sum, the minterms of $S_0$, $S_1$, $S_2$ are formed on each of the photodiodes 3130.

In FIG. 32, the ORed results must be introduced in the proper order so that one can move to the next level of matrix T reduction. The $S_0$, $S_1$, $S_2$ outputs are presented in dual-rail form to illuminate the appropriate detectors for the next stage (note that in FIG. 32 the negations of the outputs are not displayed). The next reduction step can therefore be performed in the same manner. The higher order carry out bits from each counter are fed into the next reduction level so no ripple carry results.

Several algorithms to perform efficient multiplication utilizing global free space "smart" optical interconnects have been presented. First a partial products matrix is formed by using 1×1, 3×3 or 4×4 multipliers, and then one of the following reduction methods is used:

Method 1) Reduce the partial product matrix utilizing Wallace tree reduction.
Method 2) Reduce the partial product matrix employing simultaneous summation of the adjacent pairs of rows using single clock look ahead carrys.
Method 3) Reduce the partial product matrix using bit counting of columns where all carrys are processed in the next logical level and a look ahead carry adder provides the final solution.

The theory behind the proposed architecture has evolved through a series of interconnect architectures developed by the inventors. The use of a global interconnect architecture with the DANE device previously discussed will allow for superior processing speeds and lower power consumption than is currently available with semiconductor technology. These benefits are obtained from augmenting semiconductor based logic families with optical digital logic, with the result being an improved architecture for computing.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

Appendix A (BER Calculation)

For Gaussian statistics, assume that the signal power per bit is P with a noise variance of $\sigma_i^2$ and the threshold is at the first bit. The probability of not making an error is, from Carlson, *Communication Systems*, McGraw Hill, 1968, p. 373.:

$$P_e = \frac{1}{\sqrt{2\pi}} \int_{\frac{P}{2\sigma}}^{\infty} \exp\left(-\frac{u^2}{2}\right) du \tag{37}$$

$$= \frac{1}{2} - \Phi\left(\frac{P}{2\sigma}\right) \tag{38}$$

$$= \frac{1}{2}\left(1 - \text{erf}\left(\frac{P}{2\sqrt{2}\,\sigma}\right)\right) \tag{39}$$

To demonstrate the benefits of the logic family of the present invention, consider the worst case signal-to-noise ratio in this system. This occurs when the detector is illuminated by only one Fan-In and the noise contribution from the other zeros sums to $\sqrt{N}-1$. For the purpose of simplicity it is assumed that the shot noise from one bit is equal to the noise contribution from scattered light which places an absolute upper bound on the problem.

$$SNR = \frac{P_{on}}{\sum_{i=1}^{N} P_{ioff} + \sigma_i} \tag{40}$$

The contrast ratio at each input can be written:

$$R_c = \frac{P_{on}}{P_{ioff}} \tag{41}$$

Now assume that:

$$\sigma_i \approx \sum_{i=1}^{N} P_{ioff} \tag{42}$$

then the signal-to-noise ratio is given by:

$$SNR \approx \frac{P_{on}}{2NP_{ioff}} \tag{43}$$

and therefore:

$$\frac{P}{\sigma} = SNR = \frac{R_c}{2N} \tag{44}$$

Consequently the Bit Error Rate (BER) can be written:

$$BER \approx \frac{1}{2} \text{erf}\left(\frac{SNR}{2\sqrt{2}}\right) \tag{45}$$

$$= \frac{1}{2} \text{erf}\left(\frac{R_c}{4\sqrt{2}\,N}\right) \tag{46}$$

To simplify this expression, note that for large v:

$$erf(v) = \frac{1}{v\sqrt{\pi}} \exp\{-v^2\} \qquad (47)$$

Therefore, the final expression is:

$$BER \approx \frac{4\sqrt{2}\,N}{R_c\sqrt{\pi}} \exp\left(-\left\{\left[\frac{R_c}{4\sqrt{2}\,N}\right]^2\right\}\right) \qquad (48)$$

APPENDIX B multip.c

```
/* 4 x 4 multiplication routine */ include   <stdio.h>
define    ACOUNT  16
define    BCOUNT  16 define    KARN    1 define    BIN4(a)     (if a && 1) <a>0 = 1; else <a>0 = 0;\
                      if a && 2) <a>1 = 1; else <a>1 = 0;\
                      )

#define    XORAB(A,B)    ((A) && !(B)) || (!(A) && (B))

#define    XORMABC(A, B, C)    ( (((A) && !(B)) || (!(A) && (B)) && !(C)) || \
                                ((((A) && !(B)) || (!(A) && (B))) && C) )

#define    XORABC(A, B, C)  ( ( (A) && !(B) && !(C) ) || (!(A) && (B) && !(C)) || \
                             ( !(A) && !(B) && (C) ) || ((A) && (B) && (C))
int    a, a0, a1, a2, a3, a4;
int    b, b0, b1, b2, b3, b4;
int    s, ss, s0, s1, s2, s3, s4, s5, s6, s7, s8;
int    p, p0, p1, p2, p3, p4, p5, p6, p7;
int    x, xx, x0, x1, x2, x3, x4, x5, x6, x7;

int kmaph[ACOUNT] = {1, 9, 13, 5, 7, 15, 11, 3, 2, 10, 14, 6, 4, 12, 8, 0};
int kmapl[ACOUNT] = {0, 1, 3, 2, 6, 7, 5, 4, 12, 8, 10, 14, 15, 11, 9, 13};
int kmaps[ACOUNT] = {0, 1, 2, 3, 4, 5, 6, 7, 8, 9, 10, 11, 12, 13, 14, 15};

int mapll[7] = {1, 2, 4, 8, 16, 32, 64};
int maplr[7] = {1, 4, 2, 8, 16, 32, 64};
int map4r[7] = {8, 4, 2, 1, 16, 0, 0};
int map22[7] = {8, 1, 2, 4, 16, 0, 0};

int    eq, tt, ff, ft, mt;
int    i, j, cnt, prods;
int    product[ACOUNT*BCOUNT];
int    bool[ACOUNT*BCOUNT];
int    chk[ACOUNT*BCOUNT];

main()
{
int    c, c21, c22, p212, p212a, p222;
FILE   *fileptr;
``` multip.c

```
    fileptr = fopen("product.file", "w");
/*  if (fileptr == (FILE *)0) exit 0; */
    for (a=0; a< ACOUNT*BCOUNT; a++){
        product[a] = bool[a] = chk[a] = 0;  }
    cnt = prods = 0;
    eq = tt = ff = ft = mt = 0;
    for (a=0; a<ACOUNT; a++){
        for (b=0; b<BCOUNT; b++){
            setsb(a, b, s = a*b);

p7 =
```

```
/* 11xx-11xx */ (a3 && a2 && b3 && b2) ||
/* 111x-1x1x */ (a3 && a2 && a1 && b3 && b1) ||  (a3 && a1 && b3 && b2 && b1) ||
/* 11x1-1x1x */ (a3 && a1 && b3 && b2 && b0) ||  (a3 && a2 && a0 && b3 && b1) ||
/* 1x11-11xx */ (a3 && a2 && b3 && b1 && b0) ||  (a3 && a1 && a0 && b3 && b2) ||
/* 1111-1xx1 */ (a3 && a2 && a1 && a0 && b3 && b0) || (a3 && a0 && b3 && b2 && b1 && b0);

if (s7 != p7) printf("bit(128) %d in:%d a:%d%d_%d%d b:%d%d_%d%d \n",
                p7, s, a3, a2, a1, a0,  b3, b2, b1, b0); else cnt++;

p3 = x3sub();

p2 = x2sub();

p1 = XORAB((a0 && b1), (a1 && b0));
        p1 = (a1 && !b1 && b0) || (a1 && !a0 && b0) || (!a1 && a0 && b1) || (a0 && b1 && !b0);

if (s1 != p1) printf("bit(2) %d in:%d a:%d%d_%d%d b:%d%d_%d%d \n",
                p1, s, a3, a2, a1, a0,  b3, b2, b1, b0); else cnt++;

p0 = (a0 && b0);
        if (s0 != p0) printf("bit(1) %d in:%d a:%d%d_%d%d b:%d%d_%d%d \n",
                p0, s, a3, a2, a1, a0,  b3, b2, b1, b0); else cnt++;

#if 1
        x3 =
/* from all karnaugh maps  18 lines 30 minterms 120 set */
/* 18 @ 5 factors (8) = 144  6              */
/*  6 @ 6 factors (4) =  24  8              */
/*  1 @ 7 factors (2) =   2  2              */
/*  5 @ 8 factors (1) =   5  6              */
/*                      175 coverage        */

/* 0001 -1xxx.2 5*/ (!a3 && !a2 && !a1 && a0 && b3) || (a3 && !b3 && !b2 && !b1 && b0) ||
/* 001x -010x.2 6*/ (!a3 && !a2 && a1 && !b3 && b2 && !b1) || (!b3 && !b2 && b1 && !a3 && a2 && !a1) ||
/*√0100 -xx1x 5*/ (!a3 && a2 && !a1 && !a0 && b1) || (a1 && !b3 && b2 && !b1 && !b0) ||
/*√0x10 -x1x1 5*/ (!a3 && a1 && !a0 && b2 && b0) || (!b3 && b1 && !b0 && a2 && a0) ||
/* 0111 -1xx1 6*/ (!a3 && a2 && a1 && a0 && b3 && b0) || (!b3 && b2 && b1 && b0 && a3 && a0) ||
/*√1000 -xxx1 5*/ (a3 && !a2 && !a1 && !a0 && b0) || (b3 && !b2 && !b1 && !b0 && a0) ||
/* 100x -0xx1 5*/ (a3 && !a2 && !a1 && !b3 && b0) || (b3 && !b2 && !b1 && !a3 && a0) ||
/* x100 -xx10.4 5*/ (a2 && !a1 && !a0 && b1 && !b0) || (a1 && !a0 && b2 && !b1 && !b0) ||
/*√x010 -x1x0.8 5*/ (!a2 && a1 && !a0 && b2 && !b0) || (a2 && !a0 && !b2 && b1 && !b0) ||
/* 1x00 -xx01.5 5*/ (a3 && !a1 && !a0 && !b1 && b0) || (!a1 && a0 && b3 && !b1 && !b0) ||
/*√1x10 -x0x1.12 5*/ (a3 && a1 && !a0 && !b2 && b0) || (!a2 && a0 && b3 && b1 && !b0) ||
/* 1101 - 1011  8*/ (a3 && a2 && !a1 && a0 && b3 && !b2 && b1 && b0) ||
                    (b3 && b2 && !b1 && b0 && a3 && !a2 && a1 && a0) ||
/* 1111 -0xx1.4 6*/ (a3 && a2 && a1 && a0 && !b3 && b0) || (!a3 && a0 && b3 && b2 && b1 && b0) ||
/* diag 0011    8*/ (!a3 && !a2 && a1 && a0 && !b3 && !b2 && b1 && b0) ||
/* diag 0101    8*/ (!a3 && a2 && !a1 && a0 && !b3 && b2 && !b1 && b0) ||
/* diag 1011    8*/ (a3 && !a2 && a1 && a0 && b3 && !b2 && b1 && b0) ||
/* diag 1101-   7*/ (a3 && a2 && !a1 && a0 && b3 && b2 && !b1);
endif if 1
        x4 =
/*  6 @ 5 factors (8) = 48   3
/* 18 @ 6 factors (8) = 108  3
/* 10 @ 7 factors (8) = 70   3
/*  2 @ 8 factors (8) = 16   3

/* 20 lines 36 equations
/* 0010 -1xxx.6 5*/ (!a3 && !a2 && a1 && !a0 && b3) || (a3 && !b3 && !b2 && b1 && !b0) ||
/* 0011 -011x  7*/ (!a3 && !a2 && a1 && a0 && !b3 && b2 && b1) ||
                    (!a3 && a2 && a1 && !b3 && b2 && b1 && b0) ||
/* 0100 -x1x1.8 5*/ (!a3 && a2 && !a1 && !a0 && b2) || (a2 && !b3 && b2 && b1 && !b0) ||
/* diag 010x.1 6*/ (!a3 && a2 && !a1 && !b3 && b2 && !b1) ||
/* 0110 -1x1x  7*/ (!a3 && a2 && a1 && !a0 && b3 && b1 && !b0) ||
                    (!b3 && b2 && b1 && !b0 && a3 && a1 && !a0) ||

/* diag 0111   8*/ (!a3 && a2 && a1 && a0 && !b3 && b2 && b1 && b0) ||
/* 0110 -010x  7*/ (!a3 && a2 && a1 && !a0 && !b3 && b2 && !b1) ||
                    (!b3 && b2 && b1 && !b0 && !a3 && a2 && !a1) ||
/* 0111 -1x0x  6*/ (!a3 && a2 && a1 && a0 && b3 && !b1) || (!b3 && b2 && b1 && b0 && a3 && !a1) ||
/* 1000 -xx1x  5*/ (a3 && !a2 && !a1 && !a0 && b1) || (a1 && b3 && !b2 && !b1 && !b0) ||
/* 1001 -xx10  6*/ (a3 && !a2 && !a1 && a0 && b1 && !b0) || (b3 && !b2 && !b1 && b0 && a1 && !a0) ||

/* 1001 -0x1x  6*/ (a3 && !a2 && !a1 && a0 && !b3 && b1) || (b3 && !b2 && !b1 && b0 && !a3 && a1) ||
/* 1001 -1x01  7*/ (a3 && !a2 && !a1 && a0 && b3 && !b1 && b0) ||
                    (b3 && !b2 && !b1 && b0 && a3 && !a1 && a0) ||
``` multip.c

```
/* x100 -x10x.1 5*/    (a2 && !a1 && !a0 && b2 && !b1) ||
/* 1x00 -x010  6*/     (a3 && !a1 && !a0 && !b2 && b1 && !b0) ||
                       (b3 && !b1 && !b0 && !a2 && a1 && !a0) ||
/* 10x0 001x   6*/     (a3 && !a2 && !a0 && !b3 && !b2 && b1) ||
                       (b3 && !b2 && !b0 && !a3 && !a2 && a1) ||

/* 101x -0101  7*/     (a3 && !a2 && a1 && !b3 && b2 && !b1 && b0) ||
                       (b3 && !b2 && b1 && !a3 && a2 && !a1 && a0) ||
/* diag 1011   8*/     (a3 && !a2 && a1 && a0 && b3 && !b2 && b1 && b0) ||
/* 1100 -x1x1.4 6*/    (a3 && a2 && !a1 && !a0 && b2 && b0) || (b3 && b2 && !b1 && !b0 && a2 && a0) ||
/* 1110 -1xx1  6*/     (a3 && a2 && a1 && !a0 && b3 && b0) || (b3 && b2 && b1 && !b0 && a3 && a0) ||
/* 1111 -xx10  6*/     (a3 && a2 && a1 && a0 && b1 && !b0)  || (a1 && !a0 && b3 && b2 && b1 && b0);

endif if 1
    x5 =
/*  6 @ 5 factors (8) = 48
/* 10 @ 6 factors (4) = 84
/* 14 @ 7 factors (2) = 70
/*  6 @ 8 factors (1) =  6
/* 0100 -1xxx  5 */    (!a3 && a2 && !a1 && !a0 && b3) || (!b3 && b2 && !b1 && !b0 && a3) ||
/* 010x -10xx  5 */    (!a3 && a2 && !a1 && b3 && !b2) || (!b3 && b2 && !b1 && a3 && !a2) ||
/* 100x -01xx  5 */    (a3 && !a2 && !a1 && !b3 && b2) || (b3 && !b2 && !b1 && !a3 && a2) ||
/* 11xx -0011  6 */    (a3 && a2 && !b3 && !b2 && b1 && b0) || (b3 && b2 && !a3 && !a2 && a1 && a0) ||
/* 0101 -1x00  7*/     (!a3 && a2 && !a1 && a0 && b3 && !b1 && !b0) ||
                       (!b3 && b2 && !b1 && b0 && a3 && !a1 && !a0) ||

/* 0101 -0111  8*/     (!a3 && a2 && !a1 && a0 && !b3 && b2 && b1 && b0) ||
                       (!b3 && b2 && !b1 && b0 && !a3 && a2 && a1 && a0) ||
/* 1001 -x1x0  6*/     (a3 && !a2 && !a1 && a0 && b2 && !b0) || (b3 && !b2 && !b1 && b0 && a2 && !a0) ||
/* 1000 -11xx  6*/     (a3 && !a2 && !a1 && !a0 && b3 && b2) || (b3 && !b2 && !b1 && !b0 && a3 && a2) ||
/* 011x -011x  6*/     (!a3 && a2 && a1 && !b3 && b2 && b1) ||
/* 101x -101x  6*/     (a3 && !a2 && a1 && b3 && !b2 && b1) ||

/* 1010 -01x0  7*/     (a3 && !a2 && a1 && !a0 && !b3 && b2 && !b0) ||
                       (b3 && !b2 && b1 && !b0 && !a3 && a2 && !a0) ||
/* 1011 -x011  7*/     (a3 && !a2 && a1 && a0 && !b2 && b1 && b0) ||
                       (b3 && !b2 && b1 && b0 && !a2 && a1 && a0) ||
/* 1011 -1001  8*/     (a3 && !a2 && a1 && a0 && b3 && !b2 && !b1 && b0) ||
                       (b3 && !b2 && b1 && b0 && a3 && !a2 && !a1 && a0) ||

/* 1100 -1x10  7*/     (a3 && a2 && !a1 && !a0 && b3 && b1 && !b0) ||
                       (b3 && b2 && !b1 && !b0 && a3 && a1 && !a0) ||
/* 1101 -1x01  7*/     (a3 && a2 && !a1 && a0 && b3 && !b1 && b0) ||
``` multip.c

```
                       (a3 && !a1 && a0 && b3 && b2 && !b1 && b0) ||
/* 1110 -1101  8*/     (a3 && a2 && a1 && !a0 && b3 && b2 && !b1 && b0) ||
                       (b3 && b2 && b1 && !b0 && a3 && a2 && !a1 && a0) ||

/* x110 -0111  7*/     (a2 && a1 && !a0 && !b3 && b2 && b1 && b0) ||
                       (b2 && b1 && !b0 && !a3 && a2 && a1 && a0) ||
/* 1111 -xx11  6*/     (a3 && a2 && a1 && a0 && b1 && b0)  || (a1 && a0 && b3 && b2 && b1 && b0) ||
/* 1111 -1x00  7*/     (a3 && a2 && a1 && a0 && b3 && !b1 && !b0) ||
                       (b3 && b2 && b1 && b0 && a3 && !a1 && !a0);
endif if 1
    x6 =
/*  1 @ 4 factors (16) = 16
/*  4 @ 5 factors ( 8) = 48
/* 16 @ 6 factors ( 4) = 96
/*  2 @ 7 factors ( 2) =  2
/* 23 eq for 66 set    162 coverage
/* 10xx -10xx  4*/     (a3 && !a2 && b3 && !b2) ||
/* 011x -11xx  5*/     (!a3 && a2 && a1 && b3 && b2) || (!b3 && b2 && b1 && a3 && a2) ||

/* 011x -1x11  6*/     (!a3 && a2 && a1 && b3 && b1 && b0) || (!b3 && b2 && b1 && a3 && a1 && a0) ||
/* 0111 -1x1x  6*/     (!a3 && a2 && a1 && a0 && b3 && b1) || (!b3 && b2 && b1 && b0 && a3 && a1) ||
/* 01x1 -11x1  6*/     (!a3 && a2 && a0 && b3 && b2 && b0) || (!b3 && b2 && b0 && a3 && a2 && a0) ||
/* 1000 -1xxx  5 */    (a3 && !a2 && !a1 && !a0 && b3) || (b3 && !b2 && !b1 && !b0 && a3) ||
/* 1001 -1xx0  6*/     (a3 && !a2 && !a1 && a0 && b3 && !b0) || (b3 && !b2 && !b1 && b0 && a3 && !a0) ||

/* 10x0 -1x00  6*/     (a3 && !a2 && !a0 && b3 && !b1 && !b0) || (b3 && !b2 && !b0 && a3 && !a1 && !a0) ||
/* 1001 -1x01  7*/     (a3 && !a2 && !a1 && a0 && b3 && !b1 && b0) ||
                       (b3 && !b2 && !b1 && b0 && a3 && !a1 && a0) ||
```

```
/* 111x -01x1  6*/    (a3 && a2 && a1 && !b3 && b2 && b0) || (b3 && b2 && b1 && !a3 && a2 && a0) ||
/* 111x -111x  6*/    (a3 && a2 && a1 && b3 && b2 && b1) || (b3 && b2 && b1 && a3 && a2 && a1) ||
/* 1111 -x1x1  6*/    (a3 && a2 && a1 && a0 && b2 && b0) || (b3 && b2 && b1 && b0 && a2 && a0);
endif if 1
        setcount(s3, x3 );
#else
        ss = s3;
        xx = x3;     /* also in printf */
        bool[BCOUNT*a + b] = ss;
        chk[BCOUNT*a + b] = XORAB(ss, xx);
        product[a*b]++;
        if (ss == xx) eq++;
``` multip.c

```
        if (ss && xx) tt++;
        if (!ss && !xx) ff++;
        if (ss && !xx) mt++;
        if (!ss && xx) ft++;
endif }   /* end of bcount loop   */
  } /* end of acount loop */ if 1
    printsb(stdout, 3);
#else
    printf("correct:%d, correct(1) %d, (0):%d,    false(1):%d false(0):%d\n",
        eq, tt, ff, ft, mt);

printf("   x4       B ->\n");
    printf("    3|"); pkarnb(BCOUNT, 3);
    printf("    2|"); pkarnb(BCOUNT, 2);
    printf("  A 1|"); pkarnb(BCOUNT, 1);
    printf("3210 |"); pkarnb(BCOUNT, 0);

printf("-----|---------------------------------------------------------------\n");

for (i=0; i< ACOUNT; i++){
        a = kymap(i);
        seta(a);
        printf("%d%d%d%d |",a3, a2, a1, a0);
        for(j=0; j < BCOUNT; j++){      /*  print calculated data */
            b = kmap(j);
            setb(b);
            printf(" %d", bool[BCOUNT*a + b]);
            if((j & 3)== 3) printf(" ");
        }
        printf(" |");
        for(j=0; j < BCOUNT; j++){    /*  print matched data */
            b = kmap(j);
            setb(b);
            if( (bool[BCOUNT*a + b] == 1) && (chk[BCOUNT*a + b] == 0))
                printf(" .");
            else if( (bool[BCOUNT*a + b] == 0) && (chk[BCOUNT*a + b] == 1))
                printf(" *");
            else
                printf(" %d", chk[BCOUNT*a + b]);
            if((j & 3)== 3) printf(" ");
        }
``` multip.c

```
        printf("\n");
        if (i == 7) printf("\n");
    }
endif /*****************************************/ printsb(fileptr, 3);
if 0
/* printout histogram of product frequency */
    cnt = 0; prods = 0;
    for (a=0; a<ACOUNT*BCOUNT; a++){
        if(product[a] !=0) {
            printf("product:%d count:%d cum:%d prods:%d\n",
                a, product[a], cnt++, prods += product[a]);
        }
    }
#endif
```

```
        fclose(fileptr);
}

/******************************* START of SUBROUTINES *************/
setcount(int sss, int xxx )
/* sss is predicted value       */
/* xxx is boolean calculated value */
{
        ss = sss;
        xx = xxx;
        bool[BCOUNT*a + b] = ss;
        chk[BCOUNT*a + b] = XORAB(ss, xx);
        product[a*b]++;
        if (ss == xx) eq++;
        if (ss && xx) tt++;
        if (!ss && !xx) ff++;
        if (ss && !xx) mt++;
        if (!ss && xx) ft++;
/* must be inside bcount acount loop   */
} printsb(FILE *filpt, int bitnum)
{
    fprintf(filpt,"correct:%d, correct(1) %d, (0):%d,   false(1):%d false(0):%d\n",
        eq, tt, ff, ft, mt);

fprintf(filpt,"4 x 4 multiply for bit:%d       B ->\n", bitnum);
    fprintf(filpt,"    3|"); pkarnb(BCOUNT, 3);
```
multip.c
```
    fprintf(filpt,"    2|"); pkarnb(BCOUNT, 2);
    fprintf(filpt,"  A 1|"); pkarnb(BCOUNT, 1);
    fprintf(filpt,"3210 |"); pkarnb(BCOUNT, 0);

fprintf(filpt,"-----|-------------------------------------------------------\n");

for (i=0; i< ACOUNT; i++){
        a = kymap(i);
        seta(a);
        fprintf(filpt,"%d%d%d%d |",a3, a2, a1, a0);
        for(j=0; j < BCOUNT; j++){     /* print calculated data */
            b = kmap(j);
            setb(b);
            fprintf(filpt," %d", bool[BCOUNT*a + b]);
            if((j & 3)== 3) printf("  ");
        }
        fprintf(filpt,"  |");
        for(j=0; j < BCOUNT; j++){   /* print matched data */
            b = kmap(j);
            setb(b);
            if( (bool[BCOUNT*a + b] == 1) && (chk[BCOUNT*a + b] == 0))
                fprintf(filpt," .");
            else if( (bool[BCOUNT*a + b] == 0) && (chk[BCOUNT*a + b] == 1))
                fprintf(filpt," *");
            else
                fprintf(filpt," %d", chk[BCOUNT*a + b]);
            if((j & 3)== 3) fprintf(filpt,"  ");
        }
        fprintf(filpt,"\n");
        if (i == 7) fprintf(filpt,"\n");
    }
} x7sub()
{
x7 =
/* 11xx-11xx */ (a3 && a2 && b3 && b2) ||
/* 111x-1x1x */ (a3 && a2 && a1 && b3 && b1) || (a3 && a1 && b3 && b2 && b1) ||
/* 11x1-1x1x */ (a3 && a1 && b3 && b2 && b0) || (a3 && a2 && a0 && b3 && b1) ||
/* 1x11-11xx */ (a3 && a2 && b3 && b1 && b0) || (a3 && a1 && a0 && b3 && b2) ||
/* 1111-1xx1 */ (a3 && a2 && a1 && a0 && b3 && b0) ||
                (b3 && b2 && b1 && b0 && a3 && a0);
return (x7);
}
```
multip.c
```
x3sub()
{
    x3=
```

```
/* from all karnaugh maps 18 lines 30 minterms 120 set */
/* 18 @ 5 factors (8) = 144  6                         */
/*  6 @ 6 factors (4) =  24  8                         */
/*  1 @ 7 factors (2) =   2  2                         */
/*  5 @ 8 factors (1) =   5  6                         */
/*                      175 coverage                   */

/* 0001  -1xxx.2 5*/  (!a3 && !a2 && !a1 && a0 && b3) || (a3 && !b3 && !b2 && !b1 && b0) ||
/* 001x  -010x.2 6*/  (!a3 && !a2 && a1 && !b3 && b2 && !b1) ||
                      (!b3 && !b2 && b1 && !a3 && a2 && !a1) ||
/*√0100  -xx1x  5*/   (!a3 && a2 && !a1 && !a0 && b1) || (a1 && !b3 && b2 && !b1 && !b0) ||
/*√0x10  -x1x1  5*/   (!a3 && a1 && !a0 && !b2 && !b0) || (!b3 && b1 && !b0 && a2 && a0) ||
/* 0111  -1xx1  6*/   (!a3 && a2 && a1 && a0 && b3 && b0) ||
                      (!b3 && b2 && b1 && b0 && a3 && a0) ||
/*√1000  -xxx1  5*/   (a3 && !a2 && !a1 && !a0 && b0) || (b3 && !b2 && !b1 && !b0 && a0) ||
/* 100x  -0xx1  5*/   (a3 && !a2 && !a1 && !b3 && b0) || (b3 && !b2 && !b1 && !a3 && a0) ||
/* x100  -xx10.4 5*/  (a2 && !a1 && !a0 && b2 && !b0) || (a1 && !a0 && b2 && !b1 && !b0) ||
/*√x010 -x1x0.8 5*/   (!a2 && a1 && !a0 && b2 && !b0) || (a2 && !a0 && !b2 && b1 && !b0) ||
/* 1x00  -xx01.5 5*/  (a3 && !a1 && !a0 && !b1 && b0) || (!a1 && a0 && b3 && !b1 && !b0) ||
/*√1x10 -x0x1.12 5*/  (a3 && a1 && !a0 && !b2 && b0) || (!a2 && a0 && b3 && b1 && !b0) ||
/* 1101 - 1011 8*/    (a3 && a2 && !a1 && a0 && b3 && !b2 && !b1 && b0) ||
                      (b3 && b2 && !b1 && b0 && a3 && !a2 && !a1 && a0) ||
/* 1111  -0xx1.4 6*/  (a3 && a2 && a1 && a0 && !b3 && b0) ||
                      (b3 && b2 && b1 && b0 && !a3 && a0) ||

/* diag 0011    8*/   (!a3 && !a2 && a1 && a0 && !b3 && !b2 && b1 && b0) ||
/* diag 0101    8*/   (!a3 && a2 && !a1 && a0 && !b3 && b2 && !b1 && b0) ||
/* diag 1011    8*/   (a3 && !a2 && a1 && a0 && b3 && !b2 && b1 && b0) ||
/* diag 1101-   7*/   (a3 && a2 && !a1 && a0 && b3 && b2 && !b1);
return (x3);
} x2sub()
{  x2 =
/* x100-xxx0 */  (!a0 && !a1 && a2 && b0) || (a0 && !b0 && !b1 && b2) || /* 9 @ 4 ok */
/* x1x1-x0x1 */  (a0 && a2 && b0 && !b2)  || (a0 && !a2 && b0 && b2)  ||
/* x010-xx1x */  (a1 && !b0 && b1 && !b2) || (!a0 && a1 && a2 && b1)  ||
/* x1x0-xx01 */  (!a0 && a2 && b0 && !b1) || (a0 && !a1 && !b0 && b2) ||
/* xx10-xx10 */  (!a0 && a1 && !b0 && b1);
    if (s2 != x2) printf("bit(4) %d exp %d in:%d a:%d%d%d%d b:%d%d%d%d \n",
        x2, s2, s, a3, a2, a1, a0, b3, b2, b1, b0); else cnt++;
multip.c return (x2);
} seta(int a)
{   if (a & 1 ) a0 = 1; else a0 = 0;
    if (a & 2 ) a1 = 1; else a1 = 0;
    if (a & 4 ) a2 = 1; else a2 = 0;
    if (a & 8 ) a3 = 1; else a3 = 0;
    if (a & 16) a4 = 1; else a4 = 0;
} setb(int b)
{   if (b & 1 ) b0 = 1; else b0 = 0;
    if (b & 2 ) b1 = 1; else b1 = 0;
    if (b & 4 ) b2 = 1; else b2 = 0;
    if (b & 8 ) b3 = 1; else b3 = 0;
    if (b & 16) b4 = 1; else b4 = 0;
} setsb(int a, int b, int s)
{
    seta(a); setb(b);

if (s & 1 )  s0 = 1; else s0 = 0;
    if (s & 2 )  s1 = 1; else s1 = 0;
    if (s & 4 )  s2 = 1; else s2 = 0;
    if (s & 8 )  s3 = 1; else s3 = 0;
    if (s & 16)  s4 = 1; else s4 = 0;
    if (s & 32)  s5 = 1; else s5 = 0;
    if (s & 64)  s6 = 1; else s6 = 0;
    if (s & 128) s7 = 1; else s7 = 0;
    if (s & 256) s8 = 1; else s8 = 0;
} kmap(int a)
{
```

```
/* int kmaph[ACOUNT] = {1, 9, 13, 5, 7, 15, 11, 3, 2, 10, 14, 6, 4, 12, 8, 0};  */
/* int kmapl[ACOUNT] = {0, 1, 3, 2, 6, 7, 5, 4, 12, 8, 10, 14, 15, 11, 9, 13};  */
/* int kmaps[ACOUNT] = {0, 1, 2, 3, 4, 5, 6, 7, 8, 9, 10, 11, 12, 13, 14, 15};  */

/* int map1l[7] = {1, 2, 4, 8, 16, 32, 64};  */
/* int map1r[7] = {1, 8, 4, 2, 16, 32, 64};  */
/* int map4r[7] = {8, 4, 2, 1, 16, 0, 0};   */
/* int map22[7] = {8, 1, 2, 4, 16, 0, 0};   */
 /* return kmap[a]; */
multip.c return bitmap(kmaph[a], &map1l);
} kymap(int a)    {  return (bitmap(kmaph[a], &map1l));  } bitmap(int bin, int map[])
{
    int bs;
    if((bin < 0) || bin > 15) printf("bin: 0:%d,1:%d, 2:%d,3:%d, 4:%d,5:%d\n",
        map[0], map[1], map[2], map[3], map[4], map[5]);
    if (bin & 1 ) bs  = map[0]; else bs = 0;
    if (bin & 2 ) bs |= map[1];
    if (bin & 4 ) bs |= map[2];
    if (bin & 8 ) bs |= map[3];
    if (bin & 16 ) bs |= map[4];
    if (bin & 32 ) bs |= map[5];
    if (bin & 64 ) bs |= map[6];
    if((bs < 0) || bs > 15) printf("bs: 0:%d,1:%d, 2:%d,3:%d, 4:%d,5:%d\n",
        map[0], map[1], map[2], map[3], map[4], map[5]);
    return(bs);
} pkarnb(int max, int bit)
{
int k, l, kndx;
    for(k = 0; k < max; k++) {
        kndx = kmap(k); if(kndx & (2 << bit)/2) l=1; else l = 0;
        printf(" %d", 1);
        if ((k & 3) == 3) printf(" ");
    }
    printf(" %d", bit);
    for(k = 0; k < max; k++) {
        kndx = kmap(k); if(kndx & (2 << bit)/2) l=1; else l = 0;
        printf(" %d", 1);
        if ( (k & 3) == 3) printf(" ");
    }
    printf("\n");
}
```

We claim:

1. An apparatus for acting upon input data having a plurality of binary bits and for providing outputs which are Boolean logical AND/OR operations on user designated combinations of the binary bits, wherein the apparatus comprises:

input means comprising a plurality of elements, each of which is responsive to a corresponding one of the binary bits of the input data and projects an optical signal representative of the logical state of the corresponding binary bit along a different one of a first set of signal paths;

control means comprising a plurality of elements, each of which is associated with a different one of the paths in the first set of signal paths, receives the optical signal projected along the associated signal path, and broadcasts the received optical signal along a set of selected signal paths, wherein the signal paths in the sets of selected signal paths collectively form sets of coincident signal paths, wherein each set of coincident signal paths is coincident at an associated detect location, and further wherein the signal paths contained in a particular set of coincident signal paths are selected so that the optical signals which the set routes to the associated detect location represent the bits in a particular one of the designated combinations of binary bits;

binary detector means comprising a plurality of elements, each of which is associated with a different one of the associated detect locations and is responsive to the optical signals routed to the associated detect location, and wherein each element of the binary detector means includes:

means for detecting the optical signals routed to the associated detect location by detecting only the presence or absence of an optical signal;

means for performing a selectable logical negation of the detected presence or absence of an optical signal; and means for producing an output representative of the result of the logical negation means.

2. The apparatus of claim 1 wherein the means for producing an output is a set of laser diodes.

3. The apparatus of claim 2 wherein the set of laser diode is fabricated from GaAs/AlGaAs diode lasers.

4. The apparatus of claim 1 wherein the control means includes a plurality of holograms which broadcast the received optical signals along the sets of selected signal paths.

5. The apparatus of claim 1 wherein the control means includes
   a plurality of masks, each of which corresponds to a different one of the plurality of elements, wherein each mask selects the set of signal paths over which its received optical signal is routed;
   a lenslet array, in which each lenslet is associated with a different one of the plurality of masks; and
   a spherical lens positioned between the lenslet array and the binary detector means, wherein the lenslet array and spherical lens form a set of telecentric lens systems and image optical signals from the plurality of masks onto the binary detector means.

6. The apparatus of claim 1 wherein the optical detecting means of the binary detector means includes a metal-semiconductor-metal (MSM) photodetector.

7. The apparatus of claim 1 wherein the negation means of the binary detector means includes a high-electron-mobility transistor (HEMT) or a metal-Schottky field-effect transistor (MESFET).

8. The apparatus of claim 1 wherein the output producing means provides an optical signal representative of the result of the selectable logical negation means.

9. The apparatus of claim 8 wherein the output producing means includes a set of laser diodes.

10. The apparatus of claim 9 wherein the set of laser diodes is fabricated from GaAs/AlGaAs diode lasers.

11. An optical computer for operating upon data vectors in accordance with instructions specified by a user, wherein each of the input data vectors have a predetermined plurality of binary bits and the specified instructions include instructions which are implementable by forming combinatorial functionals and combinatorial summations of binary bits selected from the data vectors, from previously formed combinatorial functionals, and from previously formed combinatorial summations, the optical computer comprising:
   means responsive to binary bits of the input data vectors where the means has a plurality of elements, and each element is responsive to a corresponding one of the binary bits of the input data vectors and provides an optical signal representative of the corresponding binary bit along one of a first plurality of signal paths;
   a first control plane means positioned in the optical path of the first plurality of paths, the first control plane means having a plurality of elements with each element having a binary control plane state value, where the elements are responsive to the optical signals projected along the first plurality of signal paths, and where the elements of the first control plane means include;
     a first means for optically ANDing binary bits of the element's control plane state value with the optical signal projected along the first plurality of signal paths, and means for broadcasting an optical signal representative of the result of the optical AND along a selected plurality of a second plurality of signal paths;
   a first binary detector means positioned in the optical path of the second plurality of signal paths, the detector means having a plurality of elements where the elements are responsive to the optical signals broadcast along the second plurality of signal paths, and where the elements include means for optically ORing the optical signal representative of the results of the first optical ANDing means, wherein the elements of the first binary detector means include;
     means for optically detecting the signals representative of the result of the first optical ANDing means;
     means for electronically amplifying the detected signals representative of the result of the first optical ANDing means;
     means for electronically performing a logical negation of the amplified signals thereby forming a combinatorial functional data vector; and
     means for optically emitting signals representative of the results of the logical negation means along a third plurality of signal paths;
   a second control plane placed in the optical path of the third plurality of signal paths, the second control plane means having a plurality of elements with each element having a binary control plane state value, where the elements are responsive to the optical signals emitted along the third plurality of signal paths, and where the elements of the second control plane means include;
     a second means for optically ANDing binary bits of the element's control plane state value with the optical signal emitted along the third plurality of signal paths, and means for broadcasting an optical signal representative of the result of the optical AND along a selected plurality of a fourth plurality of signal paths;
   a second binary detector means positioned in the optical path of the fourth plurality of signal paths, the detector means having a plurality of elements where the elements are responsive to the optical signals broadcast along the fourth plurality of signal paths, and where the elements include means for optically ORing the optical signal representative of the results of the second optical ANDing means, wherein the elements of the second binary detector means include;
     means for optically detecting the signals representative of the result of the second optical ANDing means, thereby detecting the formation of a combinatorial summation data vector;
     means for electronically amplifying the detected signals representative of the result of the second optical ANDing means; and
     means for optically emitting signals representative of the results of the amplification means along a fifth plurality of signal paths, whereby the optical signals represent the user specified instruction; and
   means for evaluating the user specified instruction and identifying control vectors which when applied to the first control plane means form the combinatorial functionals as the output signal of the first binary detector means, and when applied to the second control plane means form the combinatorial summations as the output signal of the second binary detector means, and for supplying the identified functional and summation control vectors to the first and second control plane means so that the combinatorial functionals are formed as the output signal of the first binary detector means, and the combinatorial summations are formed as the output signal of the second binary detector means, whereby the user specified instruction is implemented.

12. The optical computer of claim 11 wherein the means responsive to binary bits of input data vectors for providing an optical signal representative of the bits of the input data vectors and for projecting the optical signal along a first plurality of signal paths is a surface emitting diode laser array (SEDA).

13. The optical computer of claim 12 wherein the surface emitting diode laser array (SEDA) is fabricated from GaAs/AlGaAs diode lasers.

14. The optical computer of claim 11 wherein the first control plane means having a plurality of elements includes a plurality of holograms which broadcast the optical signals representative of the result of the first optical AND means along the selected plurality of the second plurality of signal paths.

15. The optical computer of claim 11 wherein the first control plane means having a plurality of elements includes a plurality of lenses which image the optical signals representative of the result of the first optical AND means onto the first binary detector means.

16. The optical computer of claim 11 wherein the optical detection means of the first binary detector means includes a metal-semiconductor-metal (MSM) photodetector.

17. The optical computer of claim 11 wherein the amplification means and the negation means of the first binary detector means includes a high-electron-mobility transistor (HEMT) or a metal-Schottky field-effect transistor (MESFET).

18. The optical computer of claim 11 wherein the emitting means of the first binary detector means includes a surface emitting diode laser array (SEDA).

19. The optical computer of claim 18 wherein the surface emitting diode laser array (SEDA) is fabricated from GaAs/AlGaAs diode lasers.

20. The optical computer of claim 11 wherein the second control plane means having a plurality of elements includes a plurality of holograms which broadcast the optical signals representative of the result of the second optical AND means along the selected plurality of the fourth plurality of signal paths.

21. The optical computer of claim 11 wherein the second control plane means having a plurality of elements includes a plurality of lenses which image the optical signals representative of the result of the second optical AND means onto the second binary detector means.

22. The optical computer of claim 11 wherein the optical detection means of the second binary detector means includes a metal-semiconductor-metal (MSM) photodetector.

23. The optical computer of claim 11 wherein the amplification means of the second binary detector means includes a high-electron-mobility transistor (HEMT) or a metal-Schottky field-effect transistor (MESFET).

24. The optical computer of claim 11 wherein the emitting means of the second binary detector means includes a surface emitting diode laser array (SEDA).

25. The optical computer of claim 24 wherein the surface emitting diode laser array (SEDA) is fabricated from GaAs/AlGaAs diode lasers.

26. A device for routing an optical signal received at an input to one of a plurality of outputs specified by an address vector, wherein the address data vector has a predetermined plurality of binary bits in dual rail format, the optical signal routing device comprising:

a plurality of detector elements each of which provides one of the outputs of the device and each of which is positioned at a different predetermined detect location, wherein each detector element detects the presence or absence of light at its predetermined detect location;

means for providing a plurality of optical address signals, wherein each optical address signal is an optical representation of one of the dual rail binary bits of the address vector;

means for broadcasting the input optical signal to each of the detect locations; and a plurality of control elements, each of which is associated with a different one of the plurality of optical address signals, and each of which routes its associated optical address signal to predetermined selected ones of the detect locations;

wherein the routing by each control element of its associated optical address signal to selected detect locations is chosen so that, for each unique combination of binary bits of the address vector, only one of the detector elements receives no light from the plurality of control elements, while all other detector elements are illuminated by light from the plurality of control elements; whereby the detector element which receives no light is the only detector which is responsive to the input optical signal so as to provide an output which is representative of the input optical signal.

27. The optical routing device of claim 26 wherein the means responsive to binary bits of input data vectors for providing an optical signal representative of the bits of the input data vectors and for projecting the optical signal along a first plurality of signal paths is a surface emitting diode laser array (SEDA).

28. The optical routing device of claim 27 wherein the surface emitting diode laser array (SEDA) is fabricated from GaAs/AlGaAs diode lasers.

29. The optical routing device of claim 26 wherein the control plane means having a plurality of elements includes a plurality of holograms which broadcast the optical signals representative of the result of the optical AND means along the selected plurality of the second plurality of signal paths.

30. The optical routing device of claim 26 wherein the control plane means having a plurality of elements includes a plurality of lenses which image the optical signals representative of the result of the optical AND means onto the binary detector means.

31. The optical routing device of claim 26 wherein the optical detection means of the binary detector means includes a metal-semiconductor-metal (MSM) photodetector.

32. The optical routing device of claim 26 wherein the amplification means and the negation means of the binary detector means includes a high-electron-mobility transistor (HEMT) or a metal-Schottky field-effect transistor (MESFET).

33. The optical routing device of claim 26 wherein the emitting means of the binary detector means includes a surface emitting diode laser array (SEDA).

34. The optical routing device of claim 33 wherein the surface emitting diode laser array (SEDA) is fabricated from GaAs/AlGaAs diode lasers.

35. A device for detecting, amplifying, negating, and emitting signals, the device combining electronic and optical means and comprising:

means for optically detecting signals;

semiconductor based means for electronically amplifying the detected signals;

semiconductor based means for electronically performing a selectable logical negation of the amplified signals; and means for optically emitting signals representative of the results of the logical negation means along a plurality of signal paths.

36. The device of claim 35 wherein the optical detection means of the device includes a metal-semiconductor-metal (MSM) photodetector.

37. The device of claim 35 wherein the amplification means and the negation means of the device includes a high-electron-mobility transistor (HEMT) or a metal-Schottky field-effect transistor (MESFET).

38. The device of claim 35 wherein the emitting means includes a surface emitting diode laser array (SEDA).

39. The device of claim 38 wherein the surface emitting diode laser array (SEDA) is fabricated from GaAs/AlGaAs diode lasers.

40. The device of claim 35 wherein the detection, amplification, negation, and emission functions are performed by a monolithic structure.

41. A method of operating an optoelectronic detection stage having a capability of a fan-in of N, where N is greater than 8, and having a optical output at a predetermined optical power level, P, wherein the stage includes a laser output stage which provides the power level, P, in response to a drive signal of level, D, at an operating power level, OP, the method comprising the steps of:

(a) receiving optical input signals having an ON state on the order of 100 to 10,000 photons per event, and a contrast ratio relative to an OFF state of the optical input signals of at least 100 to 1;

(b) converting the optical input signals into electrical form using a converting device having low noise and having a power consumption level, in the presence of N optical input signals all of which are in an ON state, which is less than the operating power level, OP, of the laser output stage; and (c) amplifying the converted optical input signals so that, when at least one of optical input signals incident upon the converting device is in an ON state, a drive signal is provided to the laser output stage which has a magnitude equal to the drive level for the laser output stage.

* * * * *